(12) United States Patent
MacLellan

(10) Patent No.: US 6,993,705 B1
(45) Date of Patent: Jan. 31, 2006

(54) CYCLIC REDUNDANCY CHECK (CRC) PARITY CHECK SYSTEM AND METHOD

(75) Inventor: Christopher S. MacLellan, Walpole, MA (US)

(73) Assignee: EMC Corporation, Hopkinton, MA (US)

( * ) Notice: Subject to any disclaimer, the term of this patent is extended or adjusted under 35 U.S.C. 154(b) by 757 days.

(21) Appl. No.: 09/746,174

(22) Filed: Dec. 21, 2000

(51) Int. Cl.
*G06F 11/00* (2006.01)

(52) U.S. Cl. ............................ 714/800; 714/807
(58) Field of Classification Search ............ 714/807, 714/755, 758, 804, 800
See application file for complete search history.

(56) References Cited

U.S. PATENT DOCUMENTS

| | | | | |
|---|---|---|---|---|
| 4,052,698 A | * | 10/1977 | Ragle | 714/757 |
| 4,464,747 A | * | 8/1984 | Groudan et al. | 714/804 |
| 4,599,722 A | * | 7/1986 | Mortimer | 714/776 |
| 4,682,328 A | * | 7/1987 | Ramsay et al. | 714/15 |
| 4,769,818 A | * | 9/1988 | Mortimer | 714/755 |
| 5,559,506 A | * | 9/1996 | Leitch | 340/7.43 |
| 5,627,846 A | * | 5/1997 | Carr | 714/818 |
| 6,125,466 A | * | 9/2000 | Close et al. | 714/758 |

OTHER PUBLICATIONS

Ramabadran et al., "A Tutorial on CRC Calculations", IEEE MICRO, Aug. 1988, pp. 62-74.*
Hsu et al., "Error Correction Capabilities of Binary Mapped Reed-Soloman Codes with Parity Bits Appended to all Symbols", IEE Proc.-Commun., vol. 141, No. 4, Aug. 1994, pp. 209-211.*

* cited by examiner

*Primary Examiner*—Stephan M. Baker

(57) ABSTRACT

A method for determining Cyclic Redundancy Check (CRC) parity of data, such data comprising a plurality of bytes, each one of the bytes having a parity bit, the plurality of bytes of data having a CRC. The method includes generating the parity of the parity bits of the plurality of bytes of the data, such generated parity being the parity of the CRC of such data. The method includes: generating parity of the parity bits of the plurality of data bytes; and comparing such generated parity with the parity bit of the CRC of the data. The method receives data having a plurality of N bytes: [D(0), D(1), . . . , D(N−1)] each byte having a parity bit p and computes the parity of [P(0), P(1), . . . P(N−1)].

2 Claims, 43 Drawing Sheets

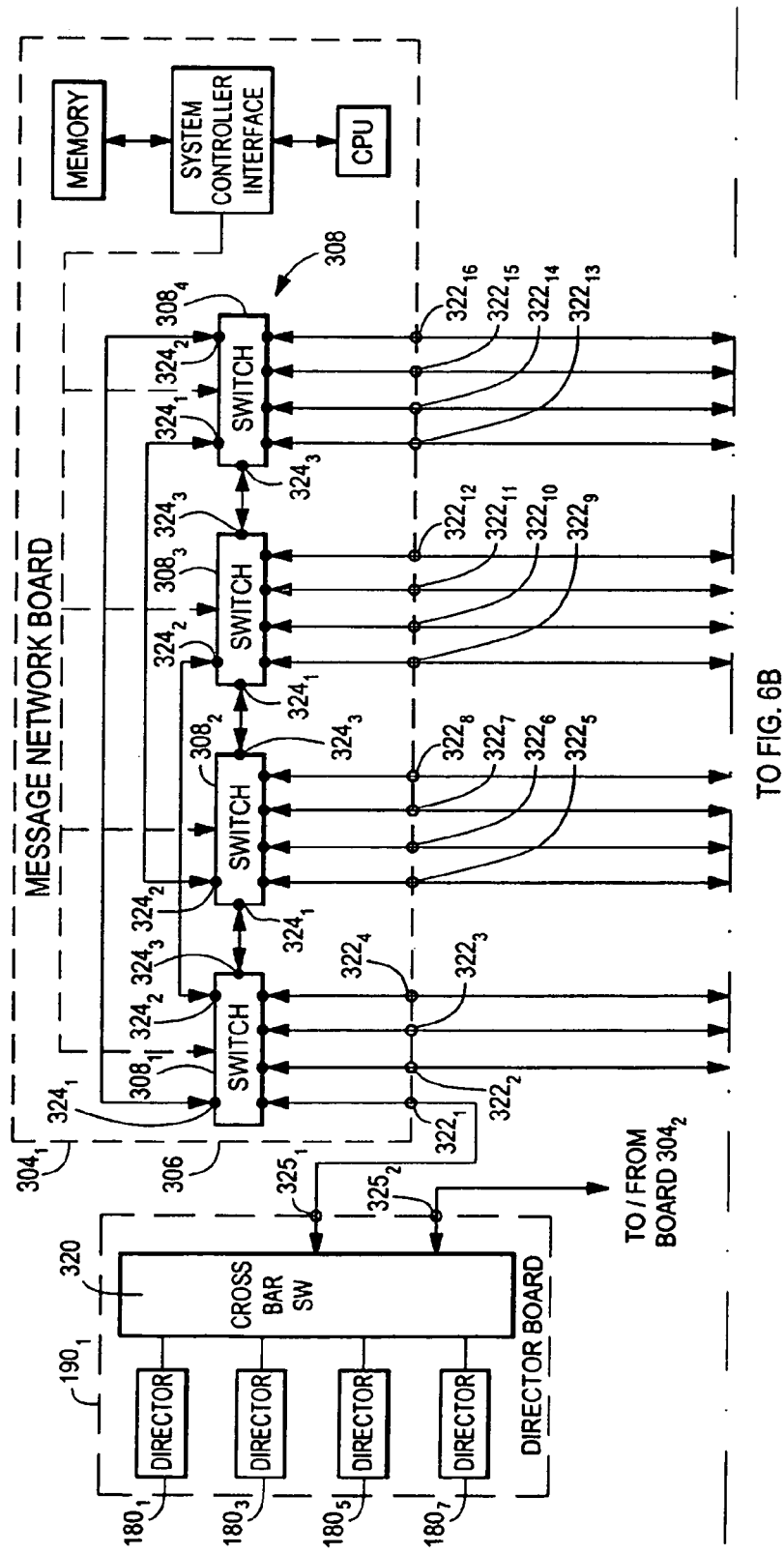

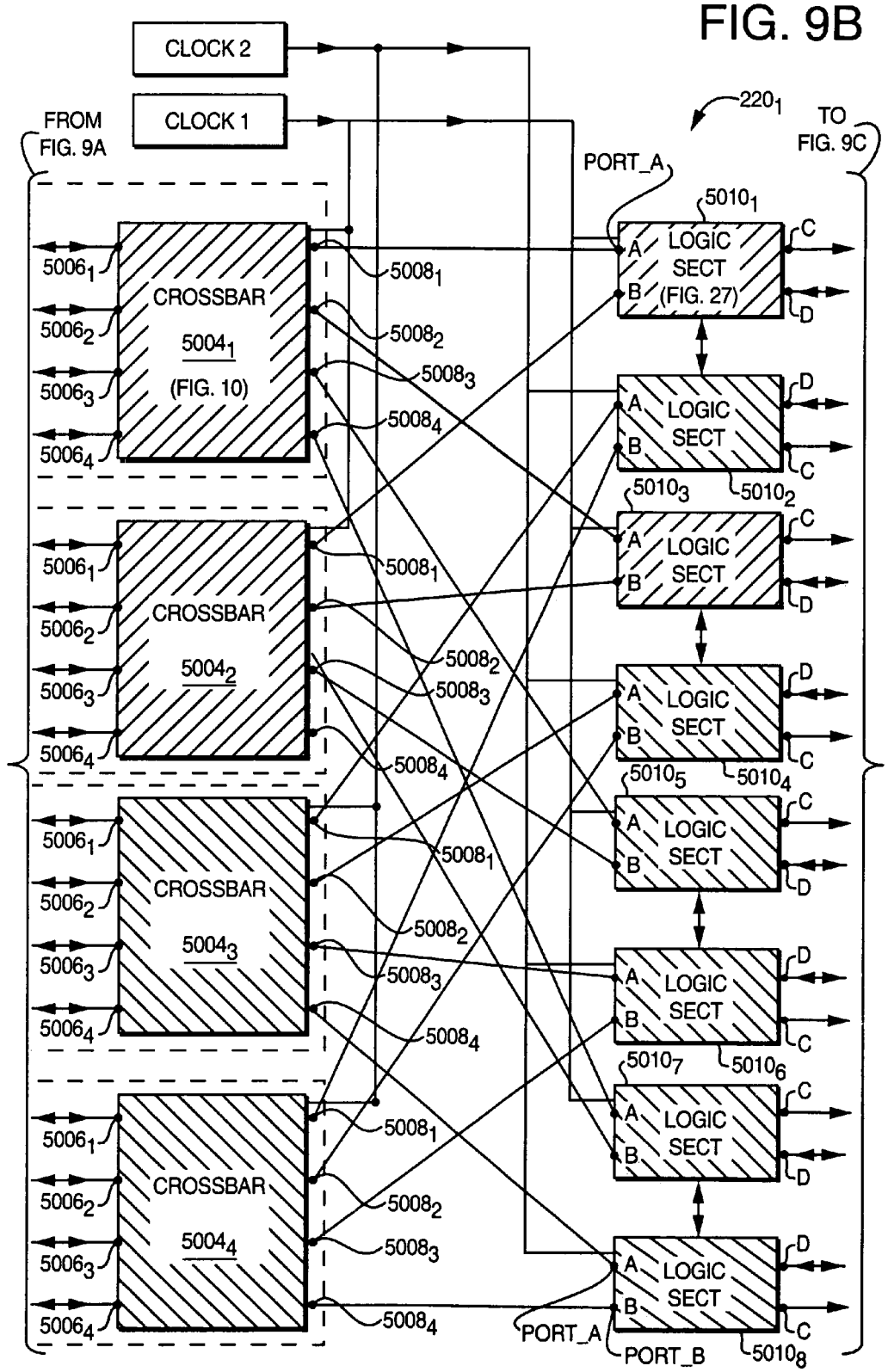

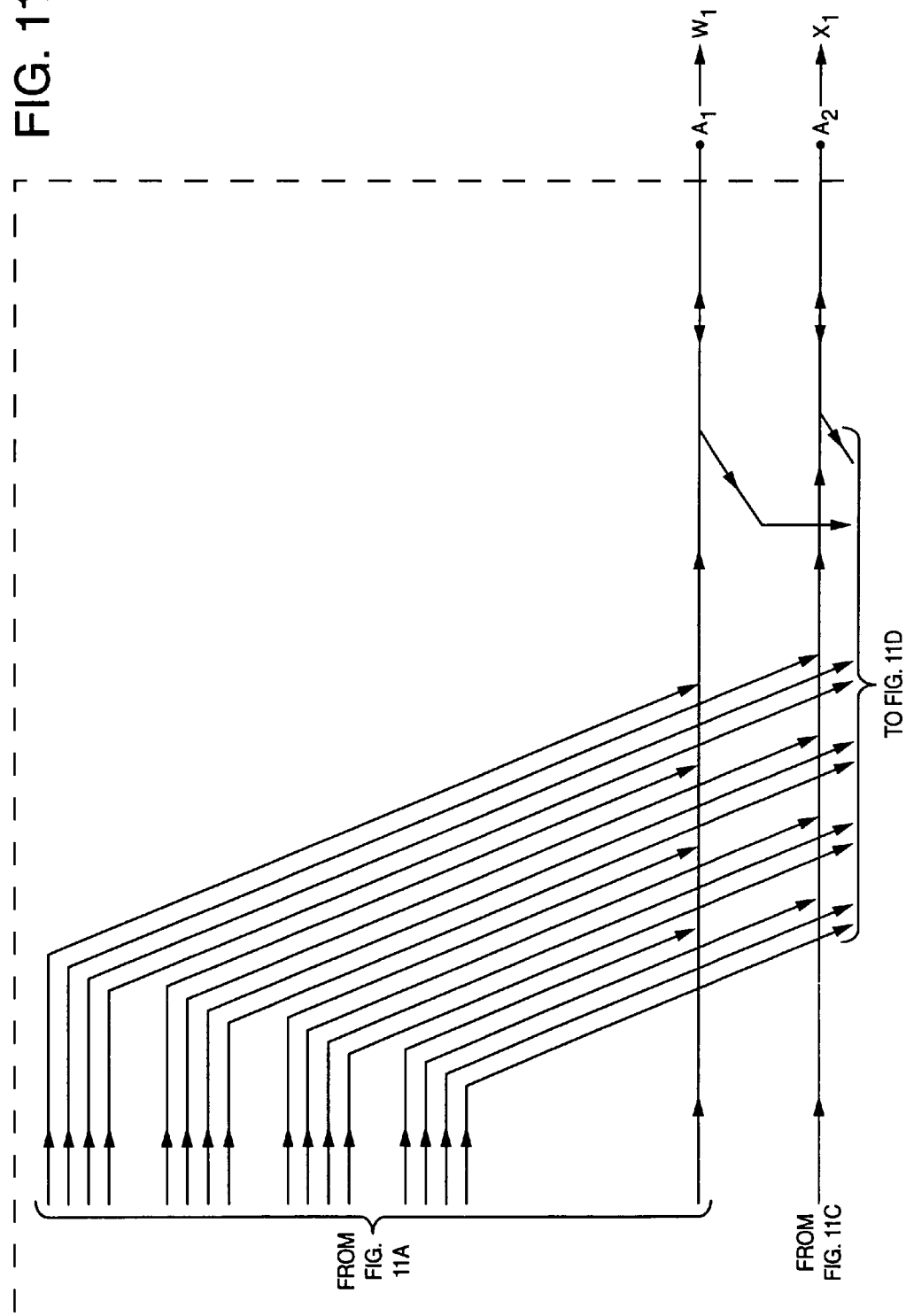

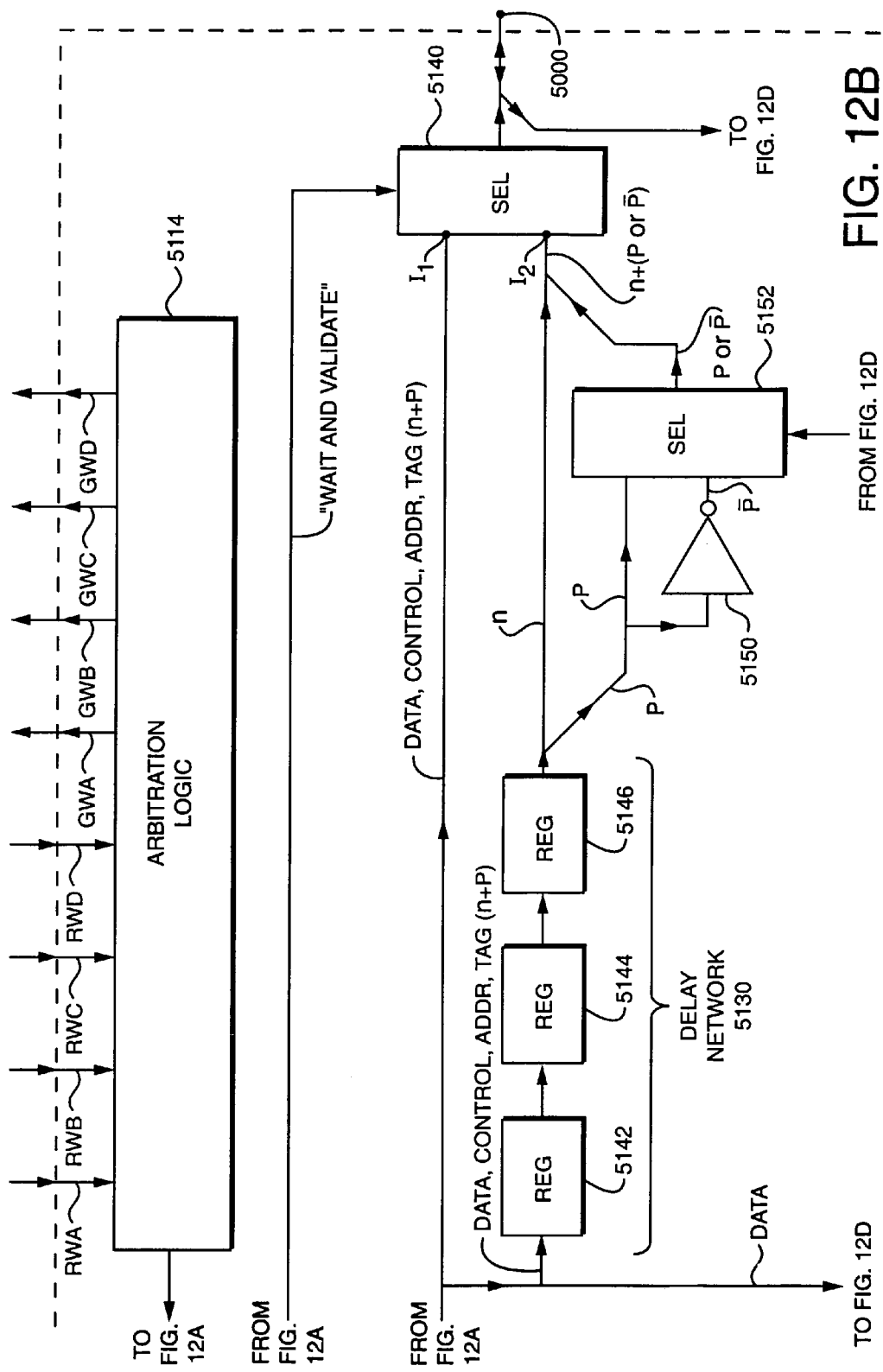

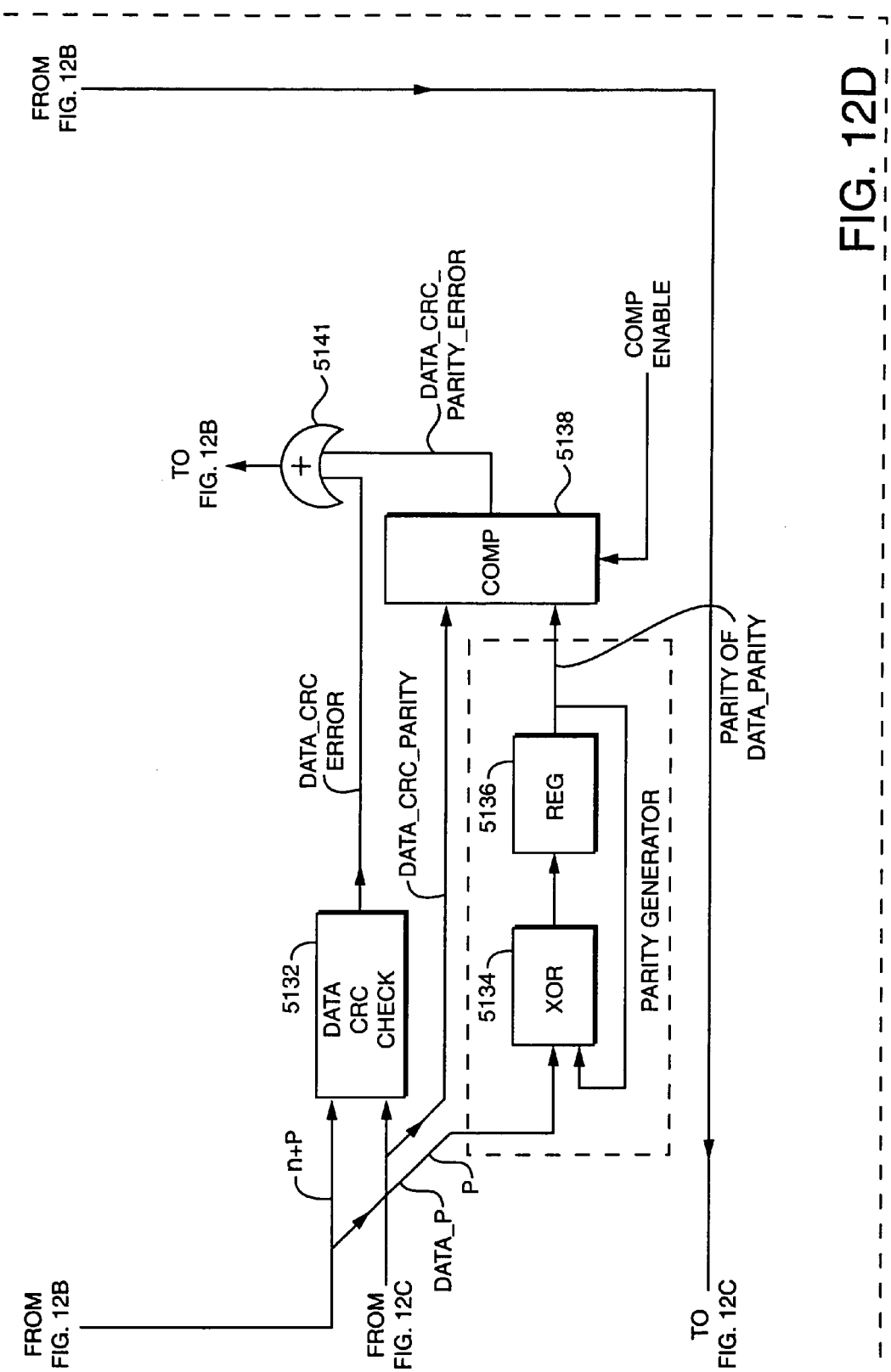

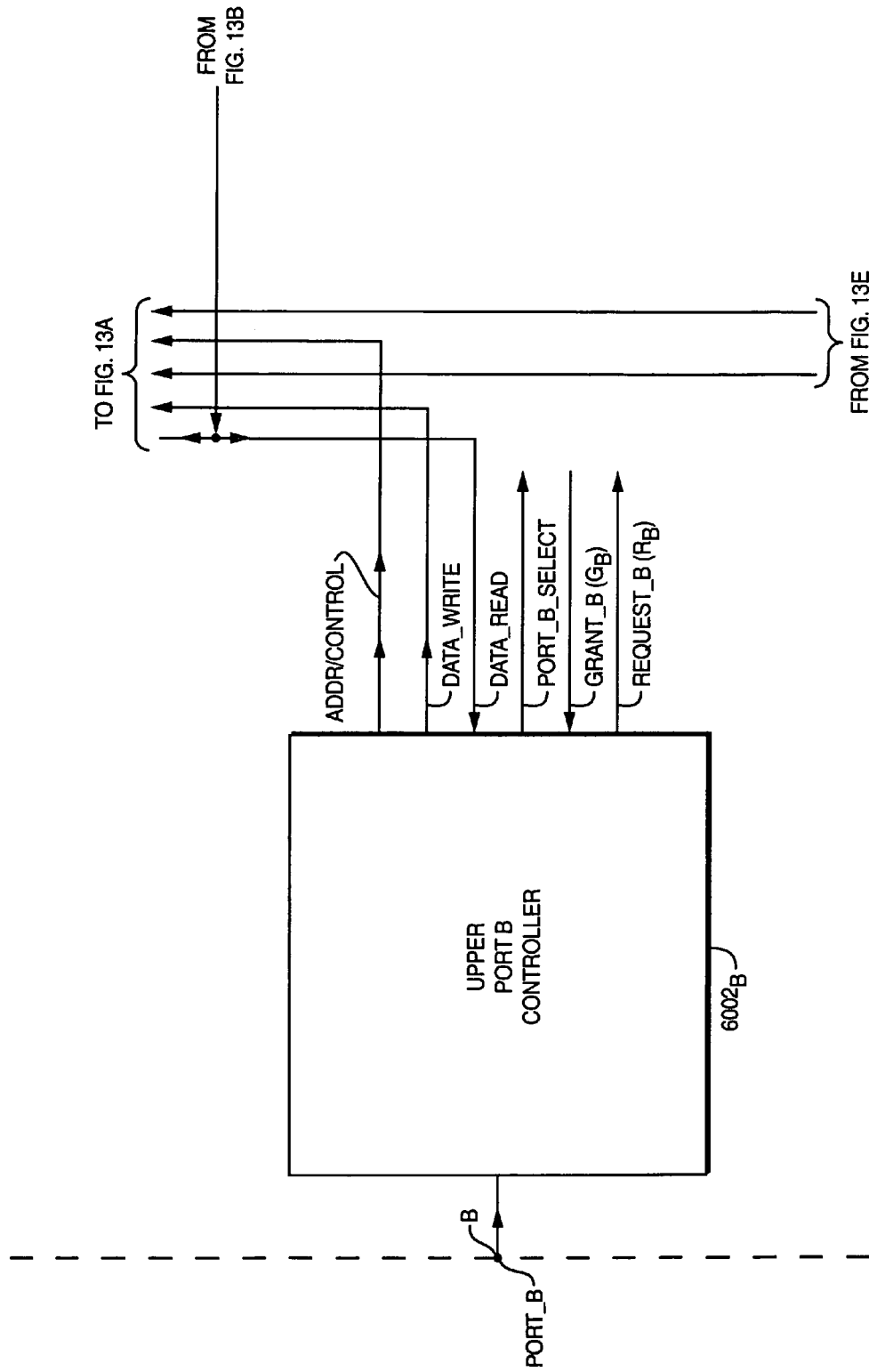

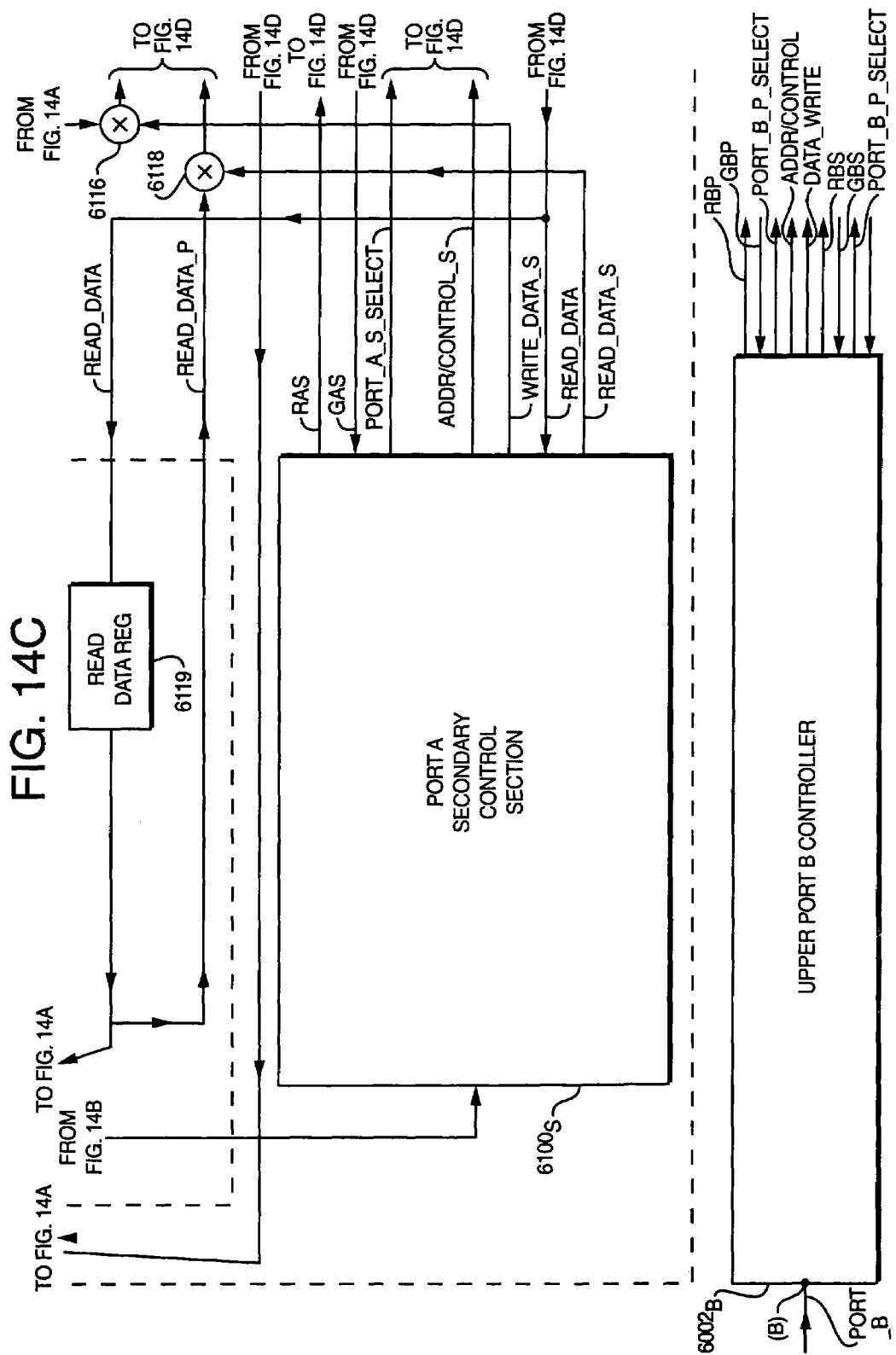

CYCLIC REDUNDANCY CHECK (CRC) PARITY CHECK SYSTEM AND METHOD

TECHNICAL FIELD

This invention relates generally to data storage systems, and more particularly to data storage systems having redundancy arrangements to protect against total system failure in the event of a failure in a component or subassembly of the storage system.

BACKGROUND

As is known in the art, large host computers and servers (collectively referred to herein as "host computer/servers") require large capacity data storage systems. These large computer/servers generally includes data processors, which perform many operations on data introduced to the host computer/server through peripherals including the data storage system. The results of these operations are output to peripherals, including the storage system.

One type of data storage system is a magnetic disk storage system. Here a bank of disk drives and the host computer/server are coupled together through an interface. The interface includes "front end" or host computer/server controllers (or directors) and "back-end" or disk controllers (or directors). The interface operates the controllers (or directors) in such a way that they are transparent to the host computer/server. That is, data is stored in, and retrieved from, the bank of disk drives in such a way that the host computer/server merely thinks it is operating with its own local disk drive. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

As described in such U.S. Patent, the interface may also include, in addition to the host computer/server controllers (or directors) and disk controllers (or directors), addressable cache memories. The cache memory is a semiconductor memory and is provided to rapidly store data from the host computer/server before storage in the disk drives, and, on the other hand, store data from the disk drives prior to being sent to the host computer/server. The cache memory being a semiconductor memory, as distinguished from a magnetic memory as in the case of the disk drives, is much faster than the disk drives in reading and writing data.

The host computer/server controllers, disk controllers and cache memory are interconnected through a backplane printed circuit board. More particularly, disk controllers are mounted on disk controller printed circuit boards. The host computer/server controllers are mounted on host computer/server controller printed circuit boards. And, cache memories are mounted on cache memory printed circuit boards. The disk directors, host computer/server directors, and cache memory printed circuit boards plug into the backplane printed circuit board. In order to provide data integrity in case of a failure in a director, the backplane printed circuit board has a pair of buses. One set the disk directors is connected to one bus and another set of the disk directors is connected to the other bus. Likewise, one set the host computer/server directors is connected to one bus and another set of the host computer/server directors is directors connected to the other bus. The cache memories are connected to both buses. Each one of the buses provides data, address and control information.

The arrangement is shown schematically in FIG. 1. Thus, the use of two buses B1, B2 provides a degree of redundancy to protect against a total system failure in the event that the controllers or disk drives connected to one bus, fail. Further, the use of two buses increases the data transfer bandwidth of the system compared to a system having a single bus. Thus, in operation, when the host computer/server 12 wishes to store data, the host computer 12 issues a write request to one of the front-end directors 14 (i.e., host computer/server directors) to perform a write command. One of the front-end directors 14 replies to the request and asks the host computer 12 for the data. After the request has passed to the requesting one of the front-end directors 14, the director 14 determines the size of the data and reserves space in the cache memory 18 to store the request. The front-end director 14 then produces control signals on one of the address memory busses B1, B2 connected to such front-end director 14 to enable the transfer to the cache memory 18. The host computer/server 12 then transfers the data to the front-end director 14. The front-end director 14 then advises the host computer/server 12 that the transfer is complete. The front-end director 14 looks up in a Table, not shown, stored in the cache memory 18 to determine which one of the back-end directors 20 (i.e., disk directors) is to handle this request. The Table maps the host computer/server 12 addresses into an address in the bank 14 of disk drives. The front-end director 14 then puts a notification in a "mail box" (not shown and stored in the cache memory 18) for the back-end director 20, which is to handle the request, the amount of the data and the disk address for the data. Other back-end directors 20 poll the cache memory 18 when they are idle to check their "mail boxes". If the polled "mail box" indicates a transfer is to be made, the back-end director 20 processes the request, addresses the disk drive in the bank 22, reads the data from the cache memory 18 and writes it into the addresses of a disk drive in the bank 22.

When data is to be read from a disk drive in bank 22 to the host computer/server 12 the system operates in a reciprocal manner. More particularly, during a read operation, a read request is instituted by the host computer/server 12 for data at specified memory locations (i.e., a requested data block). One of the front-end directors 14 receives the read request and examines the cache memory 18 to determine whether the requested data block is stored in the cache memory 18. If the requested data block is in the cache memory 18, the requested data block is read from the cache memory 18 and is sent to the host computer/server 12. If the front-end director 14 determines that the requested data block is not in the cache memory 18 (i.e., a so-called "cache miss") and the director 14 writes a note in the cache memory 18 (i.e., the "mail box") that it needs to receive the requested data block. The back-end directors 20 poll the cache memory 18 to determine whether there is an action to be taken (i.e., a read operation of the requested block of data). The one of the back-end directors 20 which poll the cache memory 18 mail box and detects a read operation reads the requested data block and initiates storage of such requested data block stored in the cache memory 18. When the storage is completely written into the cache memory 18, a read complete indication is placed in the "mail box" in the cache memory 18. It is to be noted that the front-end directors 14 are polling the cache memory 18 for read complete indications. When one of the polling front-end directors 14 detects a read complete indication, such front-end director 14 completes the transfer of the requested data which is now stored in the cache memory 18 to the host computer/server 12.

The use of mailboxes and polling requires time to transfer data between the host computer/server 12 and the bank 22 of disk drives thus reducing the operating bandwidth of the interface.

SUMMARY OF THE INVENTION

In accordance with the invention, a method is provided for determining Cyclic Redundancy Check (CRC) parity of data, such data comprising a plurality of bytes, each one of the bytes having a parity bit, the plurality of bytes of data having a CRC. The method includes generating the parity of the parity bits of the plurality of bytes of the data, such generated parity being the parity of the CRC of such data.

In accordance with another feature of the invention, a method is provided for performing a check of the parity bit of a Cyclic Redundancy Cycle (CRC) of data, such data comprising a plurality of bytes, each byte having a parity bit. The method includes: generating parity of the parity bits of the plurality of data bytes; and comparing such generated parity with the parity bit of the CRC of the data.

In accordance with still another feature of the invention, a method is provided for determining Cyclic Redundancy Check (CRC) parity of data, such data having a parity bit, the data having a CRC. The method includes comparing the parity of the data with the parity bit of the CRC of the data.

In one embodiment, a method comprises: receiving data having a plurality of N bytes: [D(0), D(1), . . . , D(N−1)] each byte having a parity bit P; and computing the parity of [P(0), P(1), . . . P(N−1)].

The details of one or more embodiments of the invention are set forth in the accompanying drawings and the description below. Other features, objects, and advantages of the invention will be apparent from the description and drawings, and from the claims.

DESCRIPTION OF DRAWINGS

These and other features of the invention will become more readily apparent from the following detailed description when read together with the accompanying drawings, in which:

FIGS. 9A, 9B and 9C are a more detailed block diagram of the exemplary cache memory board of FIG. 8A;

FIGS. 11A, 11B, 11C and 11D are a block diagram of an upper port interface section used in the crossbar switch of FIG. 10;

FIGS. 12A, 12B, 12C and 12D are a block diagram of a lower port interface section used in the crossbar switch of FIG. 10;

FIGS. 13A, 13B, 13C, 13D and 13E are a block diagram of a pair of logic sections used in the memory board of FIGS. 9A, 9B and 9C;

FIGS. 14A, 14B, 14C and 14D are a block diagram of a pair of port controllers used in the pair of logic sections of FIGS. 13A, 13B, 13C, 13D and 13E;

DETAILED DESCRIPTION

Figure 1:
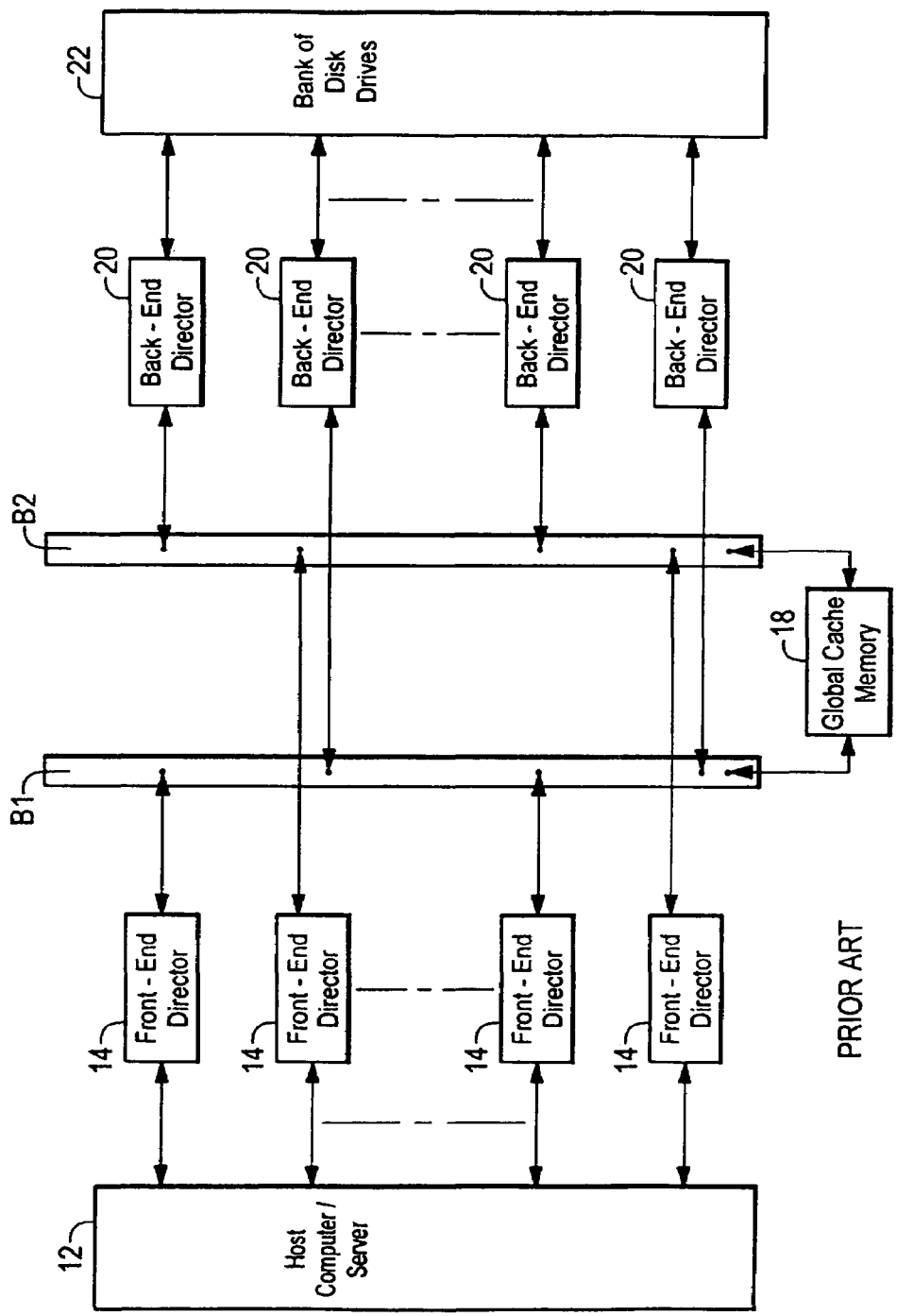
FIG. 1 is a block diagram of a data storage system according to the PRIOR ART.
Figure 2:
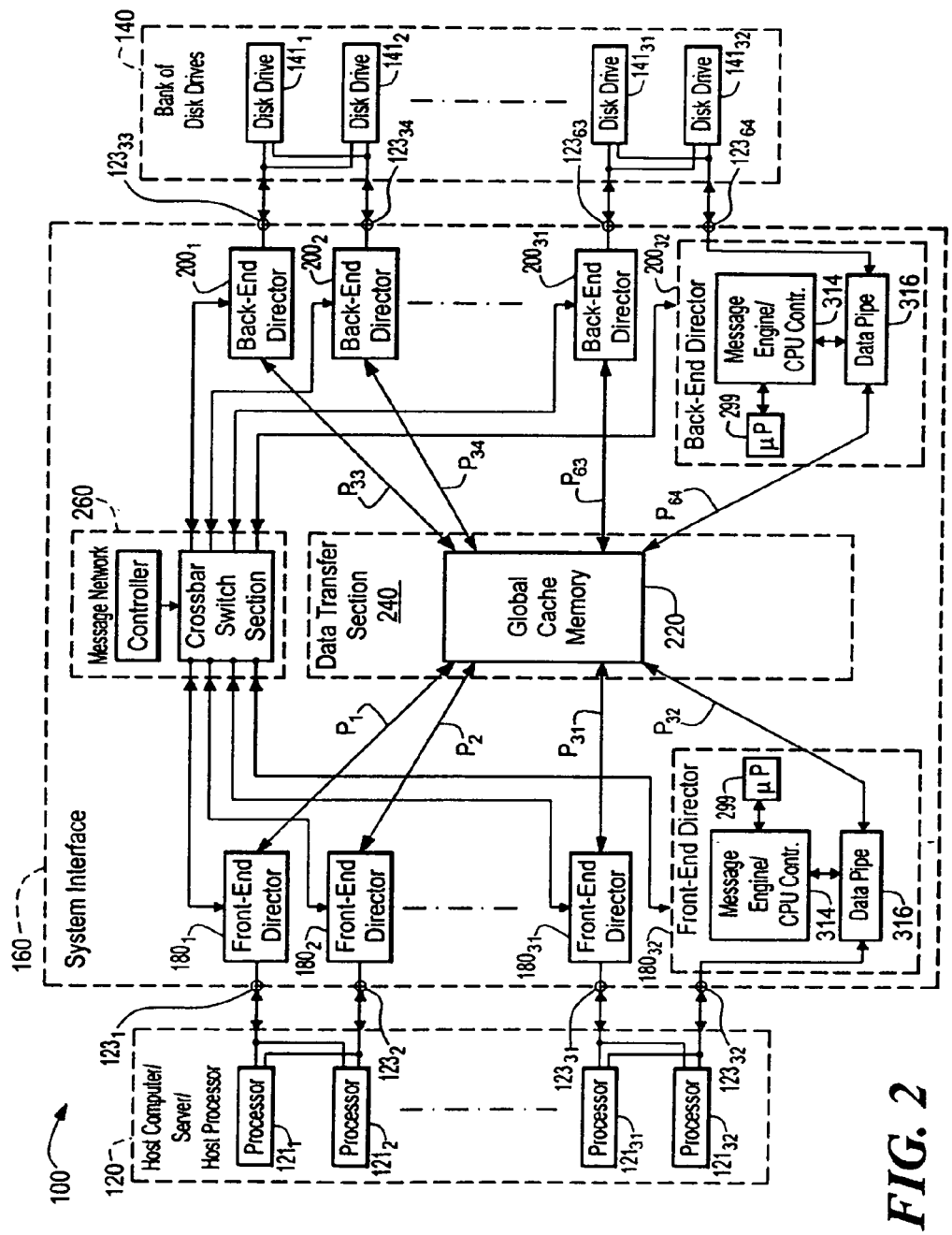
FIG. 2 is a block diagram of a data storage system according to the invention.

Referring now to FIG. 2, a data storage system 100 is shown for transferring data between a host computer/server 120 and a bank of disk drives 140 through a system interface 160. The system interface 160 includes: a plurality of, here 32 front-end directors $180_1$–$180_{32}$ coupled to the host computer/server 120 via ports-$123_{32}$; a plurality of back-end directors $200_1$–$200_{32}$ coupled to the bank of disk drives 140 via ports $123_{33}$–$123_{64}$; a data transfer section 240, having a global cache memory 220, coupled to the plurality of front-end directors $180_1$–$180_{16}$ and the back-end directors $200_1$–$200_{16}$; and a messaging network 260, operative independently of the data transfer section 240, coupled to the plurality of front-end directors $180_1$–$180_{32}$ and the plurality of back-end directors $200_1$–$200_{32}$, as shown. The front-end and back-end directors $180_1$–$180_{32}$, $200_1$–$200_{32}$ are functionally similar and include a microprocessor ($\mu$P) 299 (i.e., a central processing unit (CPU) and RAM), a message engine/CPU controller 314 and a data pipe 316 to be described in detail in connection with FIGS. 5, 6 and 7. Suffice it to say here, however, that the front-end and back-end directors $180_1$–$180_{32}$, $200_1$–$200_{32}$ control data transfer between the host computer/server 120 and the bank of disk drives 140 in response to messages passing between the directors $180_1$–$180_{32}$, $200_1$–$200_{32}$ through the messaging network 260. The messages facilitate the data transfer between host computer/server 120 and the bank of disk drives 140 with such data passing through the global cache memory 220 via the data transfer section 240. More particularly, in the case of the front-end directors $180_1$–$180_{32}$, the data passes between the host computer to the global cache memory 220 through the data pipe 316 in the front-end directors $180_1$–$180_{32}$ and the messages pass through the message engine/CPU controller 314 in such front-end directors $180_1$–$180_{32}$. In the case of the back-end directors $200_1$–$200_{32}$ the data passes between the back-end directors $200_1$–$200_{32}$ and the bank of disk drives 140 and the global cache memory 220 through the data pipe 316 in the back-end directors $200_1$–$200_{32}$ and again the messages pass through the message engine/CPU controller 314 in such back-end director $200_1$–$200_{32}$.

With such an arrangement, the cache memory 220 in the data transfer section 240 is not burdened with the task of transferring the director messaging. Rather the messaging network 260 operates independent of the data transfer section 240 thereby increasing the operating bandwidth of the system interface 160.

In operation, and considering first a read request by the host computer/server 120 (i.e., the host computer/server 120 requests data from the bank of disk drives 140), the request is passed from one of a plurality of, here 32, host computer processors $121_1$–$121_{32}$ in the host computer 120 to one or more of the pair of the front-end directors $180_1$–$180_{32}$ connected to such host computer processor $121_1$–$121_{32}$. (It is noted that in the host computer 120, each one of the host computer processors $121_1$–$121_{32}$ is coupled to here a pair (but not limited to a pair) of the front-end directors $180_1$–$180_{32}$, to provide redundancy in the event of a failure in one of the front end-directors $181_1$–$181_{32}$ coupled thereto. Likewise, the bank of disk drives 140 has a plurality of, here 32, disk drives $141_1$–$141_{32}$, each disk drive $141_1$–$141_{32}$ being coupled to here a pair (but not limited to a pair) of the back-end directors $200_1$–$200_{32}$, to provide redundancy in the event of a failure in one of the back-end directors $200_1$–$200_{32}$ coupled thereto). Each front-end director $180_1$–$180_{32}$ includes a microprocessor ($\mu P$) 299 (i.e., a central processing unit (CPU) and RAM) and will be described in detail in connection with FIGS. 5 and 7. Suffice it to say here, however, that the microprocessor 299 makes a request for the data from the global cache memory 220. The global cache memory 220 has a resident cache management table, not shown. Every director $180_1$–$180_{32}$, $200_1$–$200_{32}$ has access to the resident cache management table and every time a front-end director $180_1$–$180_{32}$ requests a data transfer, the front-end director $180_1$–$180_{32}$ must query the global cache memory 220 to determine whether the requested data is in the global cache memory 220. If the requested data is in the global cache memory 220 (i.e., a read "hit"), the front-end director $180_1$–$180_{32}$, more particularly the microprocessor 299 therein, mediates a DMA (Direct Memory Access) operation for the global cache memory 220 and the requested data is transferred to the requesting host computer processor $121_1$–$121_{32}$.

If, on the other hand, the front-end director $180_1$–$180_{32}$ receiving the data request determines that the requested data is not in the global cache memory 220 (i.e., a "miss") as a result of a query of the cache management table in the global cache memory 220, such front-end director $180_1$–$180_{32}$ concludes that the requested data is in the bank of disk drives 140. Thus the front-end director $180_1$–$180_{32}$ that received the request for the data must make a request for the data from one of the back-end directors $200_1$–$200_{32}$ in order for such back-end director $200_1$–$200_{32}$ to request the data from the bank of disk drives 140. The mapping of which back-end directors $200_1$–$200_{32}$ control which disk drives $141_1$–$141_{32}$ in the bank of disk drives 140 is determined during a power-up initialization phase. The map is stored in the global cache memory 220. Thus, when the front-end director $180_1$–$180_{32}$ makes a request for data from the global cache memory 220 and determines that the requested data is not in the global cache memory 220 (i.e., a "miss"), the front-end director $180_1$–$180_{32}$ is also advised by the map in the global cache memory 220 of the back-end director $200_1$–$200_{32}$ responsible for the requested data in the bank of disk drives 140. The requesting front-end director $180_1$–$180_{32}$ then must make a request for the data in the bank of disk drives 140 from the map designated back-end director $200_1$–$200_{32}$. This request between the front-end director $180_1$–$180_{32}$ and the appropriate one of the back-end directors $200_1$–$200_{32}$ (as determined by the map stored in the global cache memory 200) is by a message which passes from the front-end director $180_1$-$180_{32}$ through the message network 260 to the appropriate back-end director $200_1$–$200_{32}$. It is noted then that the message does not pass through the global cache memory 220 (i.e., does not pass through the data transfer section 240) but rather passes through the separate, independent message network 260. Thus, communication between the directors $180_1$–$180_{32}$, $200_1$–$200_{32}$ is through the message network 260 and not through the global cache memory 220. Consequently, valuable bandwidth for the global cache memory 220 is not used for messaging among the directors $180_1$–$180_{32}$, $200_1$–$200_{32}$.

Thus, on a global cache memory 220 "read miss", the front-end director $180_1$–$180_{32}$ sends a message to the appropriate one of the back-end directors $200_1$–$200_{32}$ through the message network 260 to instruct such back-end director $200_1$–$200_{32}$ to transfer the requested data from the bank of disk drives 140 to the global cache memory 220. When accomplished, the back-end director $200_1$–$200_{32}$ advises the requesting front-end director $180_1$–$180_{32}$ that the transfer is accomplished by a message, which passes from the back-end director $200_1$–$200_{32}$ to the front-end director $180_1$–$180_{32}$ through the message network 260. In response to the acknowledgement signal, the front-end director $180_1$–$180_{32}$ is thereby advised that such front-end director $180_1$–$180_{32}$ can transfer the data from the global cache memory 220 to the requesting host computer processor $121_1$–$121_{32}$ as described above when there is a cache "read hit".

It should be noted that there might be one or more back-end directors $200_1$–$200_{32}$ responsible for the requested data. Thus, if only one back-end director $200_1$–$200_{32}$ is responsible for the requested data, the requesting front-end director $180_1$–$180_{32}$ sends a uni-cast message via the message network 260 to only that specific one of the back-end directors $200_1$–$200_{32}$. On the other hand, if more than one of the back-end directors $200_1$–$200_{32}$ is responsible for the requested data, a multi-cast message (here implemented as a series of uni-cast messages) is sent by the requesting one of the front-end directors $180_1$–$180_{32}$ to all of the back-end directors $200_1$–$200_{32}$ having responsibility for the requested data. In any event, with both a uni-cast or multi-cast message, such message is passed through the message network 260 and not through the data transfer section 240 (i.e., not through the global cache memory 220).

Likewise, it should be noted that while one of the host computer processors $121_1$–$121_{32}$ might request data, the acknowledgement signal may be sent to the requesting host computer processor $121_1$ or one or more other host computer processors $121_1$–$121_{32}$ via a multi-cast (i.e., sequence of uni-cast) messages through the message network 260 to complete the data read operation.

Considering a write operation, the host computer 120 wishes to write data into storage (i.e., into the bank of disk drives 140). One of the front-end directors $180_1$–$180_{32}$ receives the data from the host computer 120 and writes it into the global cache memory 220. The front-end director $180_1$–$180_{32}$ then requests the transfer of such data after some period of time when the back-end director $200_1$–$200_{32}$ determines that the data can be removed from such cache memory 220 and stored in the bank of disk drives 140. Before the transfer to the bank of disk drives 140, the data in the cache memory 220 is tagged with a bit as "fresh data" (i.e., data which has not been transferred to the bank of disk drives 140, that is data which is "write pending"). Thus, if there are multiple write requests for the same memory location in the global cache memory 220 (e.g., a particular bank account) before being transferred to the bank of disk drives 140, the data is overwritten in the cache memory 220 with the most recent data. Each time data is transferred to the global cache memory 220, the front-end director $180_1$–$180_{32}$ controlling the transfer also informs the host computer 120 that the transfer is complete to thereby free-up the host computer 120 for other data transfers.

When it is time to transfer the data in the global cache memory 220 to the bank of disk drives 140, as determined by the back-end director $200_1$–$200_{32}$, the back-end director $200_1$–$200_{32}$ transfers the data from the global cache memory 220 to the bank of disk drives 140 and resets the tag associated with data in the global cache memory 220 (i.e., un-tags the data) to indicate that the data in the global cache memory 220 has been transferred to the bank of disk drives 140. It is noted that the un-tagged data in the global cache memory 220 remains there until overwritten with new data.

Figure 3:
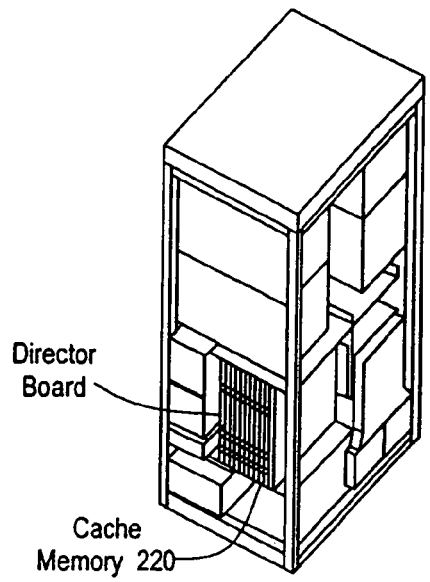
FIG. 3 is a sketch of an electrical cabinet storing a system interface used in the data storage system of FIG. 2.
Figure 4:
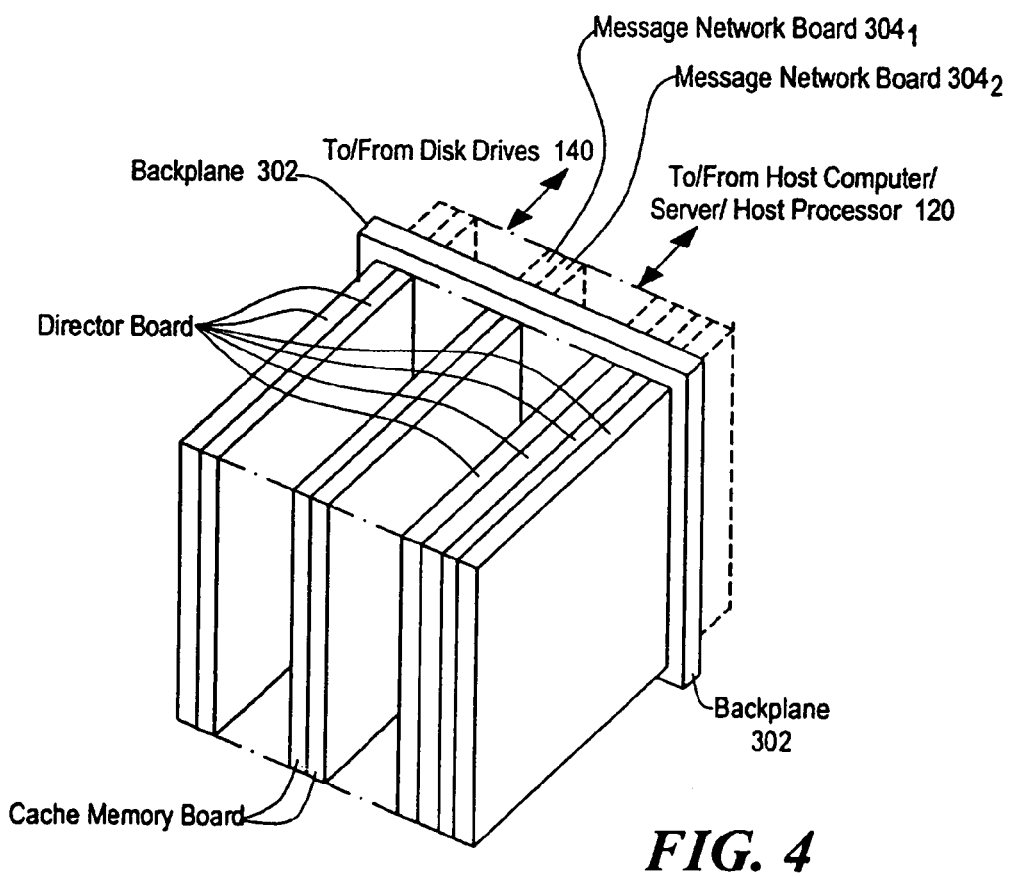
FIG. 4 is a diagramatical, isometric sketch showing printed circuit boards providing the system interface of the data storage system of FIG. 2.

Referring now to FIGS. 3 and 4, the system interface 160 is shown to include an electrical cabinet 300 having stored therein: a plurality of, here eight front-end director boards $190_1$–$190_8$, each one having here four of the front-end directors $180_1$–$180_{32}$; a plurality of, here eight back-end director boards $210_1$–$210_8$, each one having here four of the back-end directors $200_1$–$200_{32}$; and a plurality of, here eight, memory boards 220' which together make up the global cache memory 220. These boards plug into the front side of a backplane 302. (It is noted that the backplane 302 is a mid-plane printed circuit board). Plugged into the backside of the backplane 302 are message network boards $304_1$, $304_2$. The backside of the backplane 302 has plugged into it adapter boards, not shown in FIGS. 2–4, which couple the boards plugged into the back-side of the backplane 302 with the computer 120 and the bank of disk drives 140 as shown in FIG. 2. That is, referring again briefly to FIG. 2, an I/O adapter, not shown, is coupled between each one of the front-end directors $180_1$–$180_{32}$ and the host computer 120 and an I/O adapter, not shown, is coupled between each one of the back-end directors $200_1$–$200_{32}$ and the bank of disk drives 140.

Figure 5:
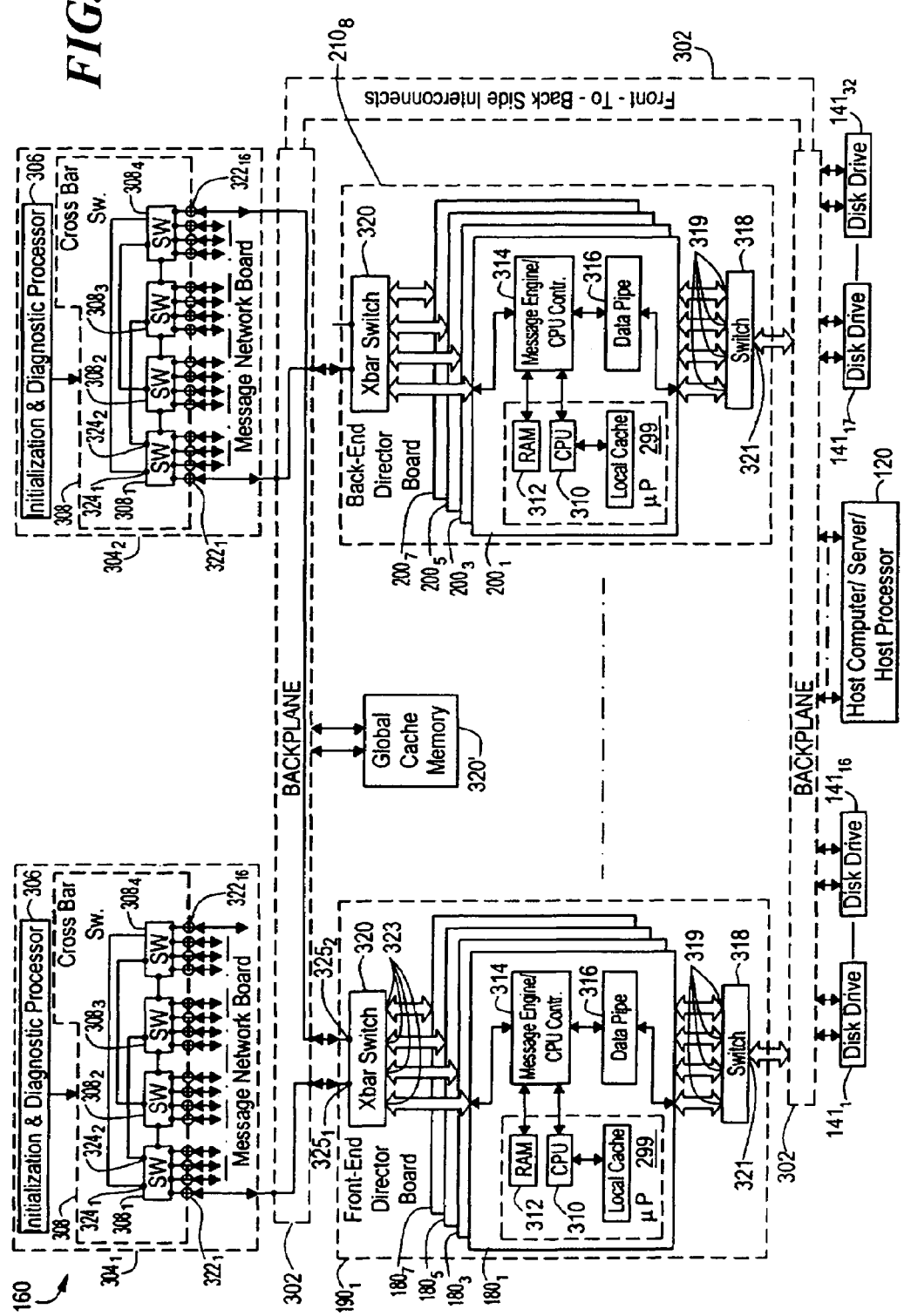
FIG. 5 is a block diagram of the system interface used in the data storage system of FIG. 2.
Figure 6B:
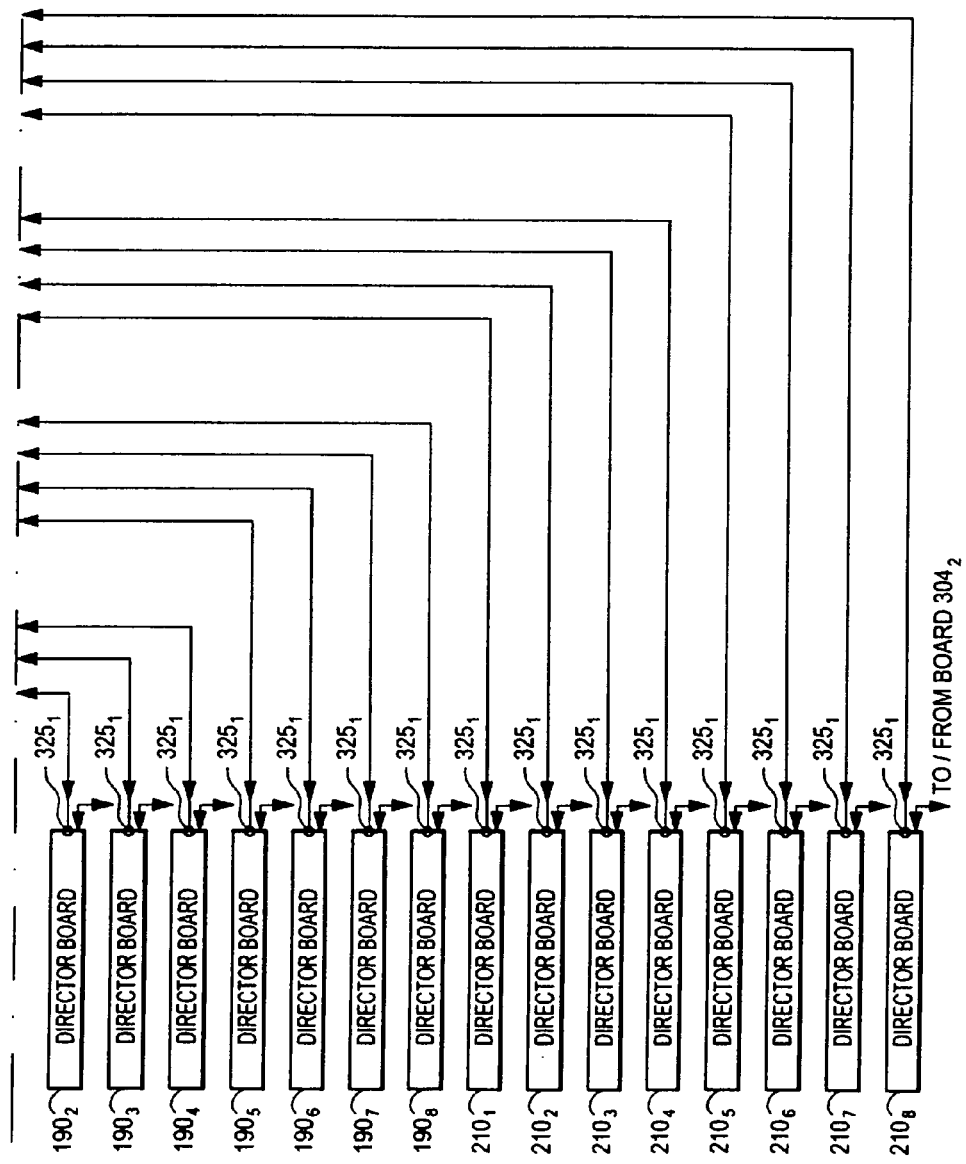
FIG. 6 shows the relationship between FIGS. 6A and 6B which when taken together is a block diagram showing the connections between front-end and back-end directors to one of a pair of message network boards used in the system interface of the data storage system of FIG. 2.

Referring now to FIG. 5, the system interface 160 is shown to include the director boards $190_1$–$190_8$, $210_1$–$210_8$ and the global cache memory 220, plugged into the backplane 302 and the disk drives $141_1$–$141_{32}$ in the bank of disk drives along with the host computer 120 also plugged into the backplane 302 via I/O adapter boards, not shown. The message network 260 (FIG. 2) includes the message network boards $304_1$ and $304_2$. Each one of the message network boards $304_1$ and $304_2$ is identical in construction. A pair of message network boards $304_1$ and $304_2$ is used for redundancy and for message load balancing. Thus, each message network board $304_1$, $304_2$, includes a controller $306_1$ (i.e., an initialization and diagnostic processor comprising a CPU, system controller interface and memory, as shown in FIG. 6 for one of the message network boards $304_1$, $304_2$, here board $304_1$) and a crossbar switch section 308 (e.g., a switching fabric made up of here four switches $308_1$–$308_4$).

Referring again to FIG. 5, each one of the director boards $190_1$–$210_8$ includes, as noted above four of the directors $180_1$–$180_{32}$, $200_1$–$200_{32}$ (FIG. 2). It is noted that the director boards $190_1$–$190_8$ having four front-end directors per board, $180_1$–$180_{32}$ are referred to as front-end directors and the director boards $210_1$–$210_8$ having four back-end directors per board, $200_1$–$200_{32}$ are referred to as back-end directors. Each one of the directors $180_1$–$180_{32}$, $200_1$–$200_{32}$ includes a CPU 310, a RAM 312 (which make up the microprocessor 299 referred to above), the message engine/CPU controller 314, and the data pipe 316.

Each one of the director boards $190_1$–$210_8$ includes a crossbar switch 318. The crossbar switch 318 has four input/output ports 319, each one being coupled to the data pipe 316 of a corresponding one of the four directors $180_1$–$180_{32}$, $200_1$–$200_{32}$ on the director board $190_1$–$210_8$. The crossbar switch 318 has eight output/input ports collectively identified in FIG. 5 by numerical designation 321 (which plug into the backplane 302. The crossbar switch 318 on the front-end director boards $191_1$–$191_8$ is used for coupling the data pipe 316 of a selected one of the four front-end directors $180_1$–$180_{32}$ on the front-end director board $190_1$–$190_8$ to the global cache memory 220 via the backplane 302 and I/O adapter, not shown. The crossbar switch 318 on the back-end director boards $210_1$–$210_8$ is used for coupling the data pipe 316 of a selected one of the four back-end directors $200_1$–$200_{32}$ on the back-end director board $210_1$–$210_8$ to the global cache memory 220 via the backplane 302 and I/O adapter, not shown. Thus, referring to FIG. 2, the data pipe 316 in the front-end directors $180_1$–$180_{32}$ couples data between the host computer 120 and the global cache memory 220 while the data pipe 316 in the back-end directors $200_1$–$200_{32}$ couples data between the bank of disk drives 140 and the global cache memory 220. It is noted that there are separate point-to-point data paths $P_1$–$P_{64}$ (FIG. 2) between each one of the directors $180_1$–$180_{32}$, $200_1$–$200_{32}$ and the global cache memory 220. It is also noted that the backplane 302 is a passive backplane because it is made up of only etched conductors on one or more layers of a printed circuit board. That is, the backplane 302 does not have any active components.

Referring again to FIG. 5, each one of the director boards $190_1$–$210_8$ includes a crossbar switch 320. Each crossbar switch 320 has four input/output ports 323, each one of the four input/output ports 323 being coupled to the message engine/CPU controller 314 of a corresponding one of the four directors $180_1$–$180_{32}$, $200_1$–$200_{32}$ on the director board $190_1$–$210_8$. Each crossbar switch 320 has a pair of output/input ports $325_1$, $325_2$, which plug into the backplane 302. Each port $325_1$–$325_2$ is coupled to a corresponding one of the message network boards $304_1$, $304_2$, respectively, through the backplane 302. The crossbar switch 320 on the front-end director boards $190_1$–$190_8$ is used to couple the messages between the message engine/CPU controller 314 of a selected one of the four front-end directors $180_1$–$180_{32}$ on the front-end director boards $190_1$–$190_8$ and the message network 260, FIG. 2. Likewise, the back-end director boards $210_1$–$210_8$ are used to couple the messages produced by a selected one of the four back-end directors $200_1$–$200_{32}$ on the back-end director board $210_1$–$210_8$ between the message engine/CPU controller 314 of a selected one of such four back-end directors and the message network 260 (FIG. 2). Thus, referring also to FIG. 2, instead of having a separate dedicated message path between each one of the directors $180_1$–$180_{32}$, $200_1$–$200_{32}$ and the message network 260 (which would require M individual connections to the backplane 302 for each of the directors, where M is an integer), here only M/4 individual connections are required). Thus, the total number of connections between the directors $180_1$–$180_{32}$, $200_1$–$200_{32}$ and the backplane 302 is reduced to ¼th. Thus, it should be noted from FIGS. 2 and 5 that the message network 260 (FIG. 2) includes the crossbar switch 320 and the message network boards $304_1$, $304_2$.

Figure 2A:
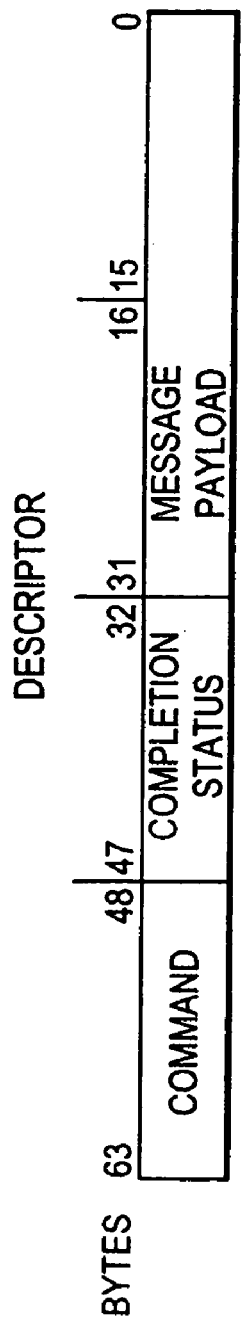
FIG. 2A shows the fields of a descriptor used in the system interface of the data storage system of FIG. 2.
Figure 2B:
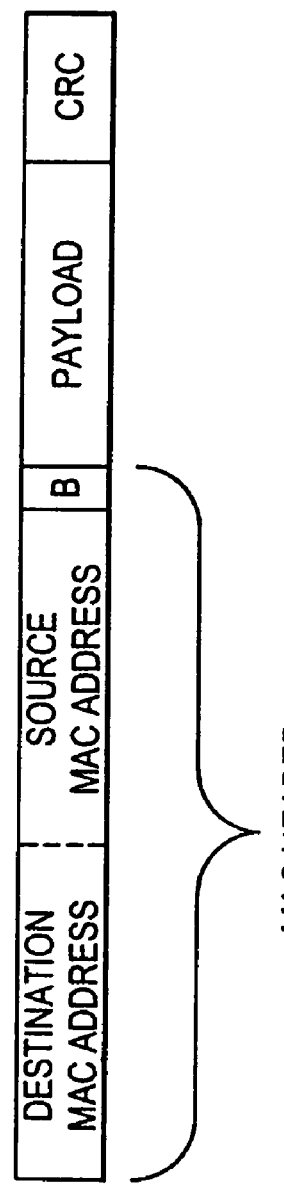
FIG. 2B shows the filed used in a MAC packet used in the system interface of the data storage system of FIG. 2.

Each message is a 64-byte descriptor, shown in FIG. 2A, which is created by the CPU 310 (FIG. 5) under software control and is stored in a send queue in RAM 312. When the message is to be read from the send queue in RAM 312 and transmitted through the message network 260 (FIG. 2) to one or more other directors via a DMA operation to be described, it is packetized in the packetizer portion of packetizer/de-packetizer 428 (FIG. 7) into a MAC type packet, shown in FIG. 2B, here using the NGIO protocol specification. There are three types of packets: a message packet section; an acknowledgement packet; and a message network fabric management packet, the latter being used to establish the message network routing during initialization (i.e., during power-up). Each one of the MAC packets has: an 8-byte header which includes source (i.e., transmitting director) and destination (i.e., receiving director) address; a payload; and terminates with a 4-byte Cyclic Redundancy Check (CRC), as shown in FIG. 2B. The acknowledgement packet (i.e., signal) has a 4-byte acknowledgment payload section. The message packet has a 32-byte payload section. The Fabric Management Packet (FMP) has a 256-byte payload section. The MAC packet is sent to the crossbar switch 320. The destination portion of the packet is used to indicate the destination for the message and is decoded by the switch 320 to determine which port the message is to be routed. The decoding process uses a decoder table 327 in the switch 318, such table being initialized by controller during power-up by the initialization and diagnostic processor (controller) 306 (FIG. 5). The table 327 (FIG. 7) provides the relationship between the destination address portion of the MAC packet, which identifies the routing for the message and the one of the four directors $180_1$–$180_{32}$, $200_1$–$200_{32}$ on the director board $190_1$–$190_8$, $210_1$–$210_8$ or to one of the message network boards $304_1$, $304_2$ to which the message is to be directed.

More particularly, and referring to FIG. 5, a pair of output/input ports $325_1$, $325_2$ is provided for each one of the crossbar switches 320, each one being coupled to a corresponding one of the pair of message network boards $304_1$, $304_2$. Thus, each one of the message network boards $304_1$, $304_2$ has sixteen input/output ports $322_1$–$322_{16}$, each one being coupled to a corresponding one of the output/input ports $325_1$, $325_2$, respectively, of a corresponding one of the director boards $190_1$–$190_8$, $210_1$–$210_8$ through the backplane 302, as shown. Thus, considering exemplary message network board $304_1$, FIG. 6, each switch $308_1$–$308_4$ also includes three coupling ports $324_1$–$324_3$. The coupling ports $324_1$–$324_3$ are used to interconnect the switches $322_1$–$322_4$, as shown in FIG. 6. Thus, considering message network board $304_1$, input/output ports $322_1$–$322_8$ are coupled to output/input ports $325_1$ of front-end director boards $190_1$–$190_8$ and input/output ports $322_9$–$322_{16}$ are coupled to output/input ports $325_1$ of back-end director boards $210_1$–$210_8$, as shown. Likewise, considering message network board $304_2$, input/output ports $322_1$–$322_8$ thereof are coupled, via the backplane 302, to output/input ports $325_2$ of front-end director boards $190_1$–$190_8$ and input/output ports $322_9$–$322_{16}$ are coupled, via the backplane 302, to output/input ports $325_2$ of back-end director boards $210_1$–$210_8$.

As noted above, each one of the message network boards $304_1$, $304_2$ includes a processor 306 (FIG. 5) and a crossbar switch section 308 having four switches $308_1$–$308_4$, as shown in FIGS. 5 and 6. The switches $308_1$–$308_4$ are interconnected as shown so that messages can pass between any pair of the input/output ports $322_1$–$322_{16}$. Thus, it follow that a message from any one of the front-end directors $180_1$–$180_{32}$ can be coupled to another one of the front-end directors $180_1$–$180_{32}$ and/or to any one of the back-end directors $200_1$–$200_{32}$. Likewise, a message from any one of the back-end directors $180_1$–$180_{32}$ can be coupled to another one of the back-end directors $180_1$–$180_{32}$ and/or to any one of the front-end directors $200_1$–$200_{32}$.

As noted above, each MAC packet (FIG. 2B) includes in an address destination portion and a data payload portion. The MAC header is used to indicate the destination for the MAC packet and such MAC header is decoded by the switch to determine which port the MAC packet is to be routed. The decoding process uses a table in the switch $308_1$–$308_4$, such table being initialized by processor 306 during power-up. The table provides the relationship between the MAC header, which identifies the destination for the MAC packet and the route to be taken through the message network. Thus, after initialization, the switches 320 and the switches $308_1$–$308_4$ in switch section 308 provides packet routing which enables each one of the directors $180_1$–$180_{32}$, $200_1$–$200_{32}$ to transmit a message between itself and any other one of the directors, regardless of whether such other director is on the same director board $190_1$–$190_8$, $210_1$–$210_8$ or on a different director board. Further, the MAC packet has an additional bit B in the header thereof, as shown in FIG. 2B, which enables the message to pass through message network board $304_1$ or through message network board $304_2$. During normal operation, this additional bit B is toggled between a logic 1 and a logic 0 so that one message passes through one of the redundant message network boards $304_1$, $304_2$ and the next message to pass through the other one of the message network boards $304_1$, $304_2$ to balance the load requirement on the system. However, in the event of a failure in one of the message network boards $304_1$, $304_2$, the non-failed one of the boards $304_1$, $304_2$ is used exclusively until the failed message network board is replaced.

Figure 7:
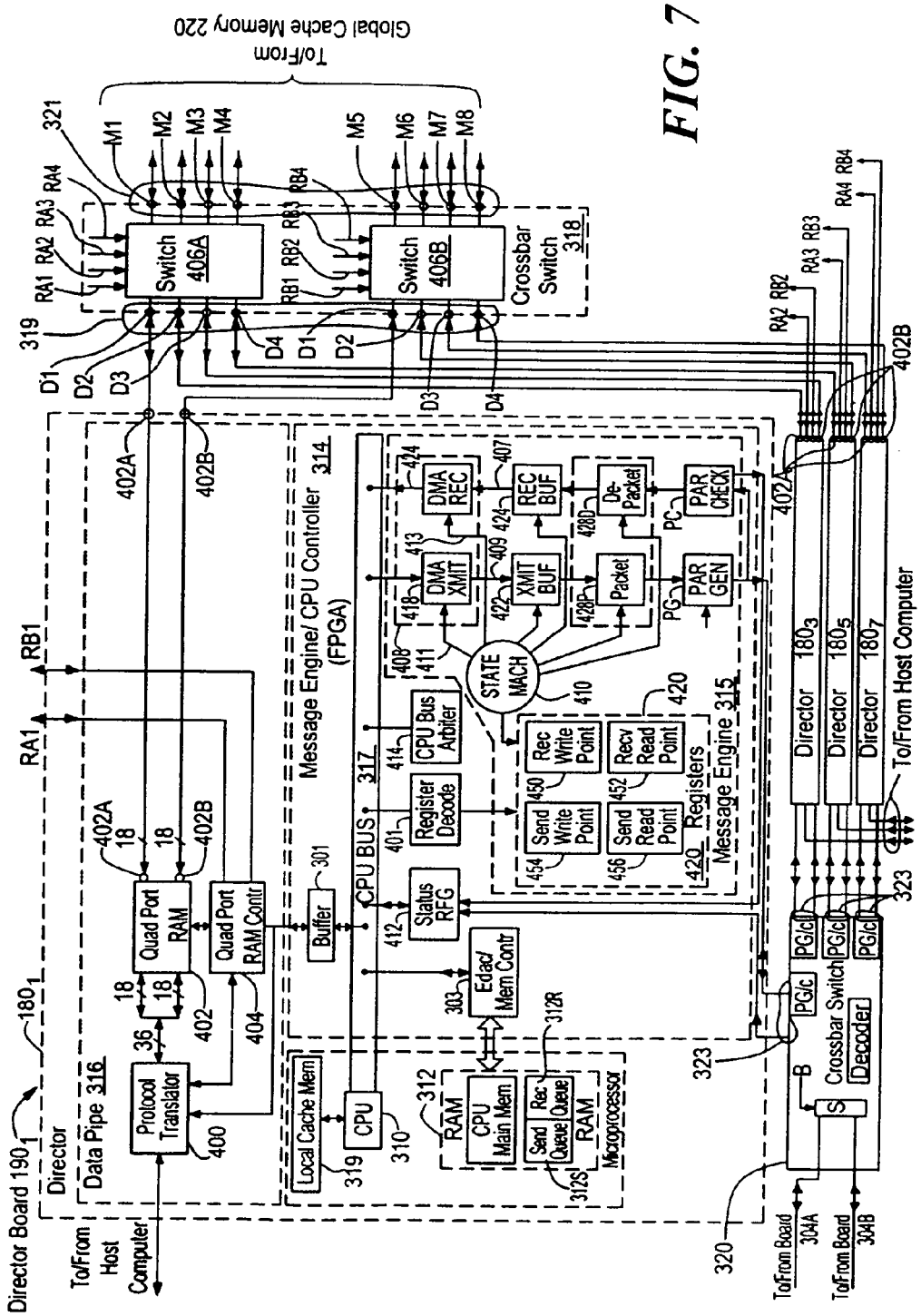
FIG. 7 is a block diagram of an exemplary one of the director boards used in the system interface of he data storage system of FIG. 2.

Referring now to FIG. 7, an exemplary one of the director boards $190_1$–$190_8$, $210_1$–$210_8$, here director board $190_1$ is shown to include directors $180_1$, $180_3$, $180_5$ and $180_7$. An exemplary one of the directors $180_1$–$180_4$, here director $180_1$ is shown in detail to include the data pipe 316, the message engine/CPU controller 314, the RAM 312, and the CPU 310 all coupled to the CPU interface bus 317, as shown. The exemplary director $180_1$ also includes: a local cache memory 319 (which is coupled to the CPU 310); the crossbar switch 318; and, the crossbar switch 320, described briefly above in connection with FIGS. 5 and 6. The data pipe 316 includes a protocol translator 400, a quad port RAM 402 and a quad port RAM controller 404 arranged as shown. Briefly, the protocol translator 400 converts between the protocol of the host computer 120, in the case of a front-end director $180_1$–$180_{32}$, (and between the protocol used by the disk drives in bank 140 in the case of a back-end director $200_1$–$200_{32}$) and the protocol between the directors $180_1$–$180_3$, $200_1$–$200_{32}$ and the global memory 220 (FIG. 2). More particularly, the protocol used the host computer 120 may, for example, be fibre channel, SCSI, ESCON or FICON, for example, as determined by the manufacture of the host computer 120 while the protocol used internal to the system interface 160 (FIG. 2) may be selected by the manufacturer of the interface 160. The quad port RAM 402 is a FIFO controlled by controller 404 because the rate data coming into the RAM 402 may be different from the rate data leaving the RAM 402. The RAM 402 has four ports, each adapted to handle an 18 bit digital word. Here, the protocol translator 400 produces 36 bit digital words for the system interface 160 (FIG. 2) protocol, one 18 bit portion of the word is coupled to one of a pair of the ports of the quad port RAM 402 and the other 18 bit portion of the word is coupled to the other one of the pair of the ports of the quad port RAM 402. The quad port RAM has a pair of ports 402A, 402B, each one of to ports 402A, 402B being adapted to handle an 18 bit digital word. Each one of the ports 402A, 402B is independently controllable and has independent, but arbitrated, access to the memory array within the RAM 402. Data is transferred between the ports 402A, 402B and the cache memory 220 (FIG. 2) through the crossbar switch 318, as shown.

Figure 8:
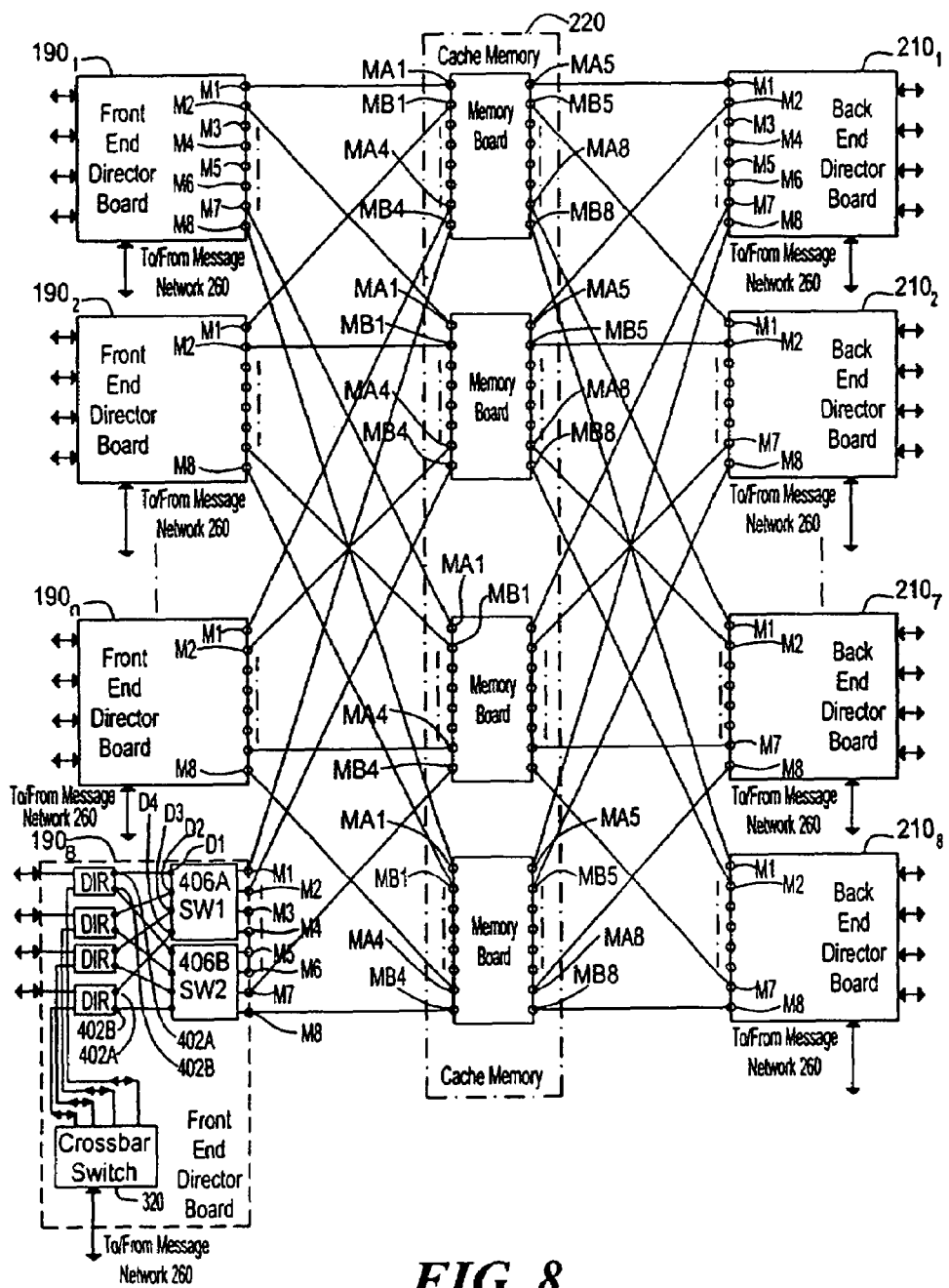
FIG. 8 is a block diagram of the system interface used in the data storage system of FIG. 2.

The crossbar switch 318 includes a pair of switches 406A, 406B. Each one of the switches 406A, 406B includes four input/output director-side ports $D_1$–$D_4$ (collectively referred to above in connection with FIG. 5 as port 319) and four input/output memory-side ports $M_1$–$M_4$, $M_5$–$M_8$, respectively, as indicated. The input/output memory-side ports $M_1$–$M_4$, $M_5$–$M_8$ were collectively referred to above in connection with FIG. 5 as port 317). The director-side ports $D_1$–$D_4$ of switch 406A are connected to the 402A ports of the quad port RAMs 402 in each one the directors $180_1$, $180_3$, $180_5$ and $180_7$, as indicated. Likewise, director-side ports of switch 406B are connected to the 402B ports of the quad port RAMs 402 in each one the directors $180_1$, $180_3$, $180_5$, and $180_7$, as indicated. The ports $D_1$–$D_4$ are selectively coupled to the ports $M_1$–$M_4$ in accordance with control words provided to the switch 406A by the controllers in directors $180_1$, $180_3$, $180_5$, $180_7$ on busses $R_{A1}$–$R_{A4}$, respectively, and the ports $D_1$–$D_4$ are coupled to ports $M_5$–$M_8$ in accordance with the control words provided to switch 406B by the controllers in directors $180_1$, $180_3$, $180_5$, $180_7$ on busses $R_{B1}$–$R_{B4}$, as indicated. The signals on buses $R_{A1}$–$R_{A4}$ are request signals. Thus, port 402A of any one of the directors $180_1$, $180_3$, $180_5$, $180_7$ may be coupled to any one of the ports $M_1$–$M_4$ of switch 406A, selectively in accordance with the request signals on buses $R_{A1}$–$R_{A4}$. Likewise, port 402B of any one of the directors $180_1$–$180_4$ may be coupled to any one of the ports $M_5$–$M_8$ of switch 406B, selectively in accordance with the request signals on buses $R_{B1}$–$R_{B4}$. The coupling between the director boards $190_1$–$190_8$, $210_1$–$210_8$ and the global cache memory 220 is shown in FIG. 8.

More particularly, and referring also to FIG. 2, as noted above, each one of the host computer processors $121_1$–$121_{32}$ in the host computer 120 is coupled to a pair of the front-end directors $180_1$–$180_{32}$, to provide redundancy in the event of a failure in one of the front end-directors $181_1$–$181_{32}$ coupled thereto. Likewise, the bank of disk drives 140 has a plurality of, here 32, disk drives $141_1$–$141_{32}$, each disk drive $141_1$–$141_{32}$ being coupled to a pair of the back-end directors $200_1$–$200_{32}$, to provide redundancy in the event of a failure in one of the back-end directors $200_1$–$200_{32}$ coupled thereto). Thus, considering exemplary host computer processor $121_1$, such processor $121_1$ is coupled to a pair of front-end directors $180_1$, $180_2$. Thus, if director $180_1$ fails, the host computer processor $121_1$ can still access the system interface 160, albeit by the other front-end director $180_2$. Thus, directors $180_1$ and $180_2$ are considered redundancy pairs of directors. Likewise, other redundancy pairs of front-end directors are: front-end directors $180_3$, $180_4$; $180_5$, $180_6$; $180_7$, $180_8$; $180_9$, $180_{10}$; $180_{11}$, $180_{12}$; $180_{13}$, $180_{14}$; $180_{15}$, $180_{16}$; $180_{17}$, $180_{18}$; $180_{19}$, $180_{20}$; $180_{21}$, $180_{22}$; $180_{23}$, $180_{24}$; $180_{25}$, $180_{26}$; $180_{27}$, $180_{28}$; $180_{29}$, $180_{30}$; and $180_{31}$, $180_{32}$ (only directors $180_{31}$ and $180_{32}$ being shown in FIG. 2).

Likewise, disk drive $141_1$ is coupled to a pair of back-end directors $200_1$, $200_2$. Thus, if director $200_1$ fails, the disk drive $141_1$ can still access the system interface 160, albeit by the other back-end director $180_2$. Thus, directors $200_1$ and $200_2$ are considered redundancy pairs of directors. Likewise, other redundancy pairs of back-end directors are: back-end directors $200_3$, $200_4$; $200_5$, $200_6$; $200_7$, $200_8$; $200_9$, $200_{10}$; $200_{11}$, $200_{12}$; $200_{13}$, $200_{14}$; $200_{15}$, $200_{16}$; $200_{17}$, $200_{18}$; $200_{19}$, $200_{20}$; $200_{21}$, $200_{22}$; $200_{23}$, $200_{24}$; $200_{25}$, $200_{26}$; $200_{27}$, $200_{28}$; $200_{29}$, $200_{30}$; and $200_{31}$, $200_{32}$ (only directors $200_{31}$ and $200_{32}$ being shown in FIG. 2). Further, referring also to FIG. 8, the global cache memory 220 includes a plurality of, here eight, cache memory boards $220_1$–$220_8$, as shown. Still further, referring to FIG. 8A, an exemplary one of the cache memory boards, here board $220_1$ is shown in detail and will be described in detail in connection with FIGS. 23–29. Here, each cache memory board includes four memory array regions, an exemplary one thereof being shown and described in connection with FIG. 6 of U.S. Pat. No. 5,943,287 entitled "Fault Tolerant Memory System", John K. Walton, inventor, issued Aug. 24, 1999 and assigned to the same assignee as the present invention, the entire subject matter therein being incorporated herein by reference. Further detail of the exemplary one of the cache memory boards.

Figure 8A:
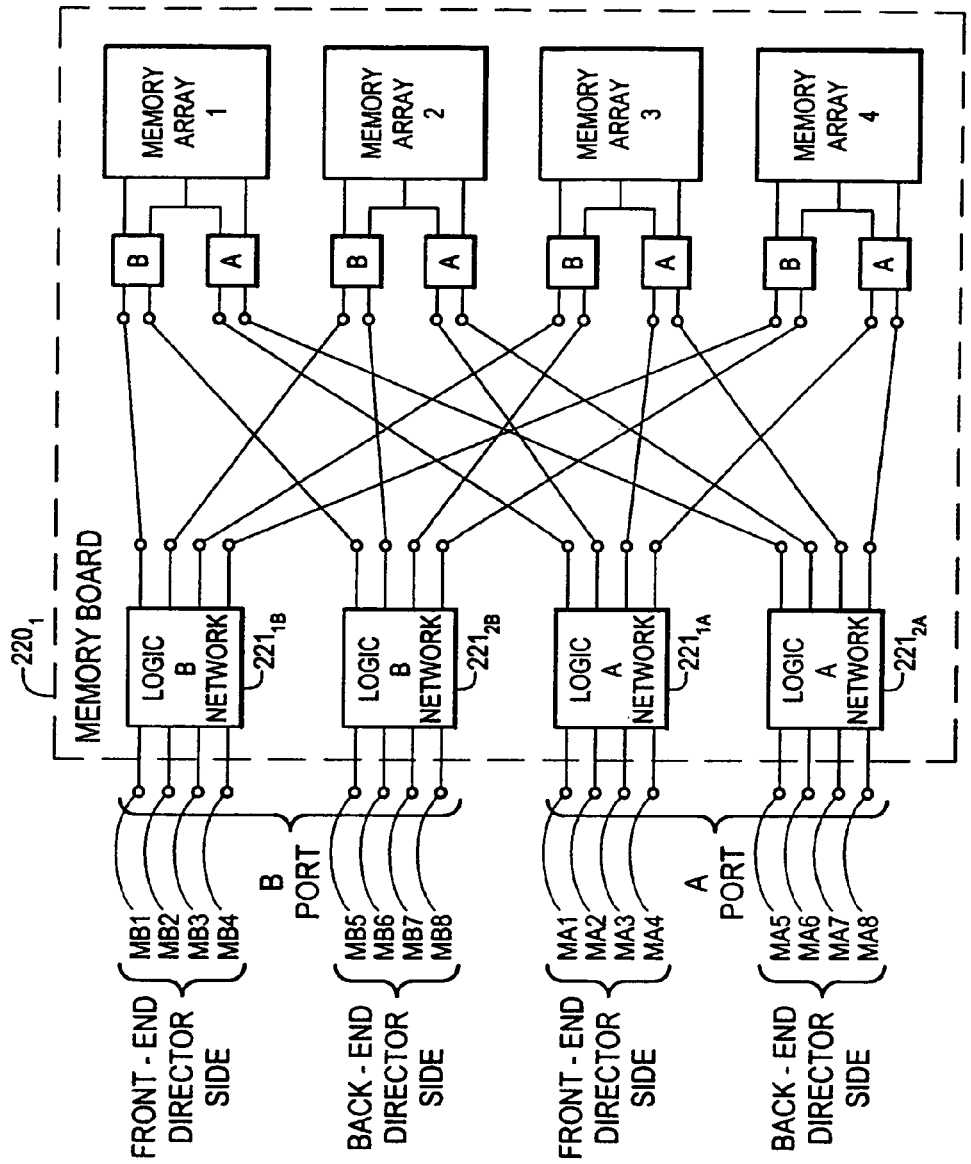
FIG. 8A is a diagram of an exemplary global cache memory board used in the system interface of FIG. 8.

As shown in FIG. 8A, the board $220_1$ includes a plurality of, here four RAM memory arrays, each one of the arrays has a pair of redundant ports, i.e., an A port and a B port. The board itself has sixteen ports; a set of eight A ports $M_{A1}$–$M_{A8}$ and a set of eight B ports $M_{B1}$–$M_{B8}$. Four of the eight A port, here A ports $M_{A1}$–$M_{A4}$ are coupled to the $M_1$ port of each of the front-end director boards $190_1$, $190_3$, $190_5$, and $190_7$, respectively, as indicated in FIG. 8. Four of the eight B port, here B ports $M_{B1}$–$M_{B4}$ are coupled to the $M_1$ port of each of the front-end director boards $190_2$, $190_4$, $190_6$, and $190_8$, respectively, as indicated in FIG. 8. The other four of the eight A port, here A ports $M_{A5}$–$M_{A8}$ are coupled to the $M_1$ port of each of the back-end director boards $210_1$, $210_3$, $210_5$, and $210_7$, respectively, as indicated in FIG. 8. The other four of the eight B port, here B ports $M_{B5}$–$M_{A8}$ are coupled to the $M_1$ port of each of the back-end director boards $210_2$, $210_4$, $210_6$, and $210_8$, respectively, as indicated in FIG. 8.

Considering the exemplary four A ports $M_{A1}$–$M_{A4}$, each one of the four A ports $M_{A1}$–$M_{A4}$ can be coupled to the A port of any one of the memory arrays through the logic network $221_{1A}$, to be described in more detail in connection with FIGS. 25, 126 and 27. Thus, considering port MAI, such port can be coupled to the A port of the four memory arrays. Likewise, considering the four A ports $M_{A5}$–$M_{A8}$, each one of the four A ports $M_{A5}$–$M_{A8}$ can be coupled to the A port of any one of the memory arrays through the logic network $221_{1B}$. Likewise, considering the four B ports $M_{B1}$–$M_{B4}$, each one of the four B ports $M_{B1}$–$M_{B4}$ can be coupled to the B port of any one of the memory arrays through logic network $221_{13}$. Likewise, considering the four B ports $M_{B5}$–$M_{B8}$, each one of the four B ports $M_{B5}$–$M_{B8}$ can be coupled to the B port of any one of the memory arrays through the logic network $221_{2B}$. Thus, considering port $M_{B1}$, such port can be coupled to the B port of the four memory arrays. Thus, there are two paths data and control from either a front-end director $180_1$–$180_{32}$ or a back-end director $200_1$–$200_{32}$ can reach each one of the four memory arrays on the memory board. Thus, there are eight sets of redundant ports on a memory board, i.e., ports $M_{A1}$, $M_{B1}$; $M_{A2}$, $M_{B2}$; $M_{A3}$, $MB_3$; $M_{A4}$, $M_{B4}$; $M_{A5}$, $M_{B5}$; $M_{A6}$, $M_{B6}$; $M_{A7}$, $M_{B7}$; and $M_{A8}$, $M_{B8}$. Further, as noted above each one of the directors has a pair of redundant ports, i.e. a 402A port and a 402 B port (FIG. 7). Thus, for each pair of redundant directors, the A port (i.e., port 402A) of one of the directors in the pair is connected to one of the pair of redundant memory ports and the B port (i.e., 402B) of the other one of the directors in such pair is connected to the other one of the pair of redundant memory ports.

Figure 8B:
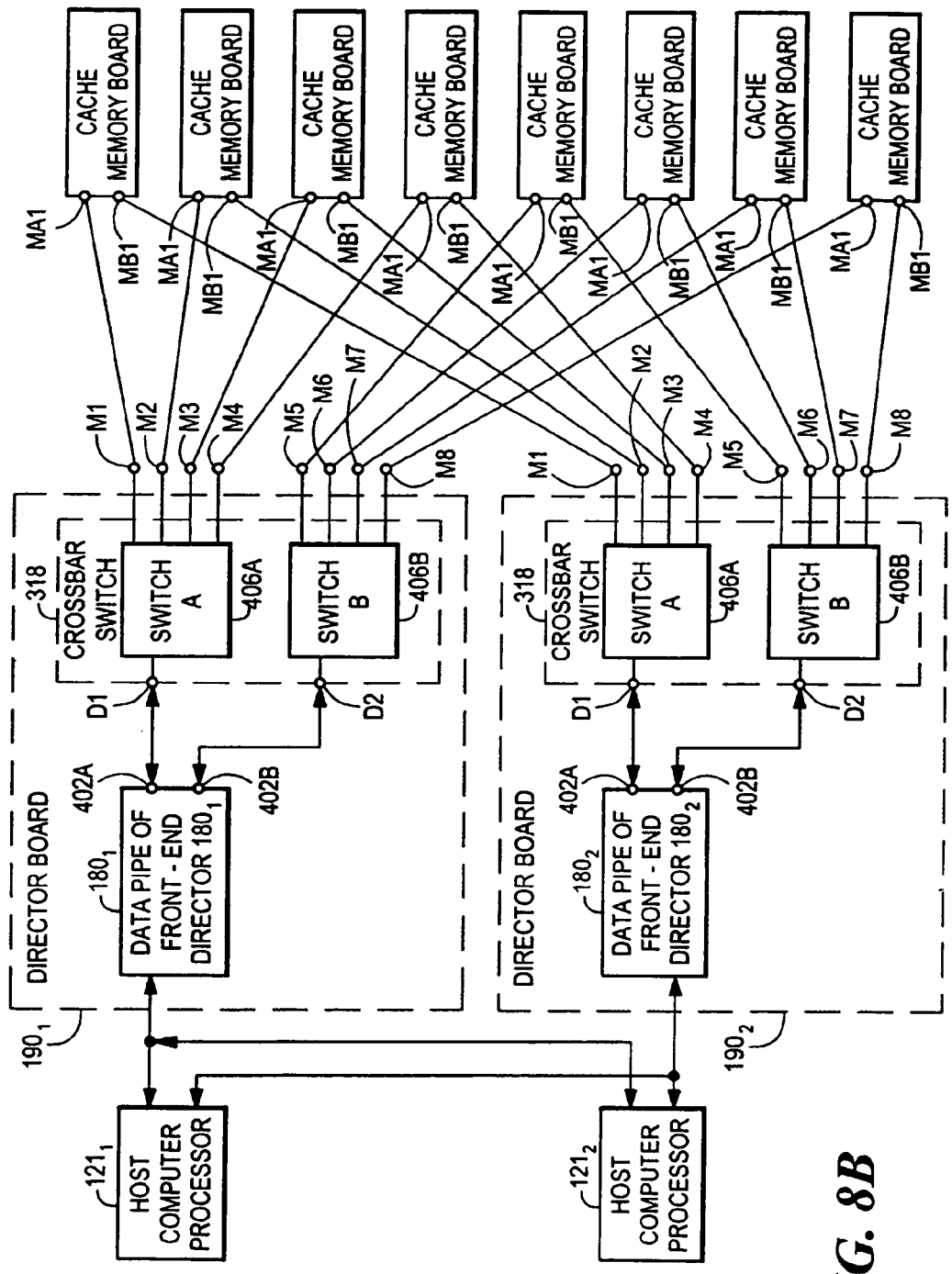
FIG. 8B is a diagram showing a pair of director boards coupled between a pair of host processors and global cache memory boards used in the system interface of FIG. 8.

More particularly, referring to FIG. 8B, an exemplary pair of redundant directors is shown, here, for example, front-end director $180_1$ and front end-director $180_2$. It is first noted that the directors $180_1$, $180_2$ in each redundant pair of directors must be on different director boards, here boards $190_1$, $190_2$, respectively. Thus, here front-end director boards $190_1$–$190_8$ have thereon: front-end directors $180_1$, $180_3$, $180_5$ and $180_7$; front-end directors $180_2$, $180_4$, $180_6$ and $180_8$; front end directors $180_9$, $180_{11}$, $180_{13}$ and $180_{15}$; front end directors $180_{10}$, $180_{12}$, $180_{14}$ and $180_{16}$; front-end directors $180_{17}$, $180_{19}$, $180_{21}$ and $180_{23}$; front-end directors $180_{18}$, $180_{20}$, $180_{22}$ and $180_{24}$; front-end directors $180_{25}$, $180_{27}$, $180_{29}$ and $180_{31}$; front-end directors $180_{18}$, $180_{20}$, $180_{22}$ and $180_{24}$. Thus, here back-end director boards $210_1$–$210_8$ have thereon: back-end directors $200_1$, $200_3$, $200_5$ and $200_7$; back-end directors $200_2$, $200_4$, $200_6$ and $200_8$; back-end directors $200_9$, $200_9$, $200_{13}$ and $200_{15}$; back-end directors $200_{10}$, $200_{12}$, $200_{14}$ and $200_{16}$; back-end directors $200_{17}$, $200_{19}$, $200_{21}$ and $200_{23}$; back-end directors $200_{18}$, $200_{20}$, $200_{22}$ and $200_{24}$; back-end directors $200_{25}$, $200_{27}$, $200_{29}$ and $200_{31}$; back-end directors $200_{18}$, $200_{20}$, $20022$ and $200_{24}$.

Thus, here front-end director $180_1$, shown in FIG. 8A, is on front-end director board $190_1$ and its redundant front-end director $180_2$, shown in FIG. 8B, is on anther front-end director board, here for example, front-end director board $190_2$. As described above, the port 402A of the quad port RAM 402 (i.e., the A port referred to above) is connected to switch 406A of crossbar switch 318 and the port 402B of the quad port RAM 402 (i.e., the B port referred to above) is connected to switch 406B of crossbar switch 318. Likewise, for redundant director $180_2$, However, the ports $M_1$–$M_4$ of switch 406A of director $180_1$ are connected to the $M_{A1}$ ports of global cache memory boards $220_1$–$200_4$, as shown, while for its redundancy director $180_2$, the ports $M_1$–$M_4$ of switch 406A are connected to the redundant $MB_1$ ports of global cache memory boards $220_1$–$200_4$, as shown.

Further details are provided in co-pending patent application Ser. No. 09/561,531 filed Apr. 28, 2000 and 09/561, 161 assigned to the same assignee as the present patent application, the entire subject matter thereof being incorporated herein by reference.

Cache Memory Boards

Figure 9A:
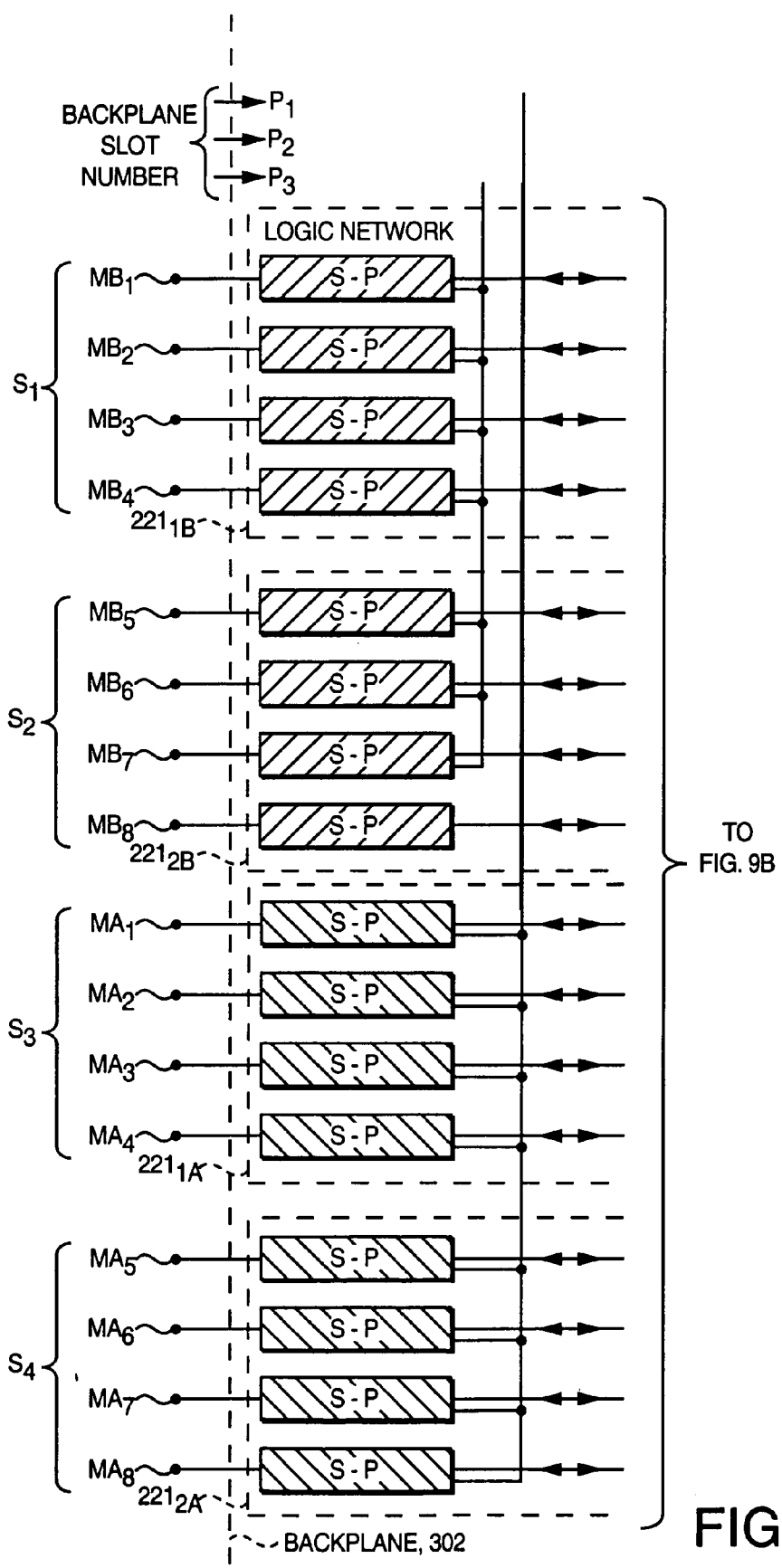

Referring again to FIG. 8, the system includes a plurality of, here eight, memory boards. As described above in connection with FIG. 8A, each one of the memory boards includes four memory array regions $R_1$–$R_4$. Referring now to FIGS. 9A, 9B and 9OC, an exemplary one of the cache memory boards in the cache memory 220 (FIG. 8), here cache memory board $220_1$, is shown in more detail to include, here, the four logic networks $221_{1B}$, $221_{2B}$, $221_{1A}$, and $221_{2A}$ and, here eight interface, or memory region control, sections, here logic sections $5010_1$–$5010_8$, arranged as shown.

Figure 16:
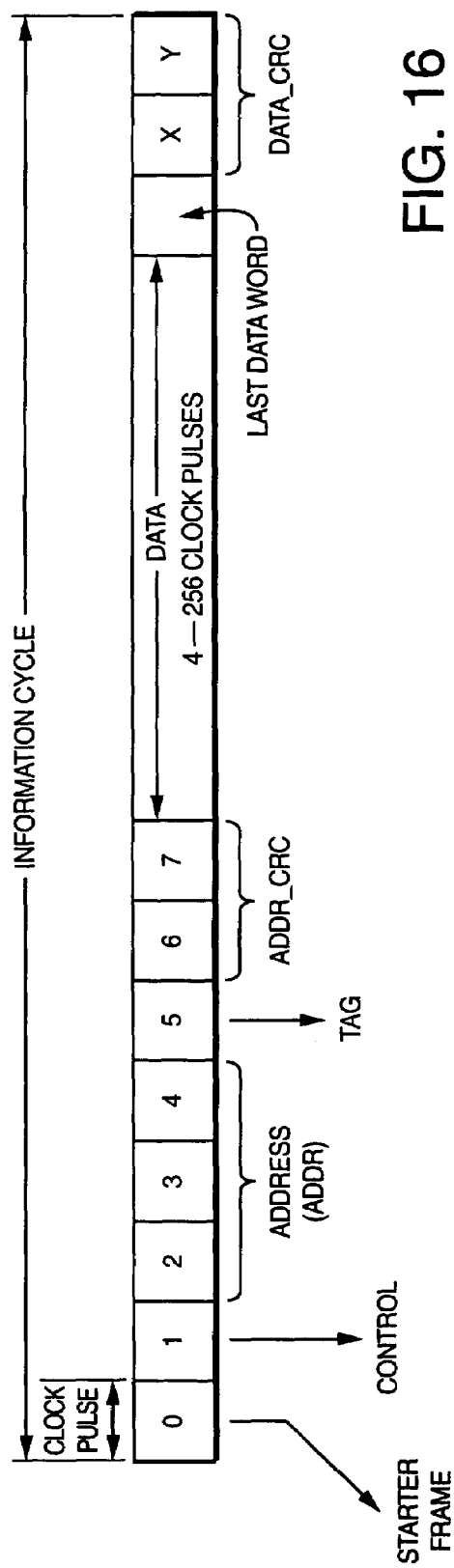
FIG. 16 is a diagram showing words that make up exemplary information cycle used in the memory board of FIGS. 9A, 9B and 9C.

Each one of the four logic networks $221_{1B}$, $221_{2B}$, $221_{1A}$, and $221_{2A}$ includes four sets of serial-to-parallel converters (S/P), each one of the sets having four of the S/P converters. The sets of S/P converters are coupled between ports $MB_1$–$M_{B4}$, $M_{B5}$–$M_{B8}$, $M_{A1}$–$M_{A4}$, and $M_{A5}$–$M_{A5}$, respectively, and a corresponding one of four crossbar switches $5004_1$–$5004_4$. The S/Ps convert between a serial stream of information (i.e., data, address, and control, Cyclic Redundancy Checks (CRCs), signaling semaphores, etc.) at ports $M_{B1}$–$M_{B8}$, $M_{A1}$–$M_{A8}$, and a parallel stream of the information which passes through the crossbar switches $5004_1$–$5004_4$. Thus, here the crossbar switches $5004_1$–$5004_4$ process parallel information. Information is transferred between directors and the crossbar switches as transfers, or information cycles. An exemplary information transfer for information passing for storage in the memory array region is shown in FIG. 16. Each information cycle is shown to include a plurality of sixteen bit words, each word being associated with a clock pulse. Thus, first word 0 is shown to include protocol signaling (e.g., semaphore) and a terminating "start-frame" indication. The next word 1 includes memory control information. The next three words, 2–4, include memory address (ADDR) information. The next word, 5, is a "tag" which indicated the memory board, memory array region, and other information to be described. The next two words, 6 and 7, provide Cyclic Redundancy Checks (CRC) information regarding the address (ADDR_CRC). The DATA to be written into the memory then follows. The number of words of DATA is variable and here is between 4 words and 256 words. The information cycle terminates with two words, X and Y which include DATA CRC information.

As will be described in more detail below, the cache memory board $220_1$ is a multi-ported design which allows equal access to one of several, here four, regions of memory (i.e., here memory array regions $R_1$–$R_4$) from any of here sixteen ports $M_{B1}$–$M_{B8}$, $M_{A1}$–$M_{A8}$. The sixteen ports $M_{B1}$–$M_{B8}$, $M_{A1}$–$M_{A8}$ are grouped into four sets $S_1$–$S_4$. Each one of the sets $S_1$–$S_4$ is associated with, i.e., coupled to, a corresponding one of the four crossbar switches $5004_1$–$5004_4$, respectively, as indicated. Each one of the crossbar switches $5004_1$–$5004_4$ interconnects its upper four ports $5006_1$–$5006_4$ to a corresponding one of the four memory regions $R_1$–$R_4$ in a point-to-point fashion. Thus, between the four crossbar switches $5004_1$–$5004_4$ and the four memory regions $R_1$–$R_4$ there are sixteen potential unique interconnects.

The communication between any port $M_{B1}$–$M_{B8}$, $M_{A1}$–$M_{A8}$ and its corresponding crossbar switch $5004_1$–$5004_4$ is protected by Cyclic Redundancy Check (CRC) defined by CCITT-V.41. The communication between a crossbar switch $5004_1$–$5004_4$ and the memory array region $R_1$–$R_4$ is protected by byte parity (p). There is a pipelined architecture from the port $M_{B1}$–$M_{B8}$, $M_{A1}$–$M_{A5}$.

Such architecture includes a pipeline having the crossbar switches $5004_1$–$5004_4$, the logic sections $5010_1$–$5010_8$ and, the memory array regions $R_1$–$R_4$.

Each one of the memory regions $R_1$–$R_4$ is here comprised of SDRAM memory chips, as noted above. Each one of these regions $R_1$–$R_4$ is coupled to the four crossbar switches $5004_1$–$5004_4$ through a pair of memory region controller, herein referred to as logic sections, here logic sections $5010_1$, $5010_2$; ... $5010_7$, $5010_8$, respectively. Each logic section $5010_1$–$5010_8$ is dual ported, (i.e., Port_A, (A) and Port_B, (B)) with each port being coupled to one of the crossbar switches. The two logic sections $5010_1$, $5010_2$; ... $5010_7$, $5010_8$ (i.e., region controllers) associated with one of the memory regions $R_1$–$R_4$, respectively, share control of the SDRAM in such memory region. More particularly, and as will be described in more detail below, each pair of logic section, such as for example pair $5010_1$ and $5010_2$, share a common DATA port of memory array region $R_1$. However, each one of the logic sections $5010_1$ and $5010_2$ is coupled to a different control port $P_A$ and $P_B$, respectively, of memory array region $R_1$, as indicated.

More particularly, each one of the crossbar switches $5004_1$–$5004_4$ has, here, four lower ports $5008_1$–$5008_4$ and four upper ports $5006_1$–$5006_4$. Each one of the four upper ports $5006_1$–$5006_4$, is, as noted above, coupled to a corresponding one of the four sets $S_1$–$S_4$, respectively, of four of the S/P converters. As noted above, the cache memory board $220_1$ also includes eight logic sections coupled $5010_1$–$5010_8$ (to be described in detail in connection with FIGS. 13A, 13B, 13C, 13D and 13E) as well as the four memory array regions $R_1$–$R_4$. An exemplary one of the memory array regions $R_1$–$R_4$ is described in connection with FIG. 6 of U.S. Pat. No. 5,943,287. As described in such U.S. Patent, each one of the memory array regions includes a pair of redundant control ports $P_A$, $P_B$ and a data/chip select port (here designated as DATA). As described in such U.S. Patent, data may be written into, or read from, one of the memory array regions by control signals fed to either port $P_A$ or to port $P_B$. In either case, the data fed to, or read from, the memory array region is on the common DATA port.

An exemplary one of the logic sections $5010_1$–$5010_8$ will be discussed below in detail in connection with FIGS. 13A–15E and an exemplary one of the crossbar switches $5004_1$–$5004_4$ in the logic networks $221_{1B}$–$221_{2A}$ will be discussed below in detail in connection with FIGS. 10–12D. Suffice it to say here, however, each one of the memory array regions $R_1$–$R_4$ is coupled to a pair of the logic sections $5010_1$, $5010_2$; $5010_3$, $5010_4$; $5010_5$, $5010_6$; $5010_7$, $5010_8$, respectively, as shown. More particularly, each one of the logic sections $5010_1$, $5010_2$; $5010_3$, $5010_4$ $5010_5$, $5010_6$; $5010_7$, $5010_8$ includes: a pair of upper ports, Port_A (A), Port_B (B); a control port, C; and a data port, D, as indicated. The control port C of one each one of the logic sections $5010_1$, $5010_3$, $5010_5$, $5010_7$, is coupled to port $P_A$ of a corresponding one of the four memory array regions $R_1$–$R_4$. In like manner, the control port C of one of each one of the logic sections $5010_2$, $5010_4$, $5010_6$, $5010_8$ is coupled to port $P_B$ of a corresponding one of the four memory array regions $R_1$–$R_4$, respectively as shown. Thus, each one of the memory array regions $R_1$–$R_4$ is coupled to a redundant pair of the logic sections $5010_1$, $5010_2$; $5010_3$, $5010_4$; $5010_5$, $5010_6$; $5010_7$, $5010_8$, respectively. The data ports D of logic section pairs $5010_1$, $5010_2$; $5010_3$, $5010_4$; $5010_5$, $5010_6$; $5010_7$, $5010_8$, respectively, are coupled together and to the DATA port of a corresponding one of the memory regions, $R_1$–$R_4$, respectively, as indicated.

It should be noted that each one of the crossbar switches $5004_1$–$5004_4$ is adapted to couple the upper ports $5006_1$–$5006_4$ thereof to the lower ports $5008_1$–$5008_4$ thereof selectively in accordance with a portion (i.e., a "tag" portion) of the information fed to the crossbar switch. In response to such "tag" portion, a transfer of information between a selected one of the memory array regions $R_1$–$R_4$ and a selected the of the directors coupled to the crossbar switch is enabled. The memory control portion (e.g., read, write, row address select, column address select, etc.) of the information passes between either port A or port B of a logic sections $5010_1$, $5010_3$, $5010_5$, $5010_7$, and port $P_A$ of the memory array region $R_1$–$R_4$ coupled to such logic section and the data (DATA) portion of the information passes to the DATA port of such coupled memory array region $R_1$–$R_4$, respectively. Likewise, the control portion of the information passes between port A or port B of a logic sections $5010_2$, $5010_4$, $5010_6$, $5010_8$, and port $P_B$ of the memory array region $R_1$–$R_4$ coupled to such logic section and the data portion of the information passes to the DATA port of such coupled memory array region $R_1$–$R_4$, respectively.

Thus, each one of the logic sections $5010_1$–$5010_8$ includes a pair of redundant upper ports, A and B. The lower ports $5008_1$–$5008_4$ of crossbar switch $5004_1$ are coupled to the A port of logic sections $5010_1$, $5010_3$, $5010_5$, and $5010_7$, respectively, while the lower ports $5008_1$–$5008_4$ of crossbar switch $5004_2$ are coupled to the B port of logic sections $5010_1$, $5010_3$, $5010_5$, and $5010_7$, respectively. The lower ports $5008_1$–$5008_4$ of crossbar switch $5004_3$ are coupled to the A port of logic sections $5010_1$, $5010_3$, $5010_5$, and $5010_7$, respectively, while the lower ports $5008_1$–$5008_4$ of crossbar switch $5004_4$ are coupled to the B port of logic sections $5010_2$, $5010_4$, $5010_6$, and $5010_8$, respectively.

As noted above in connection with FIG. 2, each one of the host computer processors $121_1$–$121_{32}$ is coupled to here a pair (but not limited to a pair) of the front-end directors $180_1$–$180_{32}$, to provide redundancy in the event of a failure in one of the front end-directors $181_1$–$181_{32}$ coupled thereto. Likewise, the bank of disk drives 140 has a plurality of, here 32, disk drives $141_1$–$141_{32}$, each disk drive $141_1$–$141_{32}$ is coupled to here a pair (but not limited to a pair) of the back-end directors $200_1$–$200_{32}$, to provide redundancy in the event of a failure in one of the back-end directors $200_1$–$200_{32}$ coupled thereto. Thus, the system has redundant front-end processor pairs $121_1$, $121_2$ through $121_{31}$, $121_{32}$ and redundant back-end processor pairs $141_1$, $141_2$ through $141_{31}$, $141_{32}$. Considering the exemplary logic network $220_1$ shown in FIGS. 9A, 9B and 9C, as noted above in connection with FIG. 8B, redundant front-end processor pairs $121_1$ and $121_2$, are able to be coupled to ports $M_{A1}$ and $M_{B1}$ of a cache memory board. Thus, the ports $M_{A1}$ and $M_{B1}$ may be considered as redundant memory board ports. In like manner, the following may be considered as redundant memory ports because the are able to be coupled to a pair of redundant processors: $M_{A2}$ and $M_{B2}$; $M_{A3}$ and $M_{B3}$; $M_{A4}$ and $M_{B4}$; $M_{A5}$ and $M_{B5}$; $M_{A6}$ and $M_{B6}$; $M_{A7}$ and $M_{B7}$; and, $M_{A8}$ and $M_{B8}$. It is noted that ports $M_{A1}$ and $M_{B1}$; $M_{A2}$ and $M_{B2}$; $M_{A3}$ and $M_{B3}$; $M_{A4}$ and $M_{B4}$ are coupled to the front-end processors through front-end directors and ports $M_{A5}$ and $M_{B5}$; $M_{A6}$ and $M_{B6}$; $M_{A7}$ and $M_{B7}$; $M_{A8}$ and $M_{B8}$ are coupled to the disk drives through back-end directors.

Referring again to FIGS. 9A, 9B and 9C, from the above it should be noted then that logic networks $221_{1B}$ and $221_{1A}$ may be considered as a pair of redundant logic networks (i.e., pair 1) because they are able to be coupled to redundant pairs of processors, here front-end processors. Likewise, logic networks $221_{2B}$ and $221_{2A}$ may be considered as a pair of redundant logic networks (i.e., pair 2) because they are able to be coupled to redundant pairs of disk drives. Further, logic network $221_{1B}$ of pair 1 is coupled to upper port A of logic sections $5010_1$, $5010_3$, $5010_5$, and $5010_7$ while logic network $221_{1A}$ of pair 1 is coupled to port A of the logic sections $5010_2$, $5010_4$, $5010_6$, and $5010_8$. Logic network $221_{2B}$ of pair 2 is coupled to port B of logic sections $5010_1$, $5010_3$, $5010_5$, and $5010_7$ while logic network $221_{2A}$ of pair 2 is coupled to port B of the logic sections $5010_2$, $5010_4$, $5010_6$, and $5010_8$.

Thus, from the above it is noted that ports $M_{B1}$–$M_{B4}$, which are coupled to one of a pair of redundant processors, are adapted to be coupled to one of the ports in a pair of redundant control ports, here port $P_A$ of the four memory array regions $R_1$–$R_4$ while ports $M_{A1}$–$M_{A4}$, of the other one of the pair of redundant processors are adapted to be coupled to the other one of the ports of the redundant control ports, here port $P_B$ of the four memory array regions $R_1$–$R_4$. Likewise, ports $M_{B5}$–$M_{B8}$, which are coupled to one of a pair of redundant processors, are adapted to be coupled to one of the ports in a pair of redundant control ports, here port $P_A$ of the four memory array regions $R_1$–$R_4$ while ports $M_{A5}$–$M_{A8}$, of the other one of the pair of redundant processors are adapted to be coupled to the other one of the ports of the redundant control ports, here port $P_B$ of the four memory array regions $R_1$–$R_4$.

Figure 9C:
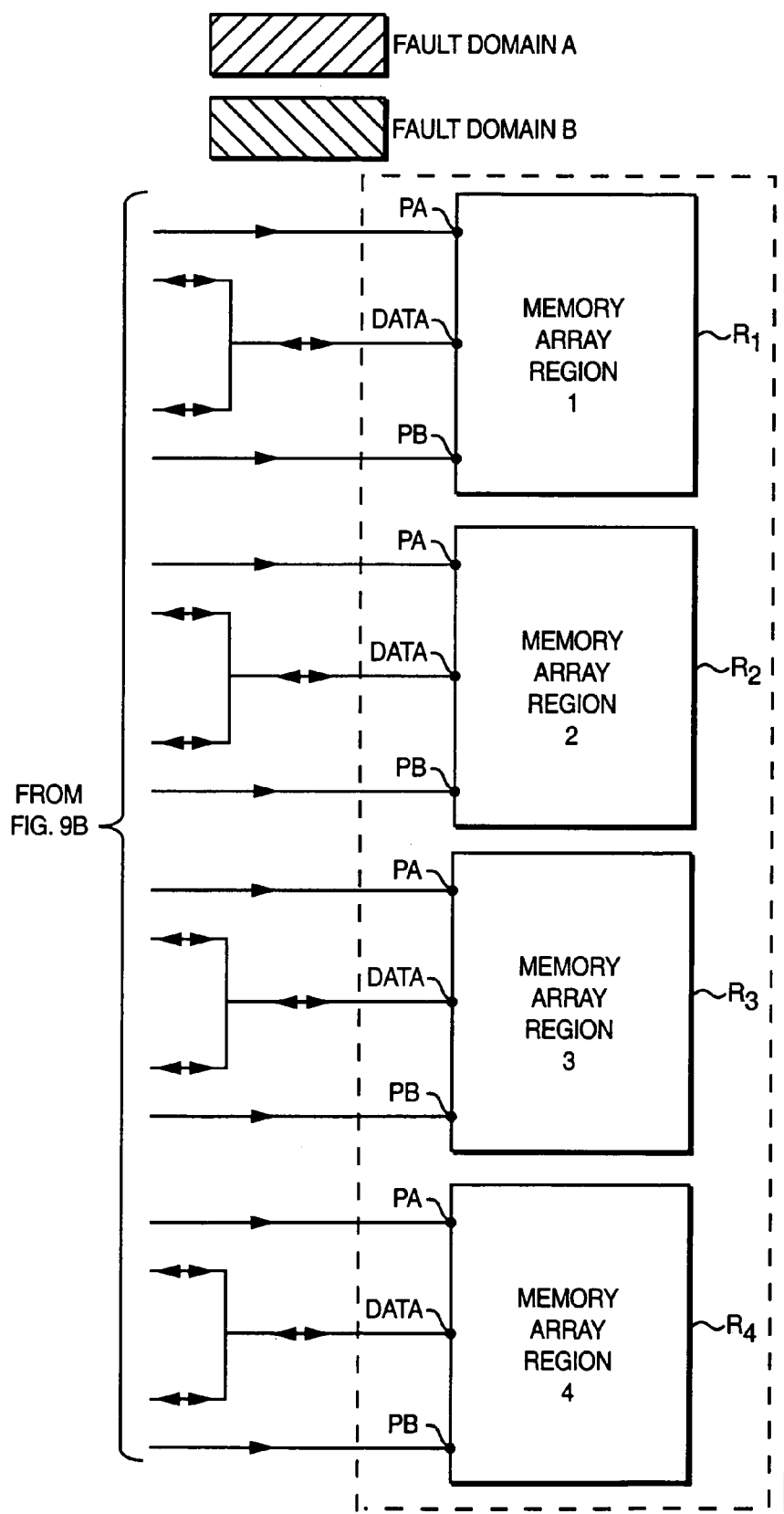

Thus, the memory board $220_1$ (FIGS. 9A, 9B and 9C) is arranged with a pair of independent fault domains: One fault domain, Fault Domain A, is associated with logic networks $221_{1B}$ and $221_{2B}$, logic sections $5010_1$, $5010_3$ $5010_5$, $5010_7$, and ports $P_A$ of the memory array regions $R_1$–$R_4$ and, the other fault domain, Fault Domain B, is associated with logic networks $221_{1A}$ and $221_{2A}$, logic sections $5010_2$, $5010_4$, $5010_6$, $5010_8$ and port $P_B$ of the memory array regions $R_1$–$R_4$. The logic in each one of the fault domains is operated by a corresponding one of a pair of independent clocks, Clock 1 and Clock 2 (FIGS. 9A, 9B and 9C). More generally, a fault domain is defined as a collection of devices which share one or more common points of failure. Here, Fault Domain A includes: logic networks $221_{1B}$, $221_{2B}$ (i.e., the S/Ps and crossbar switches $5004_1$–$5004_2$ therein) and logic sections $5010_1$, $5010_3$, $5010_5$, $5010_7$, such devices being indicated by lines which slope from lower left to upper right (i.e., ///). The other fault domain, Fault Domain B, includes: logic networks $221_{1A}$, $221_{AB}$ (i.e., the S/Ps and crossbar switches $5004_3$–$5004_4$ therein) and logic sections $5010_2$, $5010_4$, $5010_6$, $5010_8$, such devices being indicated by lines which slope from upper left to lower right (i.e., \\\\). It is noted from FIGS. 9A, 9B and 9C that port $P_A$ of each one of the memory array regions $R_1$–$R_4$ is coupled to Fault Domain A while port $P_B$ is coupled to fault domain B. Thus, each one of the fault domains includes the devices used to couple one of a pair of redundant processors to one of a pair of redundant control ports $P_A$, $P_B$ of the memory array regions $R_1$–$R_4$ and the other fault domain includes the devices used to couple the other one of the pair of redundant processors to the other one of a pair of redundant control ports $P_A$, $P_B$ of the memory array regions $R_1$–$R_4$. As noted above each fault domain operates with a clock (i.e., clock 1, clock 2) separate from and independent of the clock used to operate the other fault domain.

Figure 10:
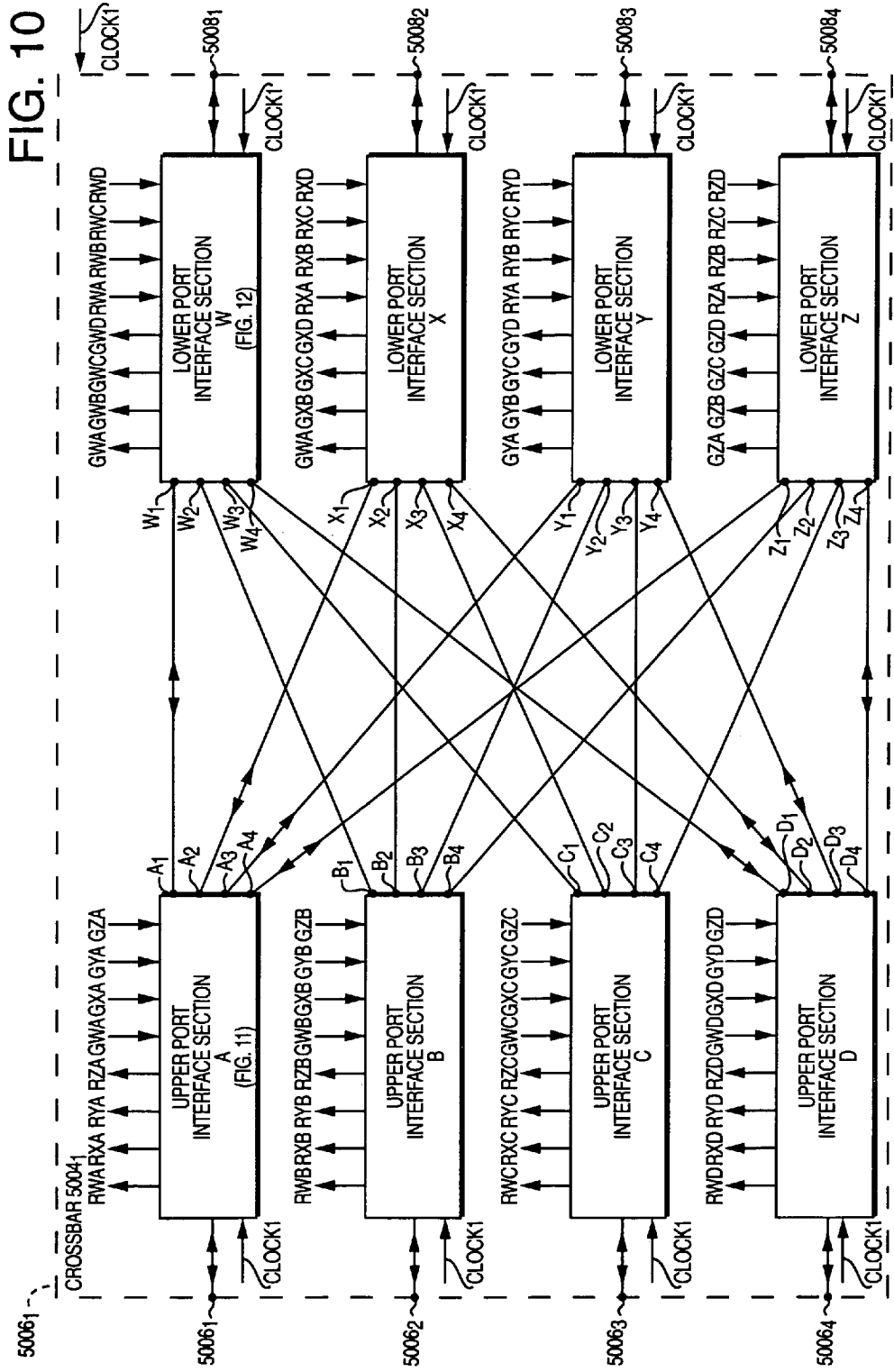
FIG. 10 is a block diagram of a crossbar switch used in the memory board of FIGS. 9A, 9B and 9C.
Figure 11A:
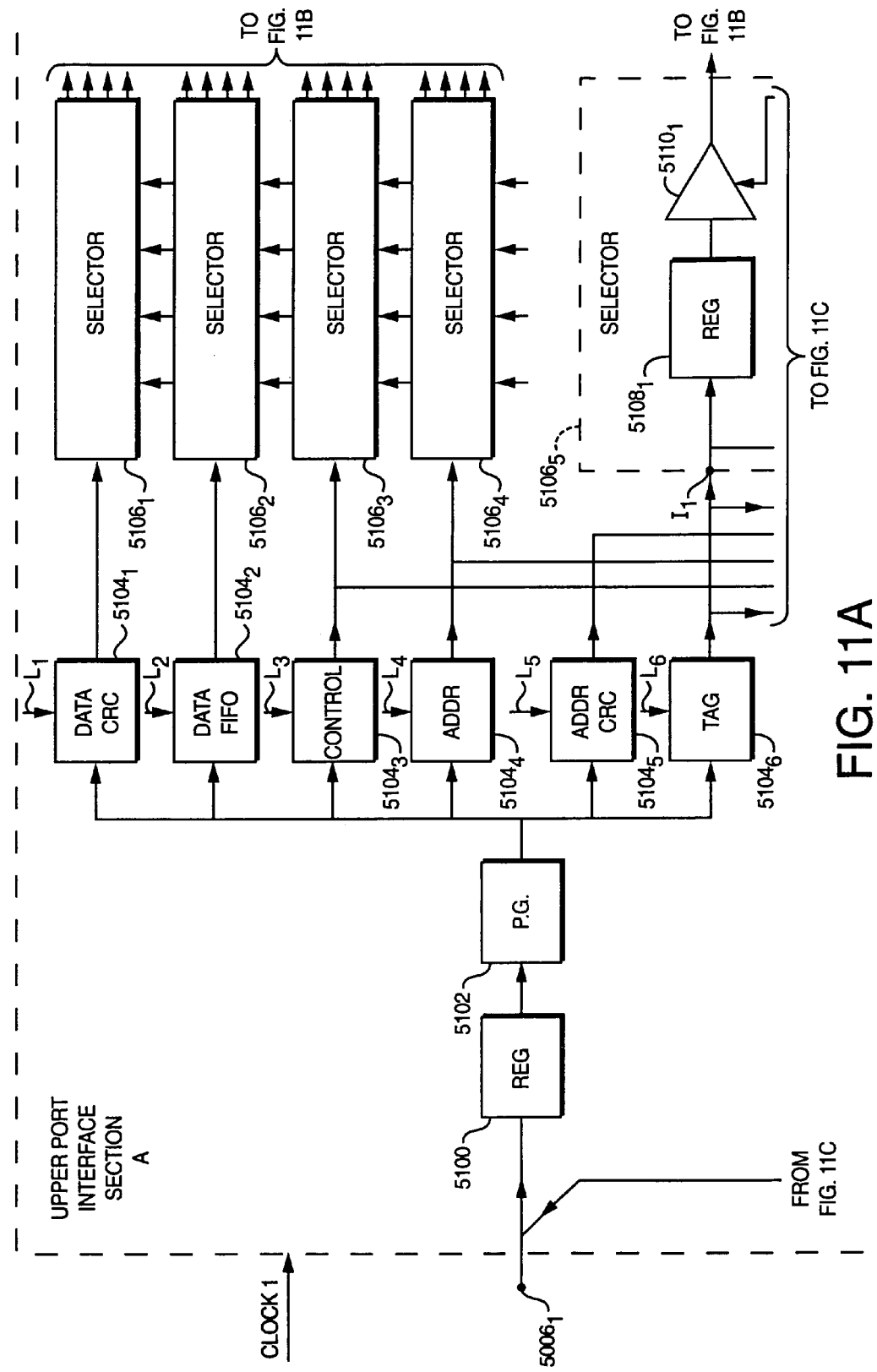
Figure 11C:
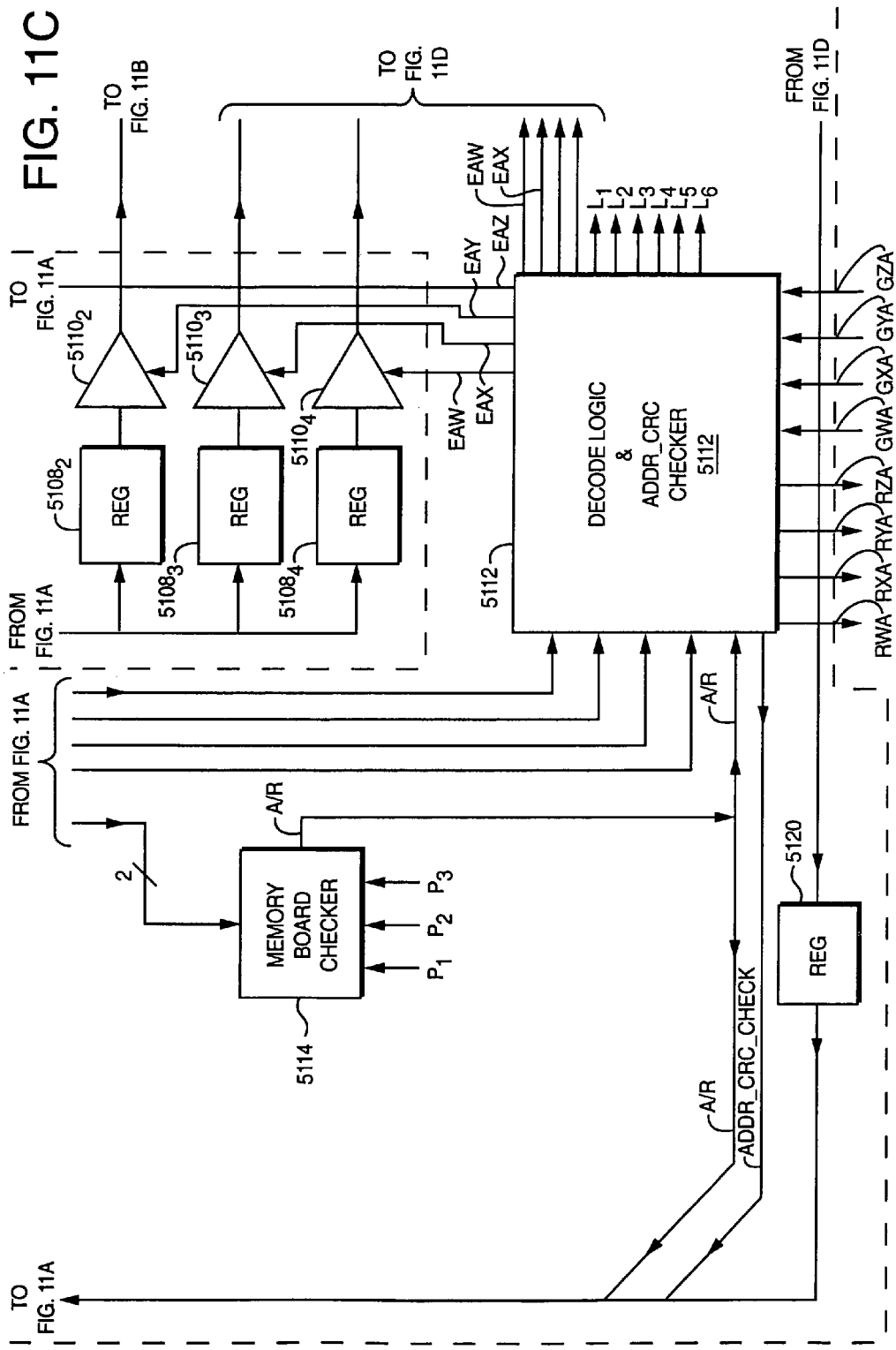
Figure 11D:
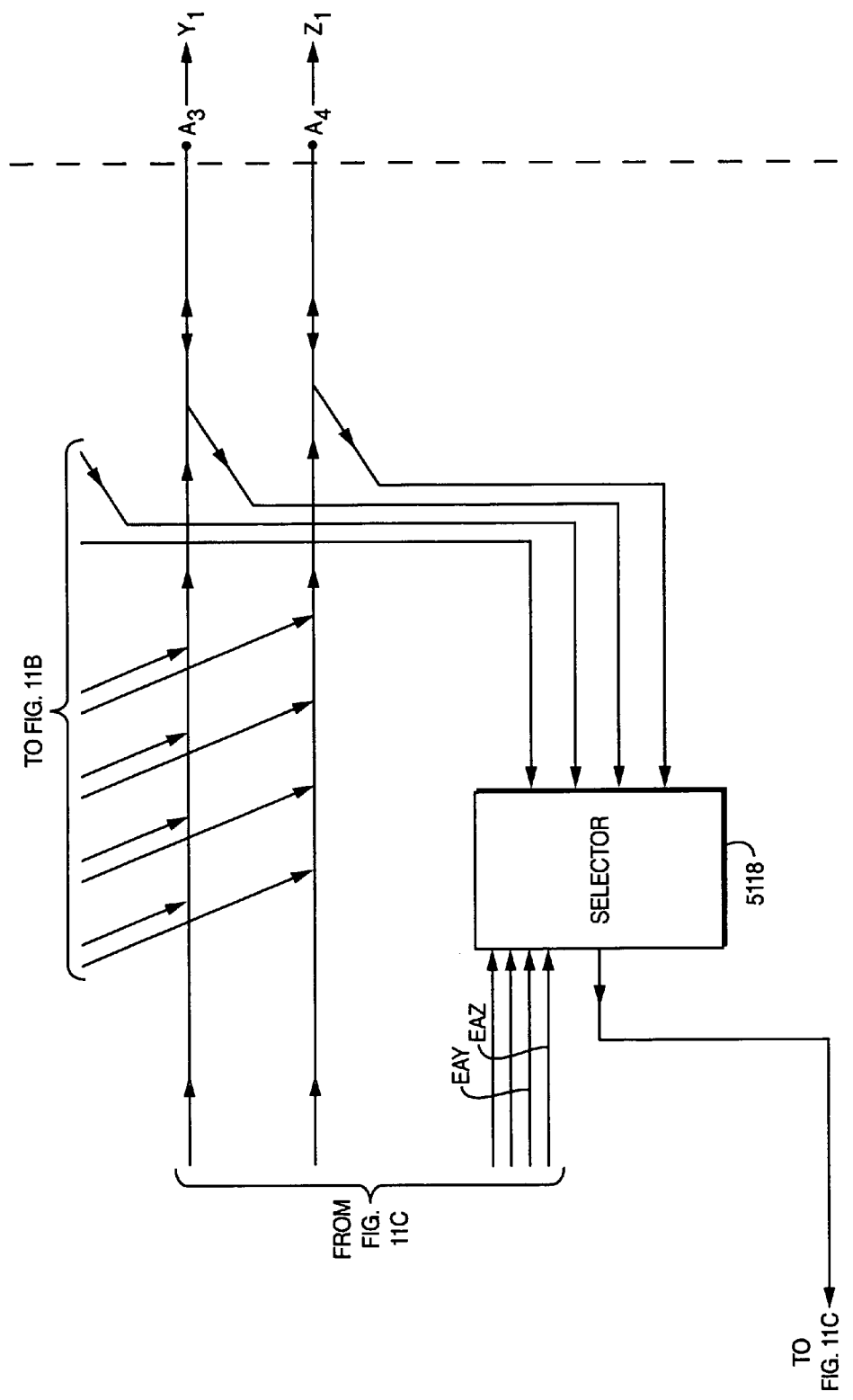
Figure 12A:
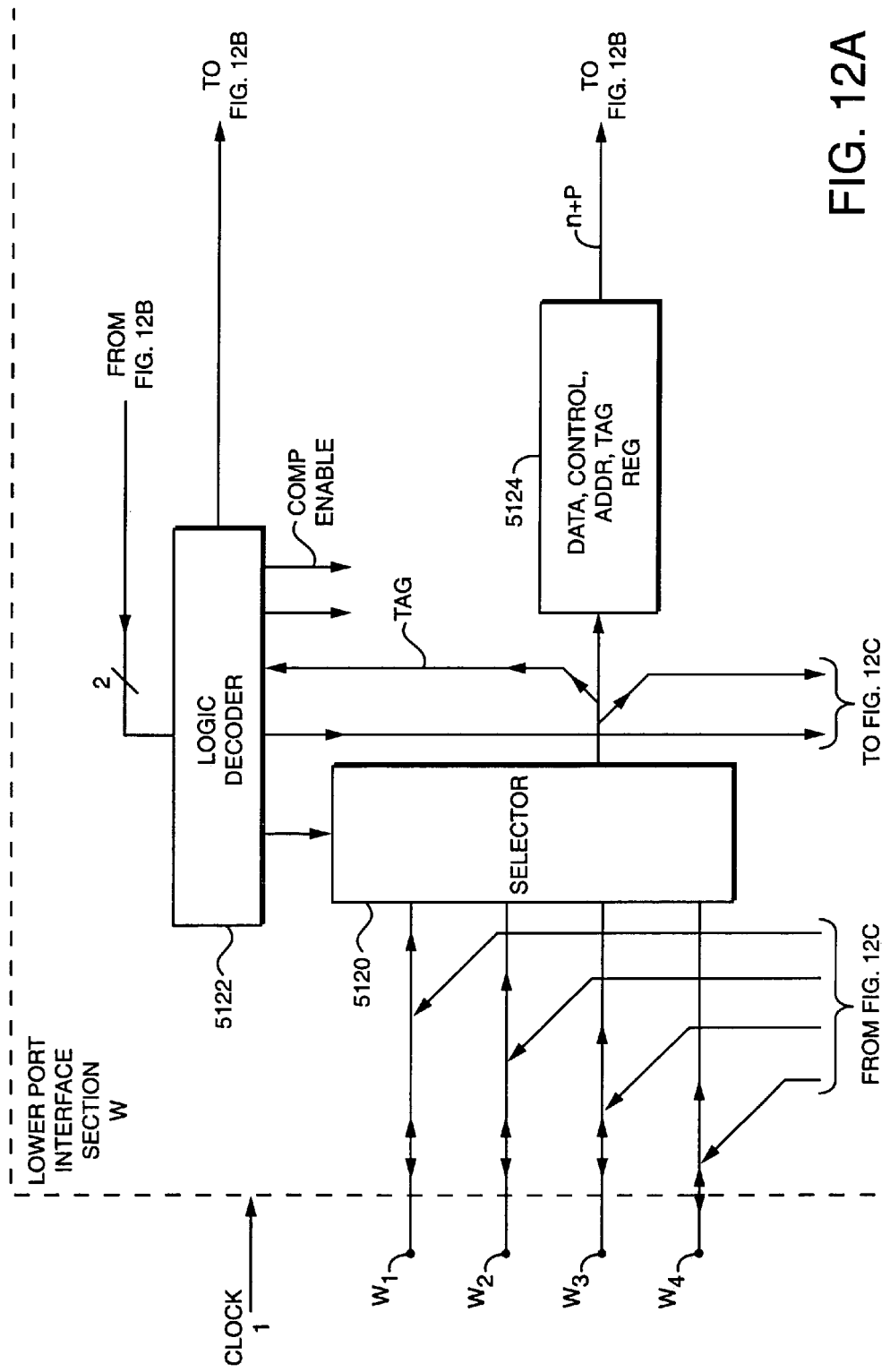
Figure 12C:
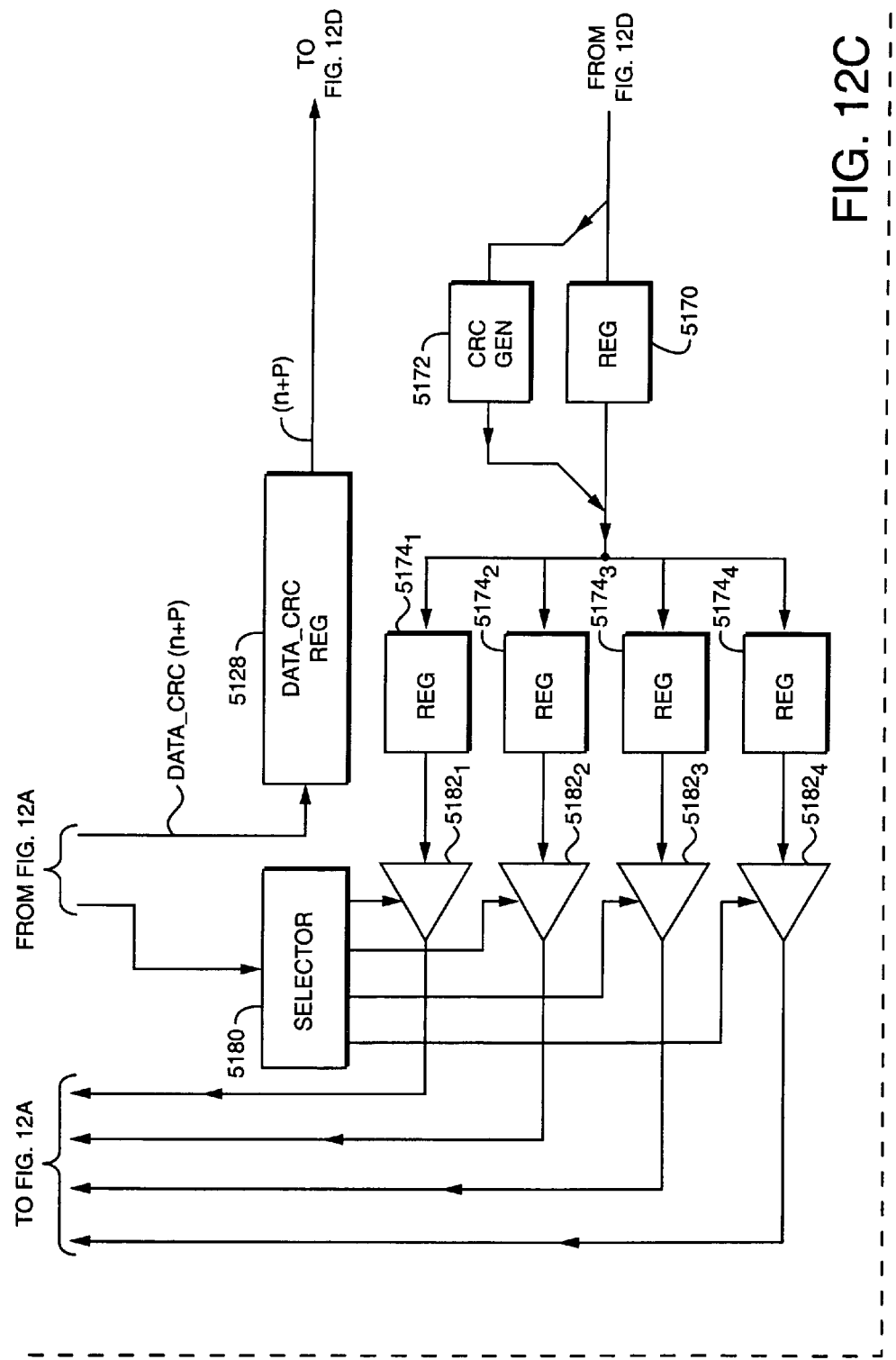
Figure 13A:
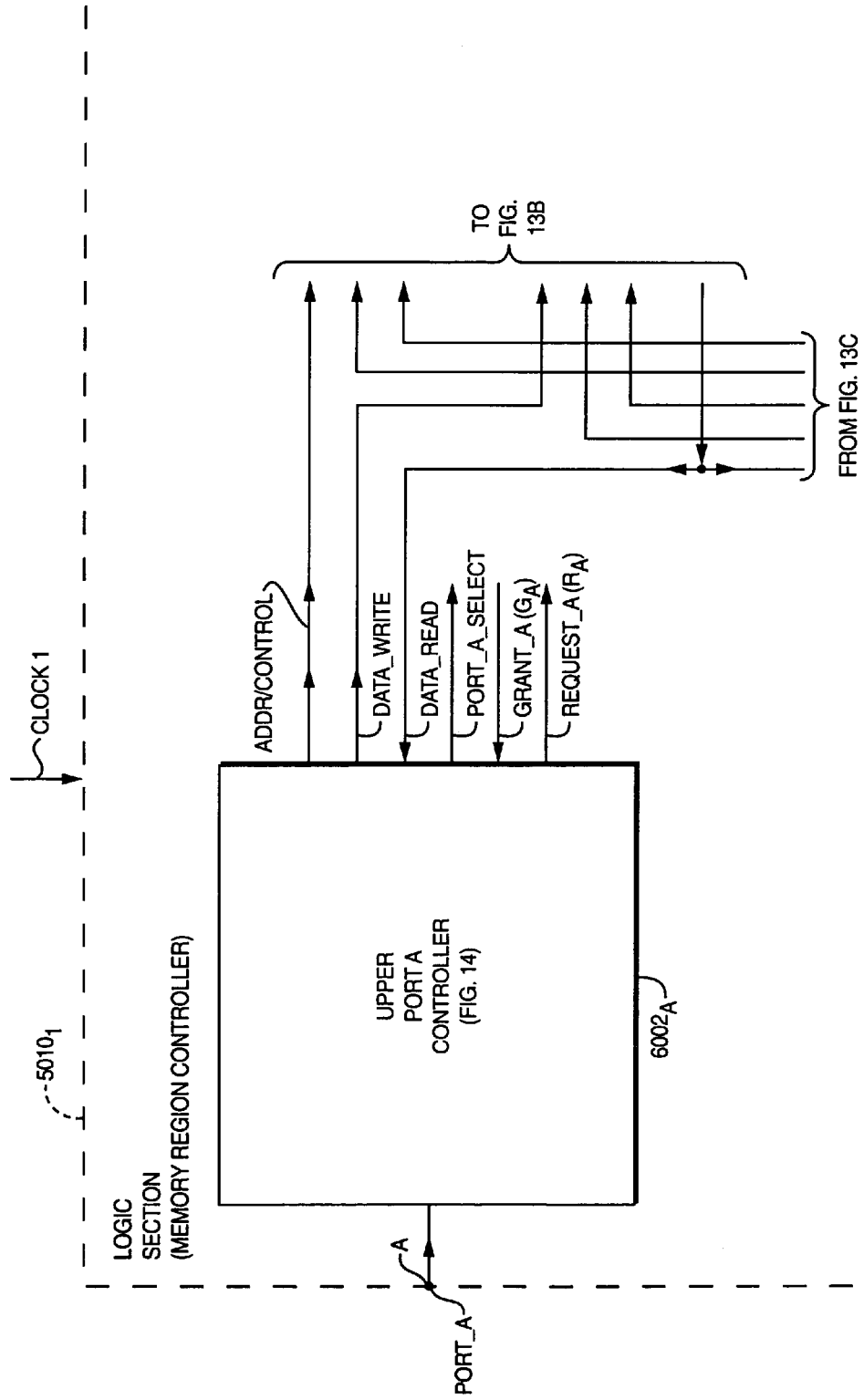
Figure 13B:
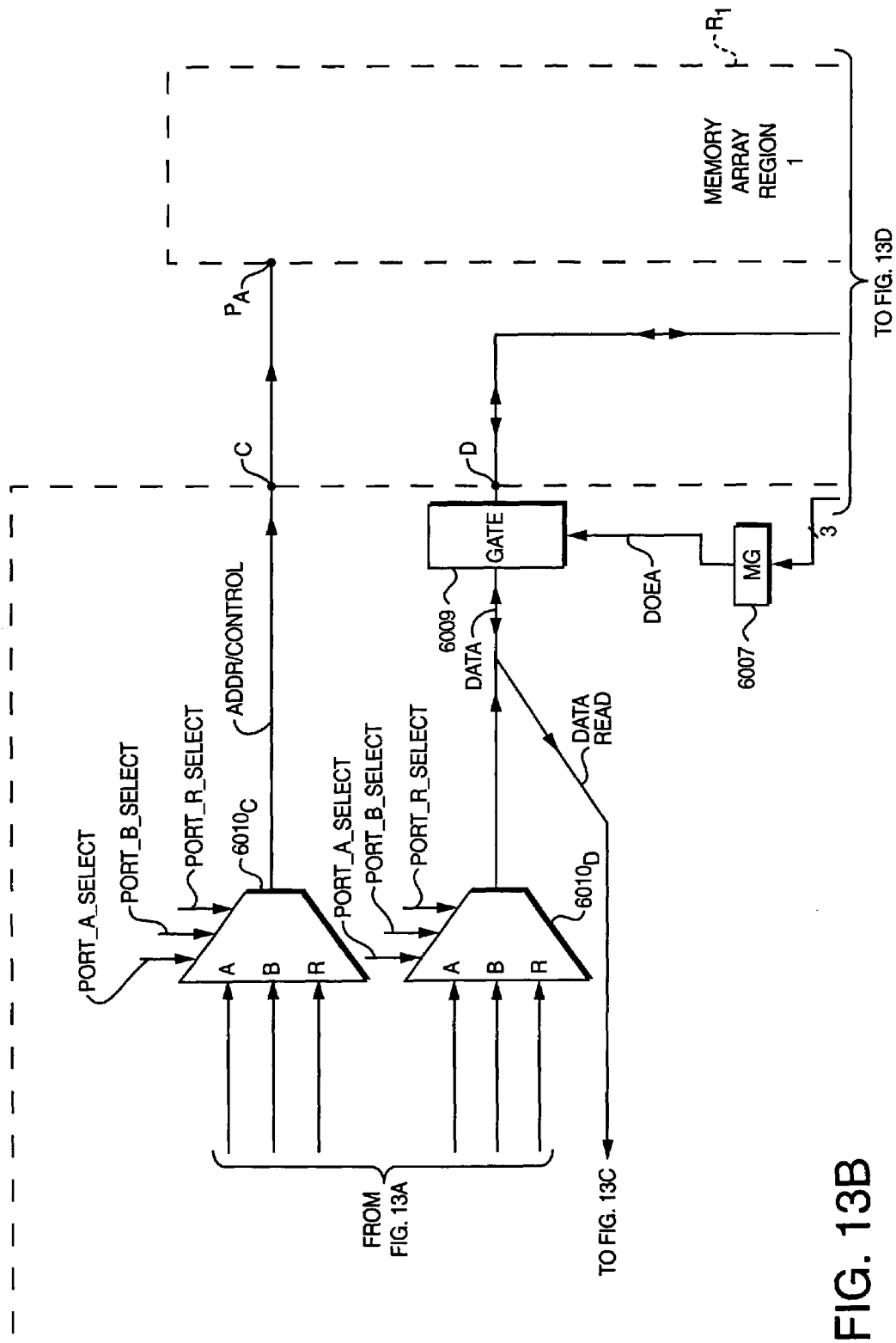
Figure 13D:
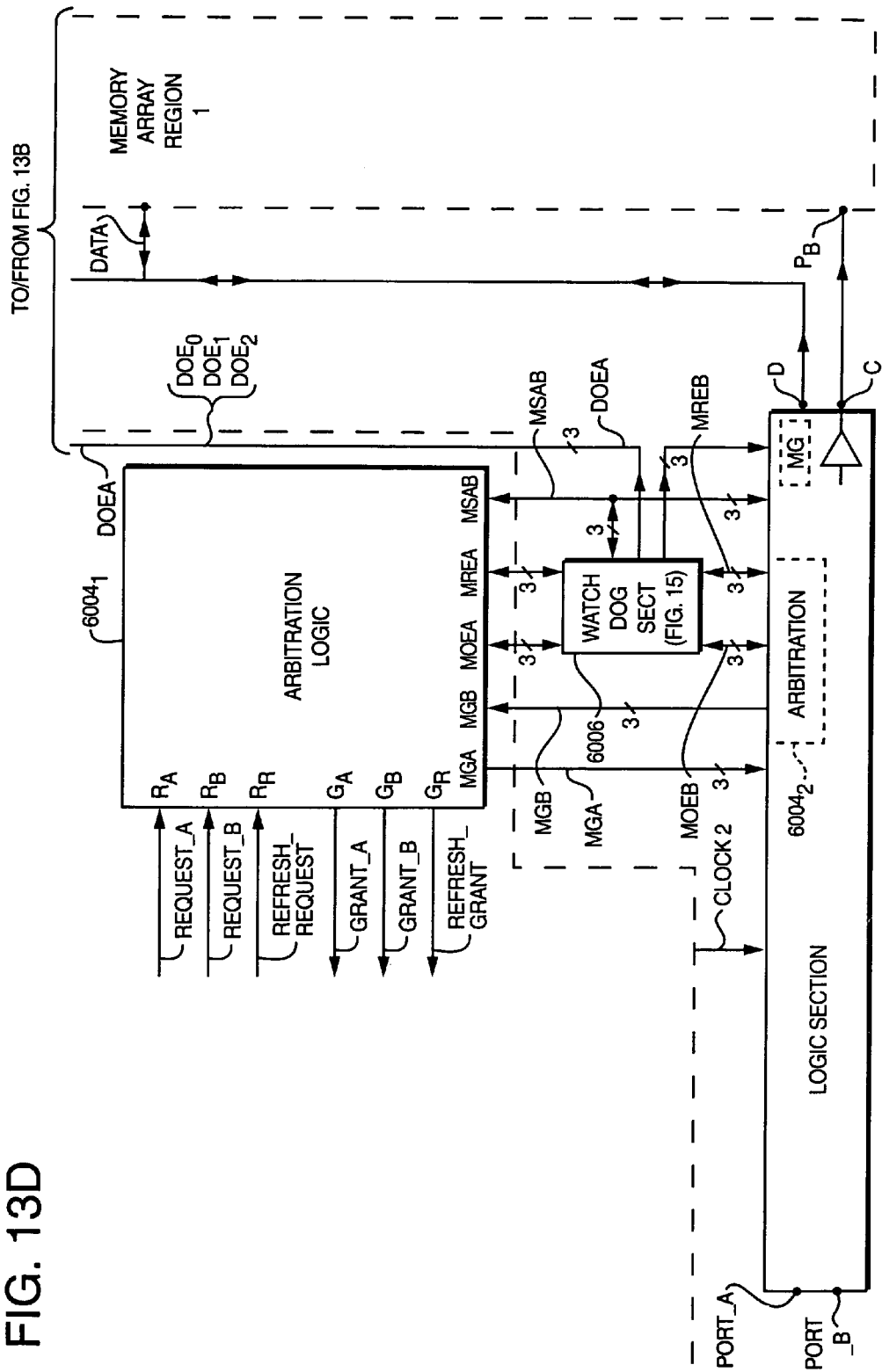
Figure 13E:
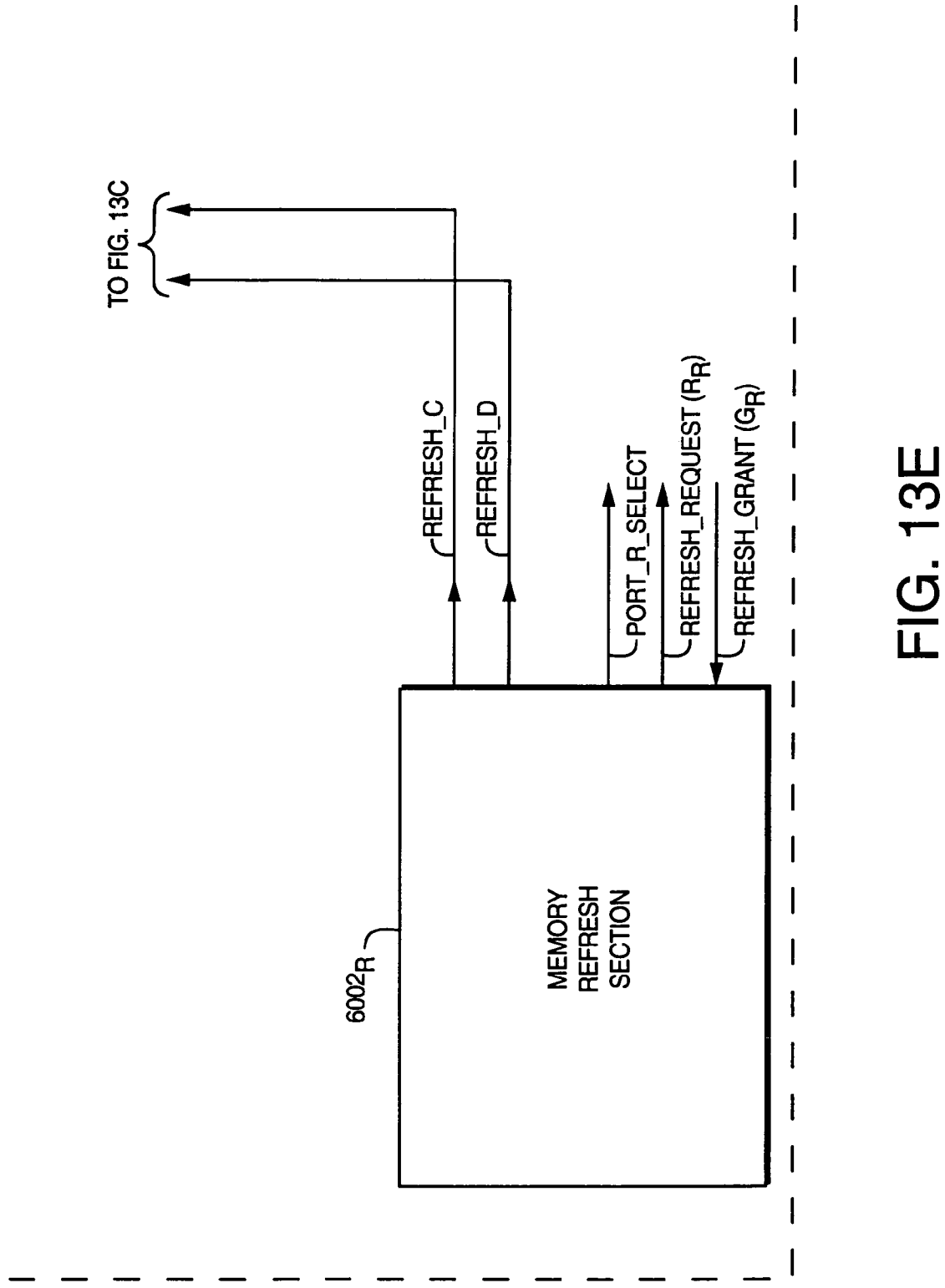
Figure 14A:
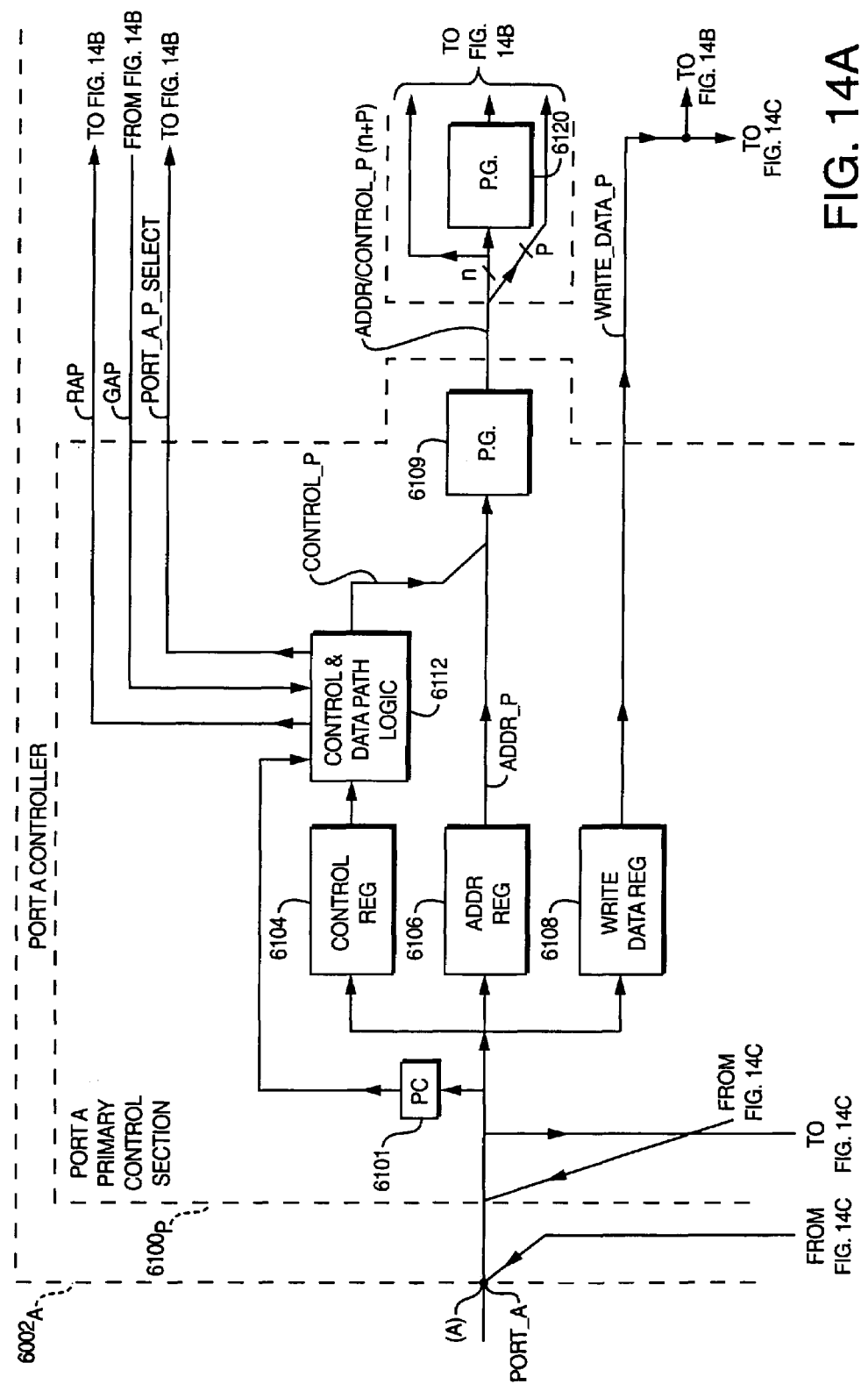
Figure 14B:
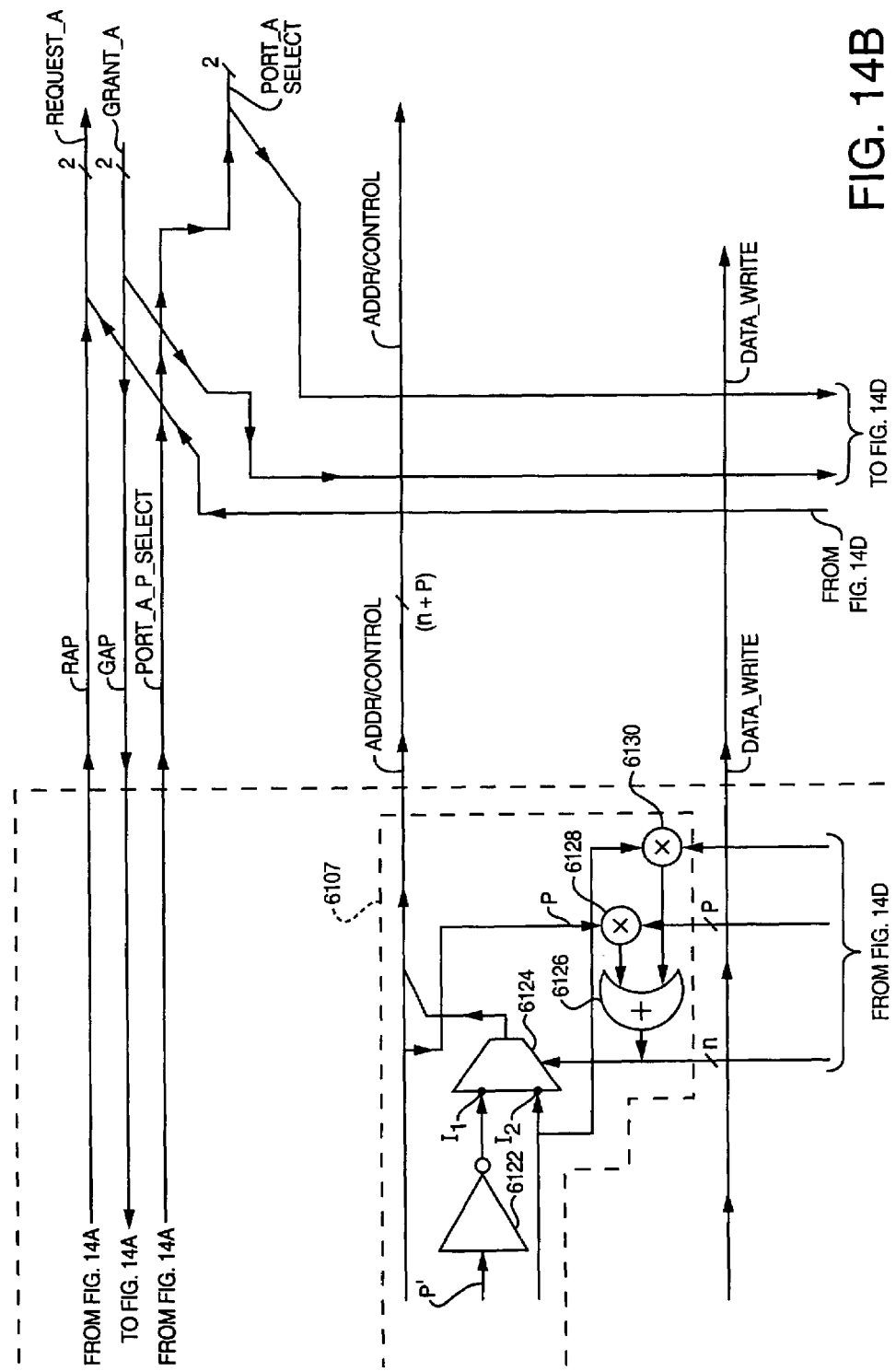
Figure 14D:
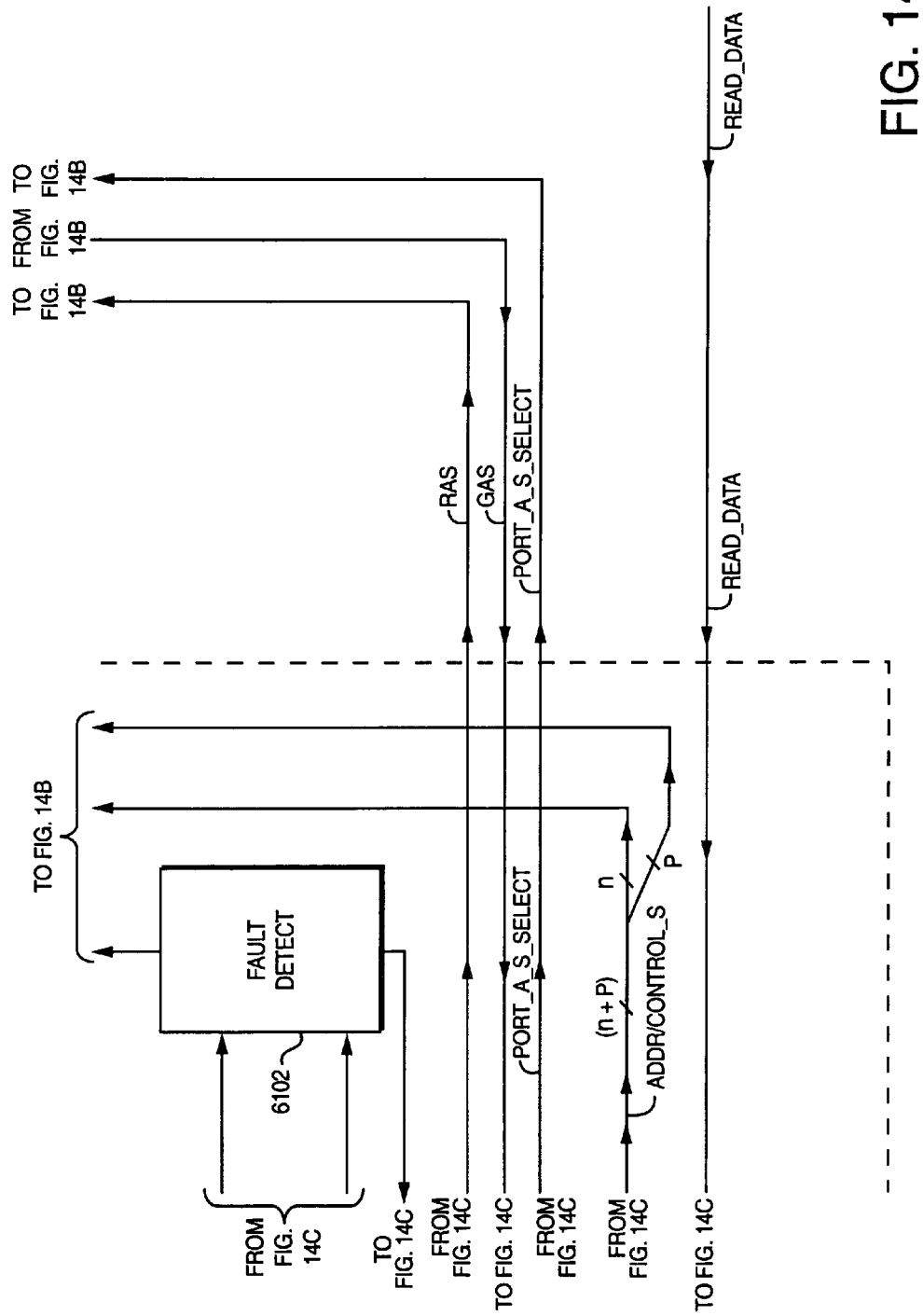
Figure 15A:
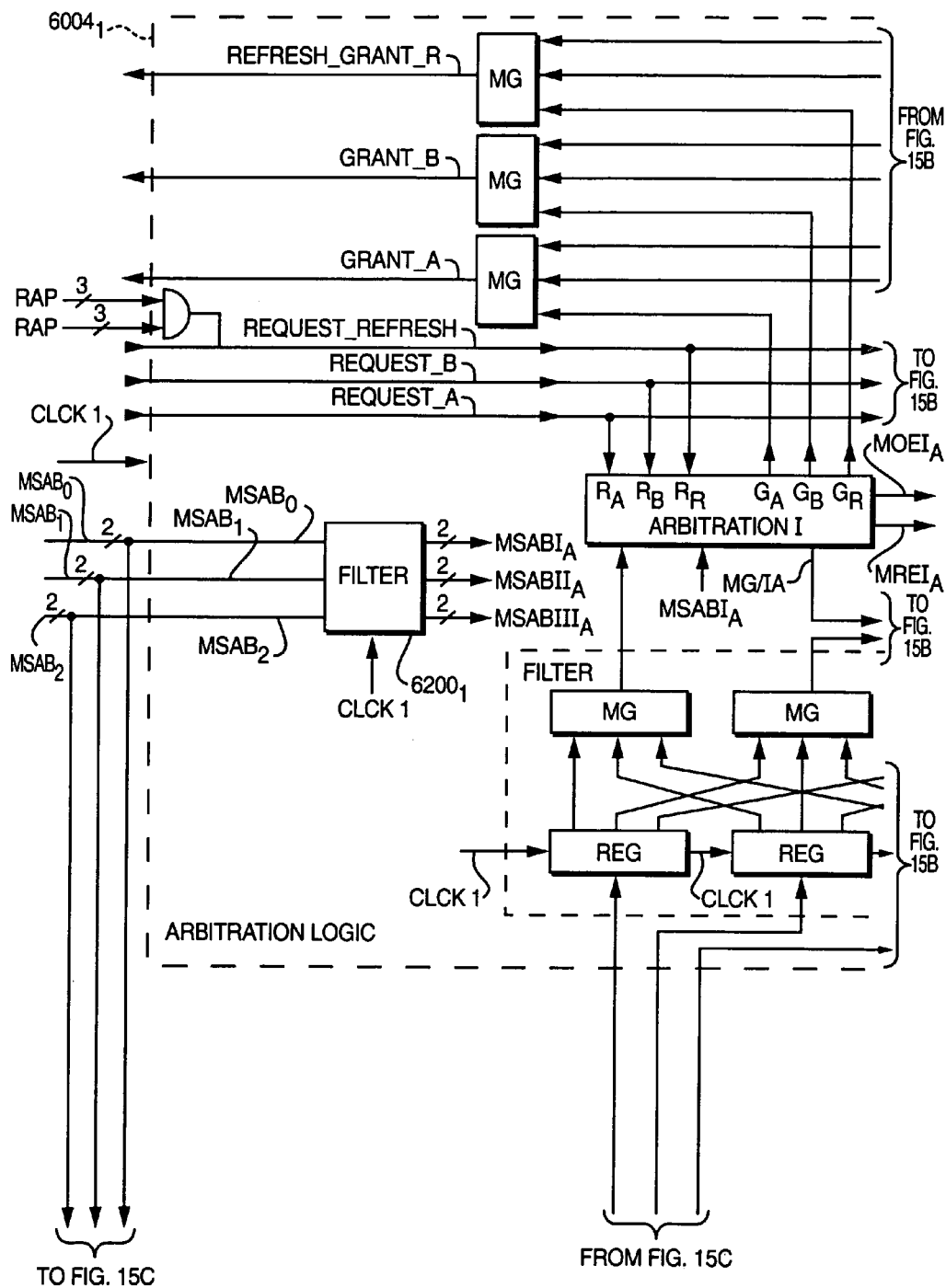
FIGS. 15A, 15B, 15C, 15D and 15E are a block diagram of a pair of arbitration logics used in the pair of logic sections of FIGS. 13A, 13B, 13C, 13D and 13E and of a watchdog section used for such pair of logic sections.
Figure 15B:
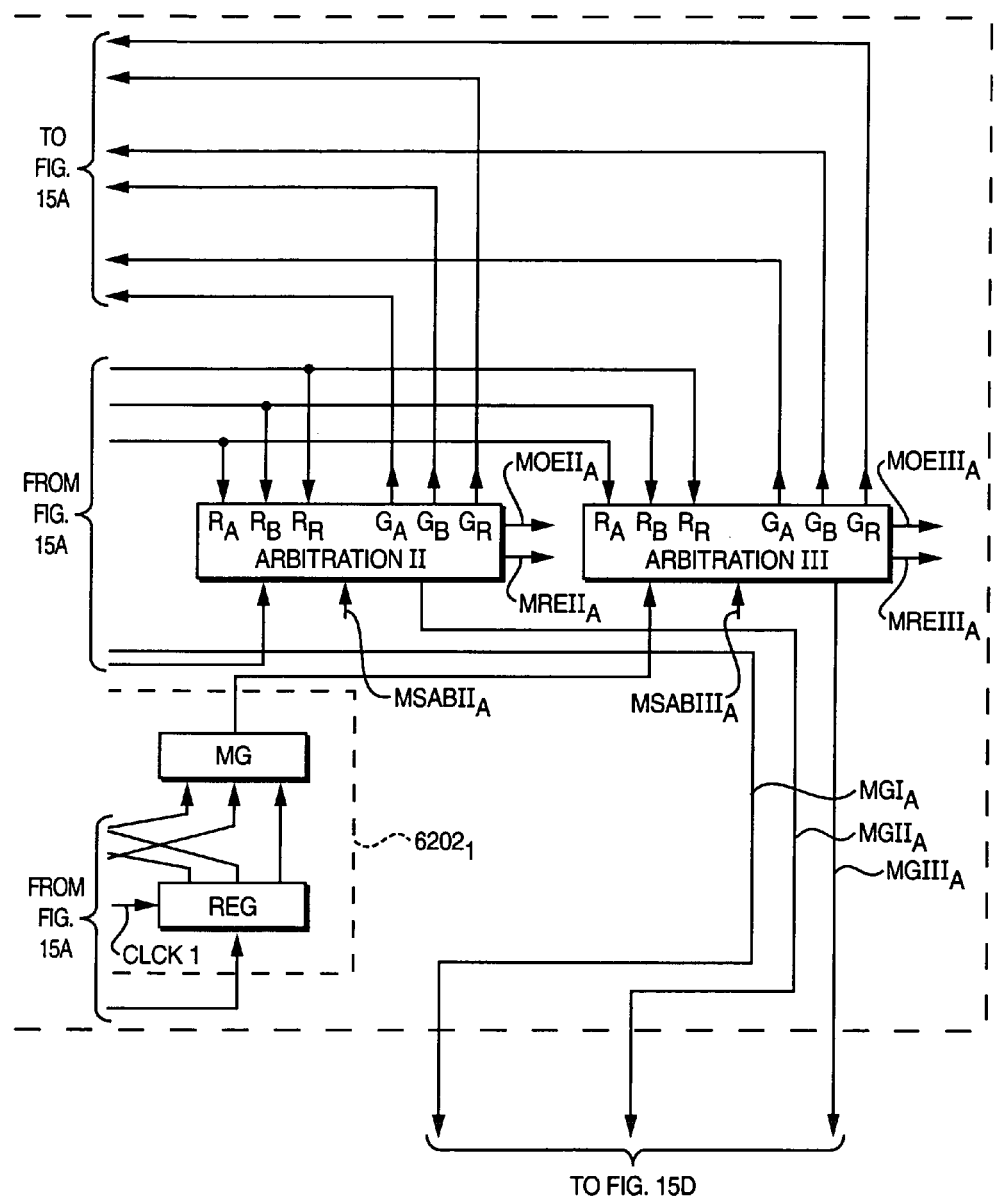
Figure 15C:
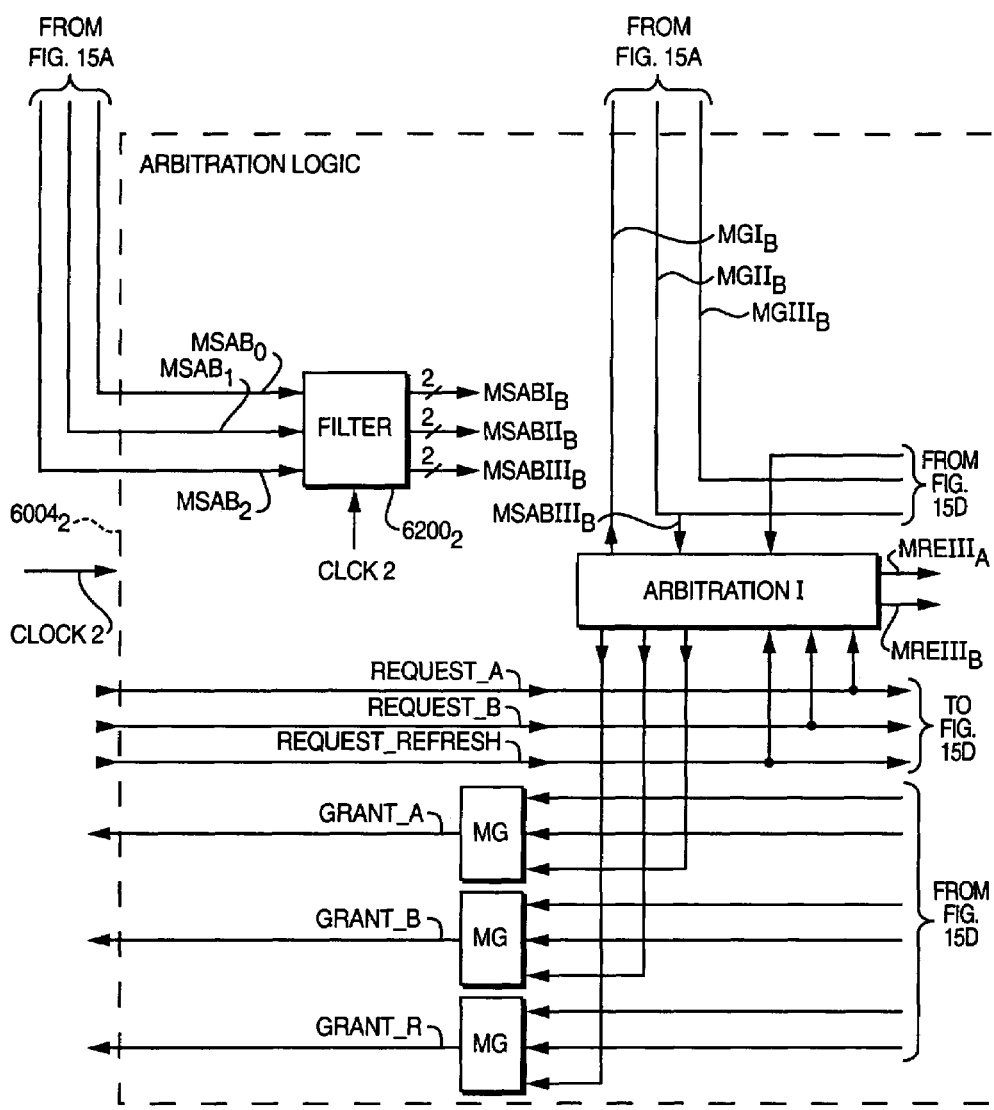
Figure 15D:
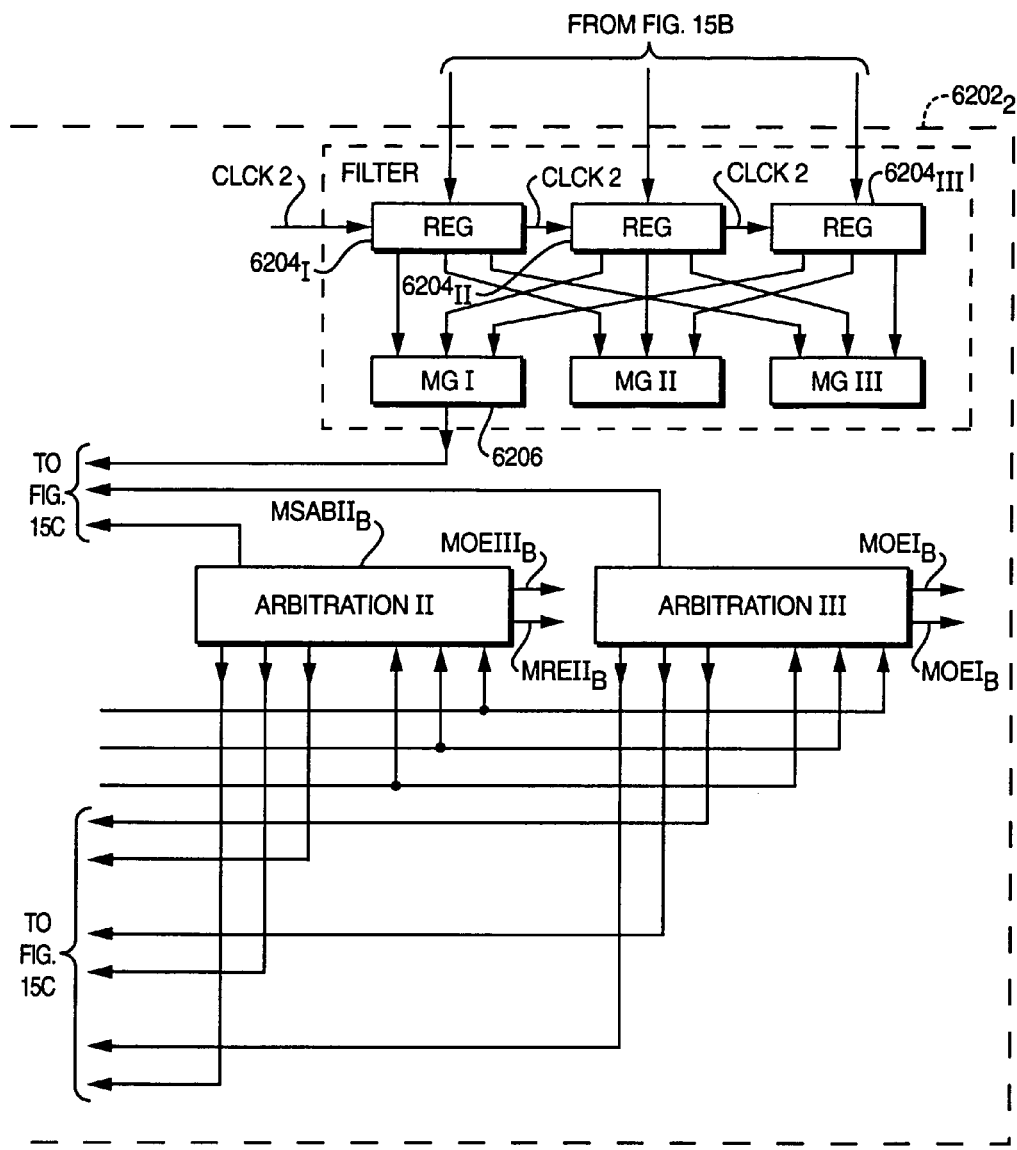
Figure 15E:
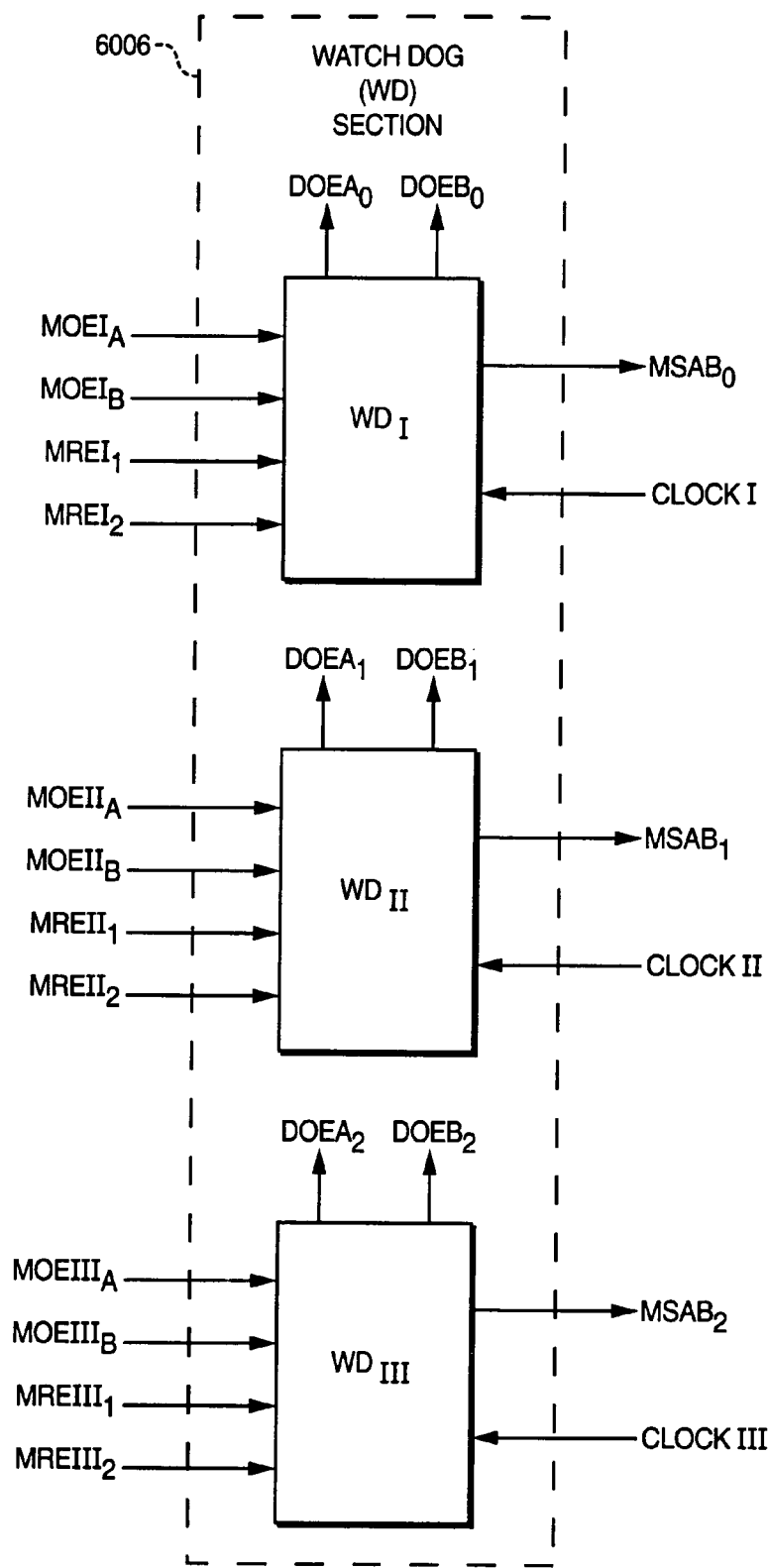

Referring now to FIG. 10, an exemplary one of the crossbar switches $5004_1$–$5004_4$, here crossbar switch $5004_1$ is shown in detail to include four upper port interface sections A–D and lower port interface sections W–Z. The details of an exemplary one of the upper port interface sections A–D, here upper port interface section A, will be described in more detail in connection with FIGS. 11A, 11B, 11C and 11D and the details of an exemplary one of the lower port interface sections W–Z, here lower port interface section W, will be described in more detail in connection with FIGS. 12A, 12B, 12C and 12D. The function of the exemplary crossbar switch $5004_1$ is to mediate the information cycle at the request of an initiating one of the directors coupled to one of the upper $5006_1$–$5006_4$ and one logic section $5010_1$–$5010_8$ indicated by the "tag" portion of the information (FIG. 16).

More particularly, the crossbar switches request, negotiate, and then effect a transfer between the upper thereof $5006_1$–$5006_4$ and the lower ports $5008_1$–$5008_4$ thereof in a manner to be described below. Suffice it to say here, however, that the upper interface section A–D handle the protocol between the director requesting a information cycle and the memory board 2201 (FIG. 8). It also provides a control and data interface to the serial-to-parallel (S—P) converters (e.g., serializer-deserializer). These interface sections A–D are also responsible for generating parity across the address, control, DATA, and CRC received from the director. There are here two parity bits, one per cycle as described in co-pending patent application entitled "Fault Tolerant Parity Generation" filed May 20, 1999, Serial No. 99/315,437, and assigned to the same assignee as the present invention, the entire subject matter being incorporated herein by reference. As described in such patent application, the parity is generated such that one byte has odd parity and the other byte has even parity. The sense of these parity bits alternate on successive clocks.

The lower port interface sections W–Z provides address, control, DATA and routing to one of the four of the logic sections $5010_1$–$5010_8$(FIGS. 9A, 9B and 9C) in a manner to be described. Each one of the lower interface sections W–Z is adapted to couple a corresponding one of the four memory array regions $R_1$–$R_4$ (FIGS. 9A, 9B and 9C), respectively, via logic sections $5010_1$–$5010_8$. Each one of the four lower interface sections W–Z independently acts as an arbiter between the four upper interface sections A–D and the logic section $5010_1$–$5010_8$ coupled thereto. This allows for simultaneous transfers (i.e., information cycles) to multiple memory array regions $R_1$–$R_4$ from multiple upper interface sections A–D. The upper interface section A–D are single threaded, i.e., one information cycle must be complete before another information cycle is allowed to the same memory array regions $R_1$–$R_4$.

The lower interfaces W–Z deliver control, address and the "tag" field (to be described in more detail below) to the logic section $5010_1$–$5010_8$. The parity across these fields are generated in the upper interface sections A–D and then pass unmodified such that the memory array region can check for alternating parity sense. For write transfers, the lower interface sections W–Z also deliver the write data to the memory array region, checking for correct CRC across the data. If any error is detected, and if the control field indicates a "Wait-and-Validate" process to be described, the parity of the last double byte of data is corrupted (e.g., a fault is induced in the parity (p) thereof) such that the logic section $5010_1$–$5010_8$ coupled thereto detects the corrupted parity and inhibits execution of the information cycle. Otherwise, the alternating parity of the data is unmodified. For read transfers, the lower interface sections W–Z accept the data from the memory array regions $R_1$–$R_4$ via the logic sections $5010_1$–$5010_8$, check the alternating parity, and generates CRC to be returned to the director.

More particularly, assume for example that information at upper port $5006_4$ (FIGS. 9A, 9B and 9C) of crossbar switch $5004_4$ is to be transferred to memory array region $R_1$. Referring to FIG. 10 a negotiation, i.e., arbitration, must be made by lower port interface W as a result of a request made by the upper port interface section D of crossbar switch $5004_4$ to section interface W thereof. When interface section W is available to satisfy such request, (i.e., not satisfying request from other one of the upper port interface sections A–C) interface W issues a grant to upper interface section D.

Thus, each one of the upper port sections A–D sends requests signals (REQs) to the lower port sections W–Z when such upper port sections A–D wants access to (i.e., wants to be coupled to) such lower port sections. Conversely, each one of the upper port sections A–D receives grant signals (GR) from the lower port sections W–Z when such lower port sections W–Z grants access to (i.e., wants to be coupled to) such upper port sections A–D. The request (REQ) and grant (GR) signals, produced by and received from the upper port sections A–D and lower port sections W–Z are as follows:

| | | | | | | | | | | |
|---|---|---|---|---|---|---|---|---|---|---|
| UPPER PORT SECTION A | REQ WA | R | REQ XA | EQ YA | R | REQ RZA | R WA | R | G XA | R GYA | G ZA |
| UPPER PORT SECTION B | REQ WB | R | REQ XB | EQ YB | R | REQ RZB | R WB | R | G XB | R GYB | G ZB |
| UPPER PORT SECTION C | REQ WC | R | REQ XC | EQ YC | R | REQ RZC | R WC | R | G XC | R GYC | G ZC |
| UPPER PORT SECTION D | REQ WD | R | REQ XD | EQ YD | R | REQ RZD | R WD | R | G XD | R GYD | G ZD |
| LOWER PORT SECTION W | REQ WA | R | REQ WB | EQ WC | R | REQ RWD | R WA | R | G WB | R GWC | G WD |
| LOWER PORT SECTION X | REQ XA | R | REQ XB | EQ XC | R | REQ RXD | R XA | R | G XB | R GXC | G XD |
| LOWER PORT SECTION Y | REQ YA | R | REQ YB | EQ YC | R | REQ RYD | R YA | R | G YB | R GYC | G YD |
| LOWER PORT SECTION Z | REQ ZA | R | REQ ZB | EQ XC | R | REQ RZD | R ZA | R | G ZB | R GZC | G ZD | where:

For upper port section A:
- RWA is a request signal sent by upper port section A to lower port section W;
- RXA is a request signal sent by upper port section A to lower port section X;
- RYA is a request signal sent by upper port section A to lower port section Y;
- RZA is a request signal sent by upper port section A to lower port section Z;
- GWA is a grant signal from lower port section W to upper port section A;
- GXA is a grant signal from lower port section X to upper port section A;
- GYA is a grant signal from lower port section Y to upper port section A;
- GZA is a grant signal from lower port section Z to upper port section A;

For upper port B:
- RWB is a request signal sent by upper port section B to lower port section W;
- RXB is a request signal sent by upper port section B to lower port section X;
- RYB is a request signal sent by upper port section B to upper port section Y;
- RZB is a request signal sent by upper port section B to lower port section Z;
- GWB is a grant signal from lower port section W to upper port section B;
- GXB is a grant signal from lower port section X to upper port section B;
- GYB is a grant signal from lower port section Y to upper port section B;
- GZB is a grant signal from lower port section Z to upper port section B;

and so forth for the remaining upper and lower port sections C–D and W–Z.

Each one of the upper port sections A–D has four ports $A_1$–$A_4$, through $D_1$–$D_4$, respectively, as shown. Each one of the lower port sections W–Z has four ports $W_1$–$W_4$, through $Z_1$–$Z_4$, respectively, as shown. Ports $A_1$–$A_4$ are connected to ports $W_1$–$Z_1$, respectively, as shown. In like manner, Ports $B_1$–$B_4$ are connected to ports $W_2$–$Z_2$, respectively, as shown, ports $C_1$–$C_4$ are connected to ports $W_3$–$Z_3$, as shown, and Ports $D_1$–$D_4$ are connected to ports $W_4$–$Z_4$, as shown. Lower ports $5008_1$–$5008_4$ are connected to lower port sections W–Z. respectively, as shown.

As noted above, an exemplary one of the upper port interface sections A–D and an exemplary one of the lower port interface sections W–Z will be described in more detail in connection with FIGS. 11A–11D and 12A–12D, respectively. Suffice it to say here, however, that information fed to port $5006_1$ is coupled to ports $5008_1$–$5008_4$ selectively in accordance with a "tag" portion such information. In a reciprocal manner, information fed to port $5008_1$ is coupled to ports $5006_1$–$5006_4$ selectively in accordance with the "tag" portion in such information. Further, ports $5006_2$–$5006_4$ operate in like manner to port $5006_1$, so that information at such ports $5006_2$–$5006_4$ may be coupled to ports $5008_1$–$5008_4$. Still further, ports $5008_2$–$5008_4$ operate in like manner to port $5008_1$, so that information at such ports $5008_2$–$5008_4$ may be coupled to ports $5006_1$–$5006_4$. It should also be noted that information may appear simultaneously at ports $5008_1$–$5008_4$ with the information at one of such ports being coupled simultaneously to one of the ports $5006_1$–$5006_4$ while information at another one of the ports $5008_1$–$5008_4$ is coupled to a different one of the ports $5006_1$–$5006_4$. It is also noted that, in a reciprocal manner, information may appear simultaneously at ports $5006_1$–$5006_4$ with the information at one of such ports being coupled simultaneously to one of the ports $5008_1$–$5008_4$ and with information at another one of the ports $5006_1$–$5006_4$ being coupled to a different one of the ports $5008_1$–$5008_4$.

Referring now to FIGS. 11A, 11B, 11C and 11D, an exemplary one of the upper port interface sections A–D, here upper port interface section A is shown in more detail. It is first noted that the information at port 5006, includes: the "tag" portion referred to above; an address CRC ADDR_CRC portion, an address ADDR portion, a memory control portion (i.e., read/write, transfer length, "Wait and Validate", etc.); a data portion, (DATA); and a DATA Cyclic Redundancy Check (CRC) portion (DATA_CRC).

The "tag" portion includes: a two bit word indicating the one of the four memory array regions $R_1$–$R_4$ where the data is to be stored/read; a three bit word indicating the one of the eight memory boards having the desired array region $R_1$–$R_4$; a four bit word indicating the one of the 16 director boards $190_1$–$190_8$, $210_1$–$210_8$ (FIG. 8) having the director which initiated the transfer; a two bit word indicating which one of the four directors on such one of the director boards is making the requested data transfer; and a five bit random number designating, (i.e., uniquely identifying) the particular information cycle.

The information described above passing from the director to the crossbar switch (i.e., the "tag", the ADDR_CRC, the ADDR, the memory control, the DATA, and the DATA_CRC) for the entire information cycle (FIG. 17) are successively stored in a register 5100, in response to clock pulses Clock 1, in the order described above in connection with FIG. 17. The information stored in the register 5100 is passed to a parity generator (PG) 5102 for appending to such information a byte parity (p). After passing through the parity generator (PG) 5102, the different portions of the information are stored in registers $5104_1$–$5104_6$, as follows: Register $5104_1$ stores the DATA_CRC portion (with the generated parity); register $5104_2$, here a FIFO, stores the data portion, DATA, (with the generated parity); register $5104_3$ stores the memory control portion (with the generated parity); register $5104_4$ stores the address ADDR portion (with the generated parity), register $5104_5$ stores the address ADDR_CRC portion (with the generated parity); and register $5104_6$ stores the "tag" portion (with the generated parity) in the order shown in FIG. 17. Each clock pulse (Clock 1 or Clock 2) results in one of the words described above in connection with FIG. 17. Here, each word has two bytes and is stored in register 5100. The word stored in register 5100 is then shifted out of register 5100 with the next clock pulse, as new information becomes stored in such register 5100.

The portions stored in the registers $5104_1$–$5104_4$ and $5104_6$ (not register $5104_5$ which stores ADDR_CRC) are fed to selectors $5106_1$–$5106_4$, and $5106_6$, respectively, as indicated. An exemplary one of the selectors $5106_1$–$5106_4$, and $5106_6$, here selector $5106_6$ is shown to include four registers $5108_1$–$5108_4$. The four registers $5108_1$–$5108_4$ are connected to the same input port I of the selector $5106_6$ to thereby store four copies of the information portion, here the "tag" portion, fed to such input port I in this example. The output of each of the four registers $5108_1$–$5108_4$ is fed to a corresponding one of four gated buffers $5110_1$–$5110_4$, respectively, as indicated. With such an arrangement, one of the stored four copies is coupled to a selected one of the output ports $A_1$–$A_4$ selectively (and hence to ports $W_1$–$Z_1$, respectively) in accordance with enable memory control signals on lines EAW-EAZ as a result of decoding the two-bit portion of "tag" indicating the selected one of the four memory array regions $R_1$–$R_4$. More particularly, each one of the lines EAW-EAZ is coupled to a corresponding one of the enable inputs of the four gated buffers $5110_1$–$5110_4$, respectively, as indicated.

More particularly, as noted above, the "tag" includes 2 bits which indicates the one of the four memory array regions $R_1$–$R_4$ which is to receive the information at port $5006_1$ (i.e., the "tag", the ADDR_CRC, the ADDR, the memory control, the DATA, and the DATA_CRC). The "tag" is fed to a memory control logic/ADDR_CRC checker 5112. In response to this two bit portion of the "tag", the memory control logic/ADDR_CRC checker 5112 activates one of the four lines EAW-EAZ to thereby enable a selected one of the four copies stored in the four registers $5108_1$–$5108_4$ to pass to one of the ports $A_1$–$A_4$. It is noted that the lines EAW-EAZ are also fed to selectors $5106_1$–$5106_5$ in a similar manner with the result that the information at port $5006_1$ (i.e., the "tag", the ADDR_CRC, the ADDR, the memory control, the DATA, and the DATA_CRC) portions Data CRC, Data, memory control, ADDR, and ADDR_CRC is fed to the same selected one of the ports $A_1$–$A_4$ and thus to the one of the four memory array regions $R_1$–$R_4$ described by the two-bit portion of the "tag".

It is noted that the upper port section A also includes a memory board checker 5114. Each of the here eight memory board $220_1$–$220_8$ (FIG. 8) plugs into the backplane 302 as discussed above in connection with FIG. 3. As noted above, here the backplane 302 is adapted to a plurality of, here up to eight memory boards. Thus, here the backplane 302 has eight memory board slots. Pins $P_1$–$P_3$ (FIGS. 9A, 9B and 9C) are provided for each backplane 320 memory board slot and produce logic voltage levels indicating the slot position in the backplane. Thus, here the slot position may be indicated with the logic signals on the three pins $P_1$–$P_3$ to produce a three bit logic signal representative of the backplane slot position. Referring again to FIGS. 9A, 9B and 9C, the exemplary memory board $220_1$ is shown plugged into a slot in the backplane 302. As noted above, the slot has pins $P_1$–$P_3$ which provides the slot position three bit logic signal indicative of the slot or "memory board" number in the backplane. The logic signals produced by the pins $P_1$–$P_3$ are fed to the memory board checker 5114 (FIGS. 11A, 11B, 11C and 11D). Also fed to the memory board checker 5114 are the 3-bits of the "tag" which indicates the one of the memory array boards which is to receive the data (i.e., a 3-bit "memory board code"). If the three bit memory board indication provided by "tag" is the same as the backplane slot or "memory board number" indication provided by the pins $P_1$–$P_3$, the director routed the information cycle to the proper one of the eight memory boards and such "accept" indication is provided to the decode logic/ADDR CRC checker 5112 via line A/R. On the other hand, if the three bit memory board indication provided by "tag" is different from the backplane slot indication provided by the pins $P_1$–$P_3$, the information cycle was not received by the correct one of the memory boards and such "reject" indication is provided to the decode logic/ADDR CRC checker 5112 via line A/R. When a reject indication is provided to the decode logic/ ADDR CRC checker 5112, the intended transfer in prevented and the indication is provided by the decode logic/ ADDR CRC checker 5112 to the initiating director via the A/R line. Thus, if the "memory board number" provided by pins $P_1$–$P_3$ does not match the "memory board code" contained in the "tag" the transfer request from the director is rejected and such error indication is sent back to the director. In this manner, a routing error in the director is detected immediately and is not propagated along.

On the other hand, if the "memory board number" and the "memory board code" do match, the crossbar switch will forward the requested transfer to one of the four memory regions (i.e., the "memory region number", $R_1$–$R_4$) designated by the "tag".

The decode logic and ADDR_CRC checker 5112 also produces load signals $L_1$–$L_6$ to the registers $5104_1$–$5104_6$, respectively, in response to the "start-frame" signal in word 0 described above in connection with FIG. 16.

Also fed to the decode logic/ADDR_CRC checker 5112 is the ADDR_CRC portion stored in registers $5104_3$ $5104_6$ (i.e., control, ADDR, ADDR_CRC, and "tag"). The decode logic/ADDR_CRC 5112 performs a check of the CRC of the control, ADDR, ADDR_CRC, and "tag" and if such checker 5112 detects an error such error is reported back to the transfer initiating director via line ADDR_CRC_CHECK, as indicated. Detection of such an ADDR_CRC_CHECK error also results in termination of the transfer.

When data is read from a selected one of the memory array region $R_1$–$R_4$ as indicated by the "tag" stored in register $5104_6$, the decode logic/ADDR_CRC checker5112 activates the proper one of the lines EAW-WAZ to coupled the proper one of the ports $A_1$–$A_4$ coupled to such selected one of the memory array regions $R_1$–$R_4$ to a register 5120. Thus, read data passes via selector 5118 to the register 5120 and is then sent to the transfer-requesting director via pot $5006_1$.

It is noted that the decode logic and ADDR CRC checker 5112 in upper port interface logic A also produces request signals RWA, RXA, RYA, and RZA and sends such request signal to lower port sections W–Z, respectively. Such requests are fed to an arbitration logic 5114 (FIGS. 12A, 12B, 12C and 12D) included within each of the lower port sections W, X, Y and Z, respectively. Thus, because the other upper port sections B–D operate in like manner to upper port section A, the arbitration 5114 in lower port interface section W may receive requests RWB, RWC, and RWD from such other upper port sections B–D, respectively. In accordance with a predetermined arbitration rule, such as, for example, first-come, first-served, the arbitration logic 5114 of lower port interface section W grants for access to lower port $5008_1$ of lower port section W to one of the requesting upper port sections A–D via a grant signal on one of the lines GWA, GWB, GWC and GWD, respectively.

Thus, referring again to FIGS. 11A, 11B, 11C and 11D, the decode logic/CRC ADR checker 5112 issues a request on line RWA when port $5008_1$ (FIG. 10) desires, based on the two bit information in the "tag", memory array region $R_1$ (FIGS. 9A, 9B and 9C). In like manner, if memory array regions $R_2$–$R_4$ are indicted by the "tag", requests are made by the upper port section on lines RXA, RYA, RZA, respectively. The other upper port sections B–D operate in like manner. The grants (GR) produced by the lower port sections W, X, Y and Z are fed to the upper port sections A–D as indicated above. Thus, considering exemplary upper port section A (FIGS. 11A, 11B, 11C and 11D), the grant signals from lower port sections W–Z are fed to the decode logic/CRC checker 5112 therein on lines GWA, GXA, GYA and GZA, respectively. When a grant on one of these four lines GWA, GXA, GYA and GZA is received by the decode logic/CRC checker 5112, such checker 5112 enables the gating signal to be produced on the one of the enable lines EAW, EAX, EAY, EAZ indicated by the "tag" portion. For example, if the "tag" indicates that memory array region $R_3$ (which is adapted for coupling to port $5008_3$ of lower port section Y) the checker 5112 issues a request on line RYA. When after the arbitration logic 5114 in section Y determines that lower port logic A is to be granted access to port $5008_3$, such lower port section Y issues a grant signal on line GYA. In response to such grant, the checker 5112 issues an enable signal on line EAY to thereby enable information to pass to port $A_3$ (FIGS. 11A, 11B, 11C and 11D).

In a reciprocal manner, when data is to be transferred from a memory array region to the requesting director, the information sent by the requesting director is processed as described above. Now, however, the checker 5112 sends a control signal to one of the lines EAW-EAZ to selector section 5118 to enable data on one of the ports $A_1$–$A_4$ coupled to the addressed memory array regions $R_1$–$R_4$ to pass to register 5120 and then to upper port $5006_1$.

Referring now to FIGS. 12A, 12B, 12C and 12D, exemplary lower port section W is shown to include arbitration logic 5114 described above, and the selector 5120 fed by signals on ports $W_1$–$W_4$. (Referring again to FIG. 10, ports $W_1$–$W_4$ are coupled to ports A1, B1, C1 and D1, respectively, of upper port interface sections A–D, respectively.) Thus, when the arbitration logic 5114 grants access to one of the upper port sections A–D, the decoder 5122 decodes the grant information produced by the arbitration logic and produces a two bit control signal for the selector 5120. In response to the two bit control signal produced by the decoder 5122, the selector couples one of the ports $W_1$–$W_4$ (and hence one of the upper port sections A–D, respectively), to the output of the selector 5120 and hence to lower port $5008_1$ in a manner to be described.

As noted above, the communication between any port $M_{B1}$–$M_{B8}$, $M_{A1}$–$M_{A8}$ and its corresponding crossbar switches $5004_1$–$5004_4$ is protected by Cyclic Redundancy Check (CRC) defined by CCITT-V.41. The communication between a crossbar switch $5004_1$–$5004_4$ and its corresponding memory array region $R_1$–$R_4$ is protected by byte parity (p). There is a pipelined architecture from the port $M_{B1}$–$M_{B8}$, $M_{A1}$–$M_{A8}$, and through the crossbar switch, and through the logic sections $5010_1$–$5010_8$.

The nature of CRC calculation is such that an error in the data is not detected until the entire transfer is completed and the checksum of the CRC is known. In the case of a write of data into the memory, by the time the CRC is checked, most of the data is already through the pipeline and written into memory.

Here, the memory control field has a specific bit "Wait and Validate" in the control word 1 in FIG. 16 which is at the director's control. If the bit is set, the logic sections $5010_1$–$5010_8$ buffers the entire information cycle, pending the CRC calculation, performed at the lower port interface sections W–Z. If the CRC check indicates no CRC error, then the data is written into the memory array region. If the CRC check does indicate an error, then the memory array region is informed of the error, here by the lower interface section W–Z corrupting the data into a fault. Such fault is detected in the logic section $5010_1$–$5010_8$ and such information is prevented from being stored in the memory region $R_1$–$R_4$, in a manner to be described. Suffice it to say here, however, that this "Wait and Validate" technique enables the director to flag certain data transfers as critical, and if an error occurs, prevents corruption of the data stored in the memory array. That is, the data having a CRC error is detected and prevented from being stored in the memory array region. For those transfers not indicated as critical by the director, the "Wait and Validate" bit is not set thereby maximum performance of the memory is obtained.

More particularly, the DATA, memory control, ADDR, and "tag" portions (with their byte parity (P) generated by parity generator 5102 (FIGS. 11A, 11B, 11C and 11D)) of the information coupled to the output of selector 5120 is stored in the register 5124. As noted above in connection with FIG. 16, the DATA_CRC portion (i.e., the words X and Y) occurs after the last DATA word.

Thus, as the words in the DATA clock through register 5124 they pass into the DATA_CRC checker 5132 where the CRC of the DATA is determined (i.e., the DATA_CRC checker 5132 determine X and Y words of the DATA fed to such checker 5132). The actual X and Y words (i.e., DATA_CRC stored in register 5128, both content (n) and parity (p)) are stored successively in register 5128 and are then passed to checker 5132 where they are checked against the X and Y words determined by the checker 5132. As noted above, the DATA has appended to it its parity (P). Thus, the "information" whether in register 5124 or register 5128 has a content portion indicated by "n" and its parity indicated by "P". Thus, the DATA_CRC register 5128 includes the DATA_CRC previously stored in register $5104_2$ (FIGS. 11A, 11B, 11C and 11D) (i.e., the content portion designated by "n") and its parity (designated by "p"). The DATA, memory control, ADDR, and "tag" portions, (with their parity (P) (i.e., content "n" plus its appended parity "") stored in register 5124 may be coupled through a selector 5149 through one of two paths: One path is a direct path when the "Wait and Validate" command is not issued by the director; and, a second path which includes a delay network 5130, here a three clock pulse delay network 5130.

More particularly, it is noted that the DATA, control, ADDR, "tag", both content (n) and parity (P) are also fed to a DATA_CRC checker 5132. Also fed to the DATA_CRC checker 5132 is the output of DATA_CRC register 5128. The CRC checker 5132 checks whether the DATA_CRC (content "n" plus its parity "p") is the same as the CRC of the DATA, such DATA having been previously stored in register $5104_2$ (FIGS. 11A, 11B, 11C and 11D), i.e., the content "n" plus its parity "P" of the DATA previously stored in register $5104_2$ (FIGS. 11A, 11B, 11C and 11D). If they are the same, (i.e., no DATA_CRC_ERROR), a logic 0 is produced by the CRC checker 5132. If, on the other hand, they are not the same, (i.e., a DATA_CRC_ERROR), the CRC checker 5132 produces a logic 1. The output of the Data_CRC checker 5132 thereby indicates whether there is an error in the CRC of the DATA. Note that a DATA_CRC_ERROR is not known until three clock cycles after the last sixteen-bit portion of the DATA (i.e., the word of the DATA, FIG. 16) is calculated due to the nature of the CRC algorithm. Such indication is fed to a selector 5152 via an OR gate 5141. If there is a DATA_CRC_ERROR, the "information" at the output of the delay network 5130 (i.e., the last word of the DATA (FIG. 16)) with its parity (P)) is corrupted. Here, the content (n) of such "information" (i.e., the "information" at the output of the delay network 5130 (i.e., the last word of the DATA (FIG. 16))) is fed to a second input 12 of the selector 5140. The parity (pP) of such "information" (i.e., the last word of the DATA (FIG. 16)) is fed non-inverted to one input of selector 5152 and inverted, via inverter 5150, to a second input of the selector 5152. If there is a DATA_CRC_ERROR detected by data CRC checker 5132, the inverted parity is passed through the selector 5152 and appended to the content portion (n) of the "information" (i.e., the last word of the DATA (FIG. 16)) provided at the output of the delay network 5130 and both "n" and appended "P" are fed to the second input 12 of selector 5140 thereby corrupting such "information". It should be noted that the remaining portions of the information cycle (i.e., the memory control, address (ADDR), "tag", and all but the last word of the DATA (FIG. 16)) pass through the delay network 5130 without having their parity (P) corrupted.

If there is a no "Wait and Validate" transfer, logic decoder 5122 selects the first input $I_1$ as the output of the selector 5140. If there is a "Wait and Validate" transfer, the logic decoder 5122 selects the second input $I_2$ as the output of the selector 5140. It is noted, however, that that because the last word of DATA (FIG. 16) is delayed three clock pulses (from Clock 1) by registers 5142, 5144, and 5146 (such registers 5142, 5144 and 5146 being fed by such Clock 1), the DATA_CRC check is performed before the last word of the DATA appears at the output of register 5146. Thus, the last word of the DATA is corrupted in byte parity before being passed to the logic section $5010_1$–$5010_8$. That is, because of the delay network 5130, the DATA_CRC is evaluated before the last word of the DATA has passed to port $5008_1$. This corruption in parity (p), as a result of a detected DATA_CRC error, is detected by a parity checker 6106 (FIGS. 14A, 14B, 14C and 14D) in the following logic section $5010_1$–$5010_8$ in a manner to be described. Suffice it to say here, however, that detection of the parity error (produced by the detected CRC error) prevents such corrupted information from storage in the SDRAMs.

On the other hand, if there is no DATA_CRC_ERROR (and no error in the parity of the DATA_CRC detected by the parity checker 6106 (FIGS. 14A, 14B, 14C and 14D) in a manner to be described) the non-inverted parity (p) is appended to the "information" (i.e., DATA, memory control, ADDR, and "tag") provided at the output of the delay network 5130 and such information is fed to the proper memory address region $R_1$–$R_4$ as indicated by "tag".

More particularly, it is noted that the selector 5140 is also fed the "information" (i.e., DATA, memory control, ADDR, and "tag") without such "information" passing through the delay 5130. The director issuing the transfer may not require that the transfer have the DATA_CRC check result preclude the writing of information into the memory (i.e., no "Wait and Validate"), in which case the "information" is passed directly through the selector 5140. On the other hand, if such DATA_CRC check is to be effected, the delay network 5130 output, with a possible corruption as described above, is passed through the selector 5140. The director provides the indication as part of the control field in the described "Wait and Validate" bit. Such bit is decoded by the logic decoder 5122. In response to such director indication, a "Wait and Validate" control signal is sent by the logic decoder 5122 to the selector 5140.

As noted above, the communication between any port and its corresponding crossbar switch is protected by Cyclic Redundancy Check (CRC) defined by CCITT-V.41. The communication between a crossbar switch and a memory array region $R_1$–$R_4$ is protected by byte parity (p). This implies that the crossbar switch must translate between CRC protection and parity protection.

As a further check of the validity of the DATA CRC, the generated parity p of the CRC of such DATA is checked. However, because the CRC is generated by the director, and the CRC parity is also generated by upper interface section A–D, a CRC generation fault would yield an undetectable CRC parity fault.

It has been discovered that the parity (p) of the DATA_CRC must be the same as the parity of the DATA parity (P). Thus, one merely has to check whether the parity of the DATA_CRC is the same as the parity of the DATA parity (P). Therefore, such detection DATA_CRC parity checking method is accomplished without using the DATA_CRC itself.

More particularly, since the DATA over which the DATA_CRC is being calculate d is already parity protected, on the DATA parity (P) to calculate the DATA_CRC parity: i.e., the DATA_CRC parity is equal to the parity of all the DATA parity bits. Still more particularly, if there are N bytes of DATA:

[D(0), D(1), . . . D(N−1)]

and each byte is protected by a parity bit P, then the DATA_CRC parity is the parity of

[P(0), P(1), . . . P(N−1)].

Thus, if there is a fault in the generation of the DATA_CRC, it is immediately detected and isolated from the director.

Thus, the exemplary lower port interface section W (FIGS. 12A, 12B, 12C and 12D) includes a parity generator made up of an exclusive OR gate 5134 and register 5136 arranged as shown fed by the parity (P) of the DATA portion stored in register 5124. The generated parity P is fed to a comparator 5138 along with the parity (p) of the DATA_CRC (i.e., DATA_CRC_PARITY), as indicated. If the two are the same at the end of the DATA portion of the information cycle (FIG. 16), a logic 0 is produced by the comparator 5138 and such logic 0 passes to the selector 5152 to enable the non-inverted parity to pass through such selector 5152. If there is an error in the parity bit of the CRC, a logic 1 is produced by the comparator 5138 and the inverted parity is passed through the selector 5152. The logic 1 output of comparator 5138 passes through OR gate 5141 to couple the inverted parity (p) through selector 5152 to append to the content port (n) of DATA control, ADDR, and "tag" at port $I_2$ of selector 5140. Thus, if there is either a DATA_CRC_ERROR or if DATA_CRC_PARITY is different from parity of the DATA_PARITY at the end of the DATA portion of the information cycle as indicated by a signal produced on line COMP_ENABLE by the logic decoder 5122, a logic 1 is produced at the output of OR gate 5141 thereby coupling the inverted parity through selector 5152. Otherwise, the non-inverted parity passes through selector 5152. That is, the COMP_EN is produced at the end of the DATA in the information cycle (FIG. 16).

It is noted that information read from the memory region passes to a register 5170 and a CRC generator 5172. The generated CRC is appended to the information clocked out of the register 5170. Four copies of the information with appended CRC are stored in registers $5174_1$–$5174_4$, respectively. In response to the "tag" portion fed to logic decoder 5122, a selected one of the registers $5174_1$–$5174_4$ is coupled to one of the port $W_1$–$W_4$ by selector 5180 and gates $5182_1$–$5182_4$ in a manner similar to that described in connection with FIGS. 11A, 11B, 11C and 11D.

Referring now to FIGS. 13A, 131B, 13C, 13D and 13E, a pair of the logic sections $5010_1$–$5010_8$ (memory array region controllers), here logic sections $5010_1$ and $5010_2$ are shown. As noted above in connection with FIGS. 9A, 9B and 9C, both logic sections $5010_1$ and $5010_2$ are coupled to the same memory array region, here memory array region $R_1$. As was also noted above in connection with FIGS. 9A, 9B and 9C, the logic section $5010_1$ is in one fault domain, here fault domain A, and logic section $5010_2$ is in a different fault domain, here fault domain B. Thus, logic section $5010_1$ operates in response to clock pulses from Clock 1 and logic section $5010_2$ operates in response to clock pulses from Clock 2.

As noted above, each logic section $5010_1$–$5010_8$ (FIGS. 9A, 9B and 9C) includes a pair of upper ports, A and B, a control port C and a data port D. Referring to FIGS. 13A, 13B, 13C, 13D and 13E, an exemplary logic section $5010_1$ is shown in detail to include a upper port A controller 6002A coupled to upper port A, a upper port B controller 6002B coupled to upper port B, and a memory refresh section 6002R.

Both port A and port B controllers $5010_1$, $5010_2$ have access to the data stored in the same memory array region $R_1$. Further, while each can provide different, independent control and address information, (i.e., memory control, ADDR, and "tag" (hereinafter sometimes referred to as ADDR/CONTROL)), both share the same DATA port. As noted above, the details of the memory array region 1 are described in detail in connection with FIG. 6 of U.S. Pat. No. 5,943,287. Thus, arbitration is required for access to the common memory array region $R_1$ when both the port A and port B controllers $5010_1$ and $5010_2$ desire access to the memory array region $R_1$. Further, the SDRAMs in the memory array region $R_1$ require periodic refresh signals from the memory refresh section 6002R. Thus, access or request for, the memory array region $R_1$ may come from: the upper port A controller 6002A (i.e., REQUEST A); the upper port B controller 6002B (i.e., REQUEST B); and from the memory refresh section 6002R (i.e., REFRESH REQUEST). These request are fed to an arbitration logic 6004 included within the logic section $5010_1$–$5010_8$. The arbitration sections $6004_1$, $6004_2$ in the redundant paired logic sections, here logic sections $5010_1$, $5010_2$, respectively, arbitrate in accordance with an arbitration algorithm to be described and thereby to issue a grant for access to the memory array region $R_1$ to either: the upper port A controller 6002A (i.e., GRANT A); the upper port B controller 6002B (i.e., GRANT B); or the memory refresh section 6002R (i.e., REFRESH GRANT).

Here, the arbitration algorithm is an asymmetric round robin sharing of the common memory array region $R_1$. The arbitration logic $6004_1$, $6004_2$ and the algorithm executed therein will be described in more detail in connection with FIGS. 15A, 15B, 15C, 15D and 15E. Suffice it to say here however that the arbitration grants access to the common memory array region based on the following conditions:

Condition I—If both the logic sections $5010_1$ and $5010_2$ are operating properly (i.e., produce Memory Output Enable (MOE) and Memory Refresh Enable (MRE) signals, to be described, properly), the port A controller 6002A memory refresh controller 6002R is used exclusively for memory refresh during the round-robin arbitration). Thus, there is asymmetric round robin arbitration because the memory refresh section 6002R of logic section $5010_2$ is not used when operating in this normal Condition I. The states of the arbitration sequences are as follows:

State 1—The upper port A controller 6002A of logic section $5010_1$ is granted access to the memory array region $R_1$;

State 2—The memory refresh section 6002R of logic section $5010_1$ is granted access to the memory array region $R_1$;

State 3—The upper port B controller 6002B of logic section $5010_1$ is granted access to the memory array region $R_1$;

State 4—The memory refresh section 6002R of logic section $5010_1$ is granted access to the memory array region $R_1$;

State 4—A check is made as to whether the of logic section $5010_2$ requests access to the memory array region $R_1$. If such a request exist:

(a) The upper port A controller 6002A of logic section $5010_2$ is granted access to the memory array region $R_1$ if such access is requested;

(b) The upper port B controller 6002B of logic section $5010_2$ is granted access to the memory array region $R_1$ if such access is requested;

State 5—The process returns to State 1.

(It should be noted that the process uses the memory refresh section 6002R of logic section $5010_1$ but does not use the memory refresh section 6002R of logic section $5010_2$. Thus the round robin is asymmetric.)

Condition II—If the logic section $5010_2$ is disabled (i.e., does not produce MOE and MRE signals properly), the logic section $5010_2$ is not part of the round-robin arbitration and memory refresh is provided, as in Condition I, exclusively by the logic section $5010_1$ memory refresh controller 6002R. The logic section $5010_1$ no longer receives request signals FROM the logic section $5010_2$. Also the logic section $5010_1$ is granted access to the memory array region $R_1$ all the time. Thus, the states of the arbitration sequence are in Condition II as follows:

State 1—The upper port A controller 6002A of logic section $5010_1$ is granted access to the memory array region $R_1$;

State 2—The memory refresh section 6002R of logic section $5010_1$ is granted access to the memory array region $R_1$;

State 3—The upper port B controller 6002B of logic section $5010_1$ is granted access to the memory array region $R_1$;

State 4—The memory refresh section 6002R of logic section $5010_1$ is granted access to the memory array region $R_1$;

State 5—The process returns to State 1.

Condition III—The logic section $5010_1$ is disabled (i.e., does not produce MOE and MRE signals properly) and thus the logic section $5010_1$ is not part of the round-robin arbitration. Memory refresh is provided exclusively by the memory refresh section 6002R (not shown) in the logic section $5010_2$. The logic section $5010_2$ is granted access to the memory array region $R_1$ all the time. Thus the states of the arbitration sequence in Condition III are as follows:

State 1—The upper port A controller 6002A of logic section $5010_2$ is granted access to the memory array region $R_1$;

State 2—The memory refresh section 6002R of logic section $5010_2$ is granted access to the memory array region $R_1$;

State 3—The upper port B controller 6002B of logic section $5010_2$ is granted access to the memory array region $R_1$;

State 4—The memory refresh section 6002R of logic section $5010_2$ is granted access to the memory array region $R_1$;

State 5—The process returns to State 1.

Condition IV-Reset (the arbitration is reset into Condition I from either Condition II or from condition III).

Referring again to FIGS. 13A, 13B, 13C, 13D and 13E, the arbitration logic $6004_1$, $6004_2$ in each one of the logic sections $5010_1$, $5010_2$ produces: a memory output enable (MOE) signal; a memory refresh enable (MRE) signal (to be described in more detail in connection with FIGS. 15A–15E and 19); and, a memory grant (MG) signal, (to be described in more detail in connection with FIGS. 15A–15E and 19). Thus, logic section $5010_1$ produces a memory output enable signal MOEA (to be described in more detail in connection with FIGS. 15A–15E and 19), memory refresh enable signal MREA (to be described in more detail in connection with FIGS. 15A–15E and 19) and a memory grant signal MGA (to be described in more detail in connection with FIGS. 15A–15E and 19). Likewise, logic section $5010_2$ produces a memory output enable signal $MOE_{I-1}$ (to be described in more detail in connection with FIGS. 15A–15E and 19), a memory refresh enable signal MREB (to be described in more detail in connection with FIGS. 15A–15E and 19) and a memory grant signal MGB (to be described in more detail in connection with FIGS. 15A–15E and 19). Suffice it to say here, however, that the MOEA signal is a triplicate signal $MOE_{I-1}$, $MOE_{I-2}$, $MOE_{I-3}$ and the MGA signal is also a triplicate signal $MGE_{IA}$, $MGE_{IIA}$, and $MGE_{IIIA}$.

The MOEA and MREA signals from the logic section $5010_1$ and the MOEB and MREB signals from the logic section $5010_2$ are fed to a watch dog (WD) section 6006, to be described in more detail in connection with FIGS. 15A, 15B, 15C, 15D and 15E. Suffice it to say here, however, that, as noted above, the arbitration algorithm is a function of the operating/non-operating condition of the logic sections $5010_1$, $5010_2$. This operating/non-operating condition is determined by the watchdog section 6006 and more particularly by examining the MOEA, MREA, MOEB, MREB signals produced by the logic sections $5010_1$ and $5010_2$, 6002B, respectively. The MOEA, MREA, MOEB, MREB signals are asserted when there is a grant. Such signals MOEA, MREA, MOEB, MREB are fed to the watchdog section 6006. As will be described, the watchdog section 6006 examines the time history of these signals to determine if the logic section $5010_1$ or $5010_2$ asserting them is operating properly. Based on the results of such examination, the watchdog selects the Condition I, Condition II, or Condition III, described above.

More particularly, consider, for example, a case where the MOEA signal is asserted for too long a predetermined time interval. It should be recalled that the logic section $5010_1$ producing such MOEA signal is granted access to the memory in State 1 of the normal arbitration condition (i.e., Condition I, above). The watchdog section 6006 thus detects a fault in logic section $5010_1$. When such a fault is detected, the watchdog section 6006 issues a Condition III signal on in triplicate on lines MSAB to the arbitration sections $6004_1$, $6004_2$ in both the logic sections $5010_1$, $5010_2$, respectively, indicating that the arbitration algorithm will operate in accordance with the States set forth above for Condition III. Further, the watchdog 6006 issues a data output enable signal in triplicate on lines DOEA (i.e., $DOEA_0$, $DOEA_1$, and $DOEA_2$). This triplicate signal DOEA (i.e., $DOEA_0$, $DOEA_1$, and $DOEA_2$) is fed to a majority gate (MG) 6007 (FIGS. 13A, 13B, 13C, 13D and 13E), in accordance with the majority of the triplicate data fed to it, provides an enable/disable signal for gate 6009. If the majority indicates a fault, the gate 6009 inhibits DATA from passing between the logic section $5010_1$ and the data port D thereof.

Consider the case where the arbitration is in Condition I. Consider also that in such condition I, the MREA signal is not produced after a predetermined time interval which ensures proper refreshing on the SDRAMs in the memory array region $R_1$. The watchdog section 6006 will again detect a fault in the logic section $5010_1$ port A controller 6002A. When such a fault is detected, the watchdog section 6006 issues a Condition III signal on in triplicate on lines MSAB (i.e., $MSAB_0$, $MSAB_1$, $MSAB_2$) to the arbitration sections $6004_1$, $6004_2$ in both the logic sections $5010_1$, $5010_2$, respectively. Further, the watchdog 6006 issues a data output enable signal in triplicate on lines DOEA (i.e., $DOEA_0$, $DOEA_1$, and $DOEA_2$) (FIGS. 13A, 13B, 13C, 13D and 13E) to inhibit DATA from passing between the logic section $5010_1$ and the data port D thereof.

Consider the case where the arbitration is in Condition I. Consider also that in such condition I, the MREA signal is not produced after a predetermined time interval which ensures proper refreshing on the SDRAMs in the memory array region $R_1$. The watchdog section 6006 will again detect a fault in the logic section $5010_1$ port A controller 6002A. When such a fault is detected, the watchdog section 6006 issues a Condition III signal on in triplicate on lines MSAB (i.e., $MSAB_0$, $MSAB_1$, $MSAB_2$) to the arbitration sections $6004_1$, $6004_2$ in both the logic sections $5010_1$, $5010_2$, respectively. Further, the watchdog 6006 issues a data output enable signal in triplicate on lines DOEA (i.e., $DOEA_0$, $DOEA_1$, and $DOEA_2$) (FIG. 13) to inhibit DATA from passing between the logic section $5010_1$ and the data port D thereof.

Consider, for example, a case where the arbitration is in Condition I and the MOEB signal from the logic section $5010_2$ is asserted for too long a predetermined time interval. The watchdog section 6006 thus detects a fault in the logic section $5010_2$. When such a fault is detected, the watchdog section 6006 issues a Condition II signal on line MSAB to the arbitration sections $6004_1$, $6004_2$ in both the logic sections $5010_1$, $5010_2$. Further, the watchdog 6006 issues a data output enable signal in triplicate on lines DOEB to inhibit DATA from passing between the logic section $5010_2$ and the data port D thereof.

It should be noted that the algorithm allows a transition between Condition II and Condition IV (i.e., reset) or from Condition III and Condition IV.

Thus, the arbitration logics $6004_1$ and $6004_2$ are adapted to issue the following signals:

GRANTA (GA)-grant port A controller 6002B access to the memory array region $R_1$;
GRANT B (GB)-grant port B controller 6002B access to the memory array region $R_1$
REFRESH GRANT (GR)-grant the memory refresh section 6002R of logic section $5010_1$ access to the memory array region $R_1$ in Condition I and II or grant the memory refresh section 6002R of logic section $5010_2$ access to the memory array region $R_1$ in Condition III.

Figure 19:
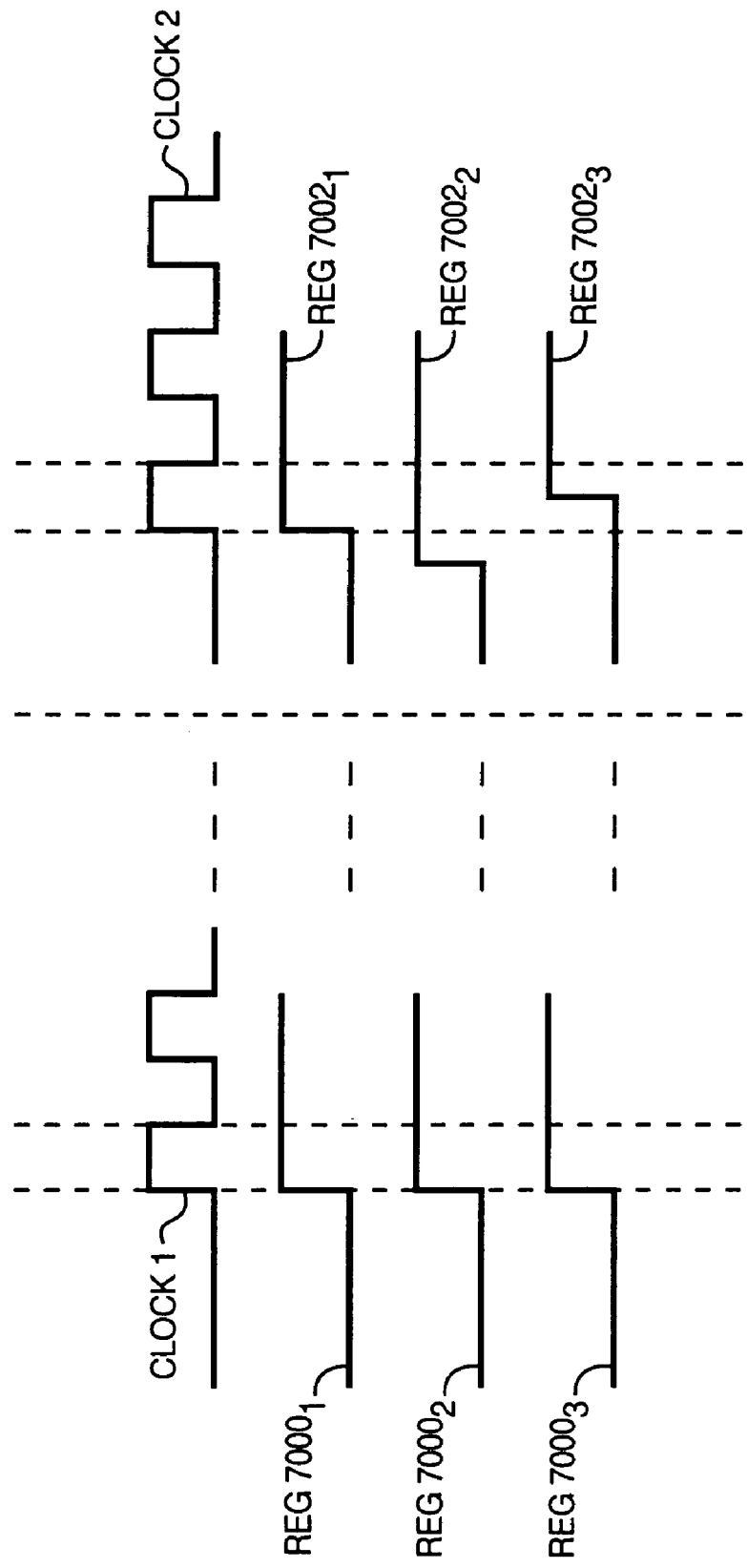
FIG. 19 is a timing diagram of signals in arbitration units of FIG. 18 used of one of the pair of port controllers of FIGS. 14A, 14B, 14C and 14D and a filter used in the arbitration unit used in the other one of such pair of controllers of FIGS. 14A, 14B, 14C and 14D.

It should be noted that the details of GA and the other signal GB and GR are shown in more detail in connection with FIG. 19.

Thus, referring to FIGS. 13A, 13B, 13C, 13D and 13E, the memory array region $R_1$ may be coupled to either Port_A (A) or Port_B (B) of the logic sections $5010_1$, $5010_2$ or to the memory refresh section 6002R therein selectively in accordance with a Port_A_SELECT, Port_B_SELECT, Port_R_SELECT signal fed to a pair of selectors $6010_C$, $6010_D$, shown in more detail for exemplary logic section $5010_1$. Access by the upper port A controller 6002A (i.e., Port_A), by the upper port B controller 6002B, or the memory refresh section 6002R to the memory array region $R_1$ is in accordance with the algorithm described above.

An exemplary one of the upper port A and port B logic controllers 6002A and 6002B, here controller 6002A, will be described in more detail in connection with FIGS. 14A, 14B, 14C and 14D. Suffice it to say here, however, that it is noted that the output of selector $6010_C$ is coupled to the control port C of the exemplary logic section $5101_1$ and the output of selector $6010_D$ is coupled to the data port D of the exemplary logic section $5101_I$ through the gate 6009. Each one of the selectors $6010_C$ and $6010_D$ has three inputs A, B, and R, as shown. The A, B and R inputs of selector $6010_C$ are coupled to: the ADR/CONTROL produced at the output of upper port A controller 6002A; the ADR/CONTROL produced at the output of upper port B controller 6002B; and, the portion REFRESH_C of the refresh signal produced by the memory refresh section 6002R, respectively as indicated. The A, B and R inputs of selector 6010D are coupled to: the WRITE DATA produced at the output of upper port A controller 6002A; the WRITE DATA produced at the output of upper port B controller 6002B; and, the portion REFRESH_D of the refresh signal produced by the memory refresh section 6002R, respectively as indicated. The Port_A_SELECT, Port_B_SELECT are produced by the upper port A controller 6002A, upper port B controller 6002B in a manner to be described. The Port_R_SELECT signal is produced by the memory refresh section 6002R in a manner to be described to enable proper operation of the above described arbitration algorithm and to proper a refresh signal to the SDRAMs in the memory array region $R_1$ at the proper time. Suffice it to say here, however, that when port A controller 6002A produces the Port_A_SELECT signal, the ADR/CONTROL at the output of port A controller 6002A passes to the output of the selector 6010C and the DATA_WRITE at the output of the port A controller 6002A passes to the output of the selector 6010D. Likewise, when port B controller 6002B produces the Port_B_SELECT signal, the ADR/CONTROL at the output of port B controller 6002B passes to the output of the selector 6010C and the DATA_WRITE at the output of the port B controller 6002B passes to the output of the selector 6010D. In like manner, when refresh memory section 6002R produces the Port_R_SELECT_C signal, the REFRESH_C at the output of refresh memory section 8002R passes to the output of the selector 6010C and in response to the Port_R_SELECT signal, the REFRESH_D at the output of the refresh memory section 8002R passes to the output of the selector 6010D.

It is noted that data read from the memory array $R_1$ (i.e., READ_DATA) is fed from the data port D to both the upper Port A controller 6002A and the upper Port B controller 6002B.

Referring now to FIGS. 14A, 14B, 14C and 14D, the exemplary port A controller 6002A is shown in more detail to include a Port A primary control section 6100P and a Port A secondary control section 6100S. The two sections 6100P and 6100S are both coupled to port A and both implement the identical control logic. Thus, each one of the two sections 6100P and 6100S should produce the same results unless there is an error, here a hardware fault, in one of the two sections 6100P and 6100S. Such a fault is detected by a fault detector 6102 in a manner to be described.

Thus, referring to the details of one of the two sections 6100P and 6100S, here section 6100P, it is first noted that the information at Port_A is fed to a parity checker 6101. It is noted that is there is an error in parity induced by the CRC check described in FIGS. 12A, 12B, 12C and 12D in connection with selector 5152, such detected parity error is reported to a control and DATA path logic 6112. In response to a detected parity error, control and DATA path logic 6112 prevents memory control signals (e.g., suppress the Column Address Select signal to the SDRAMs) from being produced on the CONTROL_P line. Thus, absent control signal, DATA will not be stored in the memory region.

Thus, referring to the details of one of the two sections 6100P and 6100S, here section 6100P, it is first noted that the information at Port_A is fed to a parity checker 6101. It is noted that is there is an error in parity induced by the CRC check described in FIG. 12 in connection with selector 5152, such detected parity error is reported to a control and DATA path logic 6112. In response to a detected parity error, control and DATA path logic 6112 prevents memory control signals (e.g., suppress the Column Address Select signal to the SDRAMs) from being produced on the CONTROL_P line. Thus, absent control signal, DATA will not be stored in the memory region.

The information at Port_A is also fed to a control register 6104 for storing the memory control portion of the information at port A, an ADDR register 6106 for storing the address portion (ADDR) of the information at port A, a write data register 6108 (here a FIFO) for storing the DATA portion of the information at port A, such being the data which is to be written into the memory array region $R_1$. The control portion stored in register 6104 is fed also to the control and data path logic 6112. Such logic 6112 produces: a memory array region request Request_Port_A_Primary (RAP) signal when the control portion in register 6104 indicates that there is data to be stored in the memory array region $R_1$; a Port A Primary Select (Port_A_P_SELECT) signal when the grant has been issued thereto via a Grant_A_P signal (GAP) produced by the arbitration logic $6004_1$; and passes the control portion (CONTROL_P) stored in register 6104 to the output of the upper port A controller 6002A, as indicated. It should be noted that the port A secondary control section 6100S being fed the same information as the primary controller 6100P should produce the same signals: here indicated as a memory array region request Request_Port A_SECONDARY (RAS) signal when the control portion in register 6104 indicates that there is data to be stored in the memory array region $R_1$; a Port A Secondary Select (Port_A_S_SELECT) signal when the grant has been issued thereto via a Grant_A_S signal (GAS) produced by the arbitration logic $6004_1$.

The address portion stored in the ADDR register 6106 (ADDR_P) is combined with the address portion ADDR_P stored in register 6106. Both CONTOL_P and ADDR_P are fed to a parity generator 6109 to produce ADDR/CONTROL_P (which has both a content portion (n) and parity (p). The content portion (n) of ADDR/CONTROL_P is fed to a parity generator 6120 to generate byte parity (p') from the content portion (n) of ADDR/CONTROL_P. The generated parity (p') is inverted by inverter 6122 and the inverted parity is fed to a first input $I_1$ of the selector 6124. The content portion (n) of ADDR/CONRTOL_P is combined with a parity (p) produced at the output of selector 6124 in a manner to be described. The parity (p) of ADDR/CONTROL_P is fed to a second input $I_2$ of the selector 6124 and such parity (p) is also fed to an exclusive OR gate 6130. Also fed to the exclusive OR gate 6130 is the parity (p) of the equivalent ADDR/CONTROL_S signal produced by the Port A secondary control section 6100S. As noted above, since both sections 600P and 600S are fed the same information and implement the same logic functions, ADDR/CONTROL_P should be the same as ADDR/CONTROL_S unless there is a hardware fault in one of the sections 6100P, 6100S. If there is a fault (i.e., if ADDR/CONTROL_S and ADDR/CONTROL_P are different), the exclusive OR gate 6130 will produce a logic 1 and in the absence of a fault, (i.e., ADDR/CONTROL_S is the same as ADDR/CONTROL_P), the exclusive OR gate 6130 will produce a logic 0.

In like manner, the content (n) of ADDR/CONTROL_P is fed to an exclusive OR gate 6128. Also fed to the exclusive OR gate 6128 is the content (n) of the equivalent ADDR/CONTROL_S signal produced by the Port A secondary control section 6100S. As noted above, since both sections 600P and 600S are fed the same information and implement the same logic functions, ADDR/CONTROL_P should be the same as ADDR/CONTROL_S unless there is a hardware fault in one of the sections 6100P, 6100S. If there is a fault (i.e., if ADDR/CONTROL_S and ADDR/CONTROL_P are different), the exclusive OR gate 6128 will produce a logic 1 and in the absence of a fault, (i.e., ADDR/CONTROL_S is the same as ADDR/CONTROL_P), the exclusive OR gate 6128 will produce a logic 0.

The outputs of exclusive OR gates 6128 and 6130 are fed to an OR gate 6126. Thus, if there is an error in either the content (n) or the parity (p), the OR gate produces a logic 1; otherwise it produces a logic 0. The output of OR gate 6126 is fed to a fault detector 6102 which detects such a fault and reports such detected fault to the director. The output of OR gate 6126 is also fed as a control signal to selector 6124. If the OR gate produces a logic 1 (i.e., there is a fault), the selector couples the inverted parity of input II to the output of selector 6124. This inverted parity is appended to the content (n) of ADDR/CONTROL_P to thereby corrupt such information. This corrupted information is detected by the memory array region and converted into a "no-operation" command as described in the above-referenced U.S. Pat. No. 5,943,287. On the other hand, if the OR gate 6126 produces a logic 0 (i.e., no fault), the non-inverted parity at input 12 of selector 6124 passes through selector 6124 and is appended to the content portion (n) of ADDR/CONTROL/P.

A similar check is made with the DATA to be written into the memory array region. Thus, the DATA in register 6108 of primary controller 6100P (WRITE_DATA_P) is fed to an exclusive OR gate 6116 along with the write DATA in the secondary controller 6100S (WRITE_DATA_S). (It is noted the data in the write register 6108 of the primary controller 6100P (DATA_WRITE_P) is fed to output DATA_WRITE bus while the write data in the secondary controller 6100S (DATA_WRITE_S) is fed only to the exclusive OR gate 6118.) Thus, the exclusive OR gate 6116 produces a logic 0 if WRITE_DATA_P and WRITE_DATA_S are the same and produces a logic 1 if they are different. The fault detector 6102 detects such logic 1 and reports the detected fault to the transfer requesting director.

In like manner, a check is made of the DATA read (READ_DATA) from the memory array region $R_1$ which becomes stored in Read data register 6119, here a FIFO. The READ_DATA is fed to a read data register (here a FIFO) for transmission to the director via Port_A. Such READ_DATA in register 6119 indicated as READ_DATA_P is fed to an exclusive OR gate 6118. In like manner, secondary controller 6100S should produce the same signals on output READ_DATA_S. READ_DATA_P and READ_DATA_S are fed to an exclusive OR gate 6118. Thus, the exclusive OR gate 6118 produces a logic 0 if READ_DATA_P and READ_DATA_S are the same and produces a logic 1 if they are different. The fault detector 6102 detects such logic 1 and reports the detected fault to the transfer requesting director.

It is noted that the RAP and PAS signals are both sent to the arbitration logic $6004_1$ (FIGS. 13A, 13B, 13C, 13D and 13E) as composite signal REQUEST A. The arbitration section 6004, considers a valid request only if both signals RAP and RAS are the same. In like manner, the arbitration logic 6004, issues separate grant signals GAP and GAS which are shown in FIGS. 13A, 13B, 13C, 13D and 13E as a composite signal GRANT_A. Likewise, PORT_A_P_SELECT and PORT_A_S_SELECT signals are both sent to the arbitration logic $6004_1$, (FIGS. 13A, 13B, 13C, 13D and 13E) as composite signal PORT_A_SELECT. The arbitration section $6004_1$ considers a valid request only if both signals PORT_A_P_SELECT and PORTA_S_SELECT are the same.

As noted above, the upper port B controller 6002B provides signals: RBP, GBP, PORT_B_P_SELECT, ADDR/CONTROL, DATA_WRITE RBS, GBS, PORT B_SELECT, and READ_DATA, which are equivalent to RAP, GAP, PORT_A_SELECT, ADR/CONTROL, DATA_WRITE, RAS, GAS, PORT A_SELECT, and READ_DATA, respectively, which are provided by the upper port A controller 6002A.

Referring now to FIGS. 15A, 15B, 15C, 15D and 15E, the arbitration logics $6004_1$, $6004_2$ of the logic sections $5010_1$, $5010_2$, respectively, are shown along with the watchdog section 6006. It is first noted that the arbitration logic $6004_1$, $6004_2$ are identical in construction.

Arbitration logic $6004_1$ is fed by:
REQUEST A (i.e., RAP, RAS) from upper port A controller 6002A of logic section $5010_1$(FIGS. 13A, 13B, 13C, 13D and 13E);
REQUEST B (RBP, RBS) from upper port B controller 6002B of logic section $5010_1$ (FIGS. 13A, 13B, 13C, 13D and 13E);
REQUEST R from upper memory refresh section 6002R of logic section $5010_1$(FIGS. 13A, 13B, 13C, 13D and 13E) (It is to be noted that the REQUEST R is made up of two signals, each being produced by identical primary and secondary identical memory refresh units, not shown, in memory refresh section 6002R both of which have to produce the same refresh signal in order for the arbitration logic $6004_1$ to respond to the refresh request).

Arbitration logic $6004_2$ is fed by:
REQUEST A from upper port A controller 6002A of logic section $5010_2$(FIGS. 13A, 13B, 13C, 13D and 13E);
REQUEST B from upper port B controller 6002B of logic section $5010_2$(FIGS. 13A, 13B, 13C, 13D and 13E);
REQUEST R from upper memory refresh section 6002R of logic section $5010_2$.

As shown in FIGS. 15A, 15B, 15C, 15D and 15E, each one of the three request signals REQUEST A, REQUEST B, and REQUEST R, produced in logic section $5010_1$ is fed, in triplicate, to three identical arbitration units, (i.e., arbitration unit I, arbitration unit II, and arbitration unit III) in the arbitration logic $6004_1$ of such logic section $5010_1$, as indicated. (See also FIG. 19). Likewise, each one of the three request signals REQUEST A, REQUEST B, and REQUEST R, produced in logic section $5010_2$ is fed, in triplicate, to three identical arbitration units, (i.e., arbitration unit I, arbitration unit II, and arbitration unit III, in the arbitration logic $6004_2$ of such logic section $5010_2$ as indicated.

In response to such request signals, REQUEST A, REQUEST B, and REQUEST R, each arbitration unit I, II, and III determines from the three requests; i.e., REQUEST A, REQUEST B, and REQUEST R, fed to it and in accordance with the algorithm described above, whether upper port A controller 6002A, upper port B controller 6002B, or the memory refresh 6002R is to be given access to the memory array region $R_1$. As noted above, the operating Condition (i.e., Condition I, Condition II, or Condition III) is a function of whether the logic section $5010_1$ is operating properly and whether the logic section $5010_2$ is operating properly. The watchdog section 2006 determines whether such logic sections $5010_1$, $5010_2$ are operating properly. More particularly, when the arbitration units I, II, and III make their decision, they also produce a memory output enable (MOE) signals MOEI, MOEII and MOEIII, respectively, (when either logic section $5010_1$ or $5010_2$ is to be granted access to the memory array region $R_1$) and a memory refresh signal MREs (i.e., MREI, MREII and MREIII, respectively, when memory refresh section 6002R is to be granted access to the memory array region $R_1$). Thus, MOE signals $MOEI_1$, $MOEII_1$, and $MOEIII_1$ are produced by arbitration units I, II, and III, respectively, in arbitration logic $6004_1$. Also, MRE signals $MREI_1$, $MREII_1$, and $MREIII_1$ are produced by arbitration units I, II, and III, respectively, in arbitration logic $6004_1$. In like manner, MOE signals $MOEI_2$, $MOEII_2$, and $MOEIII_2$ are produced by arbitration units I, II, and III, respectively, in arbitration logic $6004_2$. Also, MRE signals $MREI_2$, $MREII_2$, and $MREIII_2$ are produced by arbitration units I, II, and III, respectively, in arbitration logic $6004_2$. (See also FIG. 19).

These signals are fed to each of three identical watchdogs, $WD_I$, $WD_{II}$, $WD_{III}$ as follows:
The MOE and MRE signals produced by the arbitration unit I in arbitration logics $6004_1$ and $6004_2$ (i.e., $MOEI_1$, $MOEI_2$, $MREI_1$ and $MREI_2$) are fed to watchdog $WD_I$;
The MOE and MRE signals produced by the arbitration unit II in arbitration logics $6004_1$ and $6004_2$ (i.e., $MOEII_1$, $MOEII_2$, $MREII_1$ and $MREII_2$) are fed to watchdog $WD_{II}$; and
The MOE and MRE signals produced by the arbitration unit III in arbitration logics $6004_1$ and $6004_2$ (i.e., $MOEIII_1$, $MOEIII_2$, $MREIII_1$ and $MREIII_2$) are fed to watchdog $WD_{III}$ Each one of the watchdogs I, II, III is implemented and arranged identical to perform the same logic functions; however, they preferably implemented with components manufactured independently of each other. Further, each one of the watchdogs I, II, and III operates in response to its own independent clock, i.e., Clock I, Clock II, and Clock III, respectively. Thus, each watchdog makes an independent determination as to whether these signals are in proper time and rate and thus, determine, in accordance with the "Condition algorithm" described above, the proper one of the Conditions (i.e., Condition I, Condition II, or Condition III) for the system. An indication of the Condition is provided by each of the watchdogs $WD_I$, $WD_{II}$ and $WD_{III}$ as a two-bit word $MSAB_I$, $MSAB_{II}$, and $MSAB_{III}$, respectively. The two-bit word is produces as follows:

00=Condition I
01=Condition II
10=condition III
11=Reset (i.e., Condition IV)

These three words $MSAB_I$, $MSAB_{II}$, and $MSAB_{III}$ are fed to both arbitration logics $6004_1$ and $6004_2$, as indicated. It should be remembered that each one of the arbitration logics $6004_1$ and $6004_2$ (and hence the arbitration logics $6004_1$ and $6004_2$ therein), operate with a separate independent clock, Clock 1, and Clock 2, respectively. In order to synchronize the three words $MSAB_I$, $MSAB_{II}$, and $MSAB_{III}$ are fed to logic section $5010_1$ and fed to logic section $5010_2$. Each one of the arbitration logics $6004_1$, $6004_2$ has a synchronization filter $6200_1$, $6200_2$ to be described. Suffice it to say here, however, that the filter $6200_1$, produces corresponding signals $MSAB_{I\_1}$, $MSAB_{II\_1}$, and $MSAB_{III\_1}$, respectively, and filter $6200_2$ produce corresponding signals $MSAB_{I\_2}$, $MSAB_{II\_2}$, and $MSAB_{III\_2}$, respectively, as indicated.

The signals $MSAB_{I\_1}$, $MSAB_{II\_1}$, and $MSAB_{III\_1}$, are fed to the arbitration units I, II, and III, respectively, in arbitration logic $6004_1$. In like manner, the signals $MSAB_{I\_2}$, $MSAB_{II\_2}$, and $MSAB_{III\_2}$, are fed to the arbitration units I, II, and III, respectively, in arbitration logic 60042. In response to such signals, each one of the arbitration units I, II, and III, makes an independent determination of whether logic section $5010_1$ (FIG. 13A, 13B, 13C, 13D and 13E) or logic section $5010_2$ will be granted access to the memory array region $R_1$. A grant by logic section $5010_1$ to logic section $5010_2$ is indicated by a Memory Grant (MG) signal. Thus, arbitration units I, II, and III of logic section $5010_1$ produce Memory Grant signals $MGI_1$, $MGII_1$, and $MGIII_1$, respectively. Such signals are fed to a synchronization filter 62022 in arbitration logic $6004_2$. The synchronization filter $6202_2$ operates as is constructed in the same manner as synchronization filters $6200_1$ and $6200_2$. In like manner arbitration units I, II, and III of logic section $5010_2$ produce Memory Grant signals $MGI_2$, $MGII_2$, and $MGIII_2$, respectively. Such signals are fed to a synchronization filter $6202_1$ in arbitration logic $6004_1$. The synchronization filter $6202_1$ operates as is constructed in the same manner as synchronization filter $6202_2$.

Thus, considering exemplary synchronization filter $6202_2$, such filter is fed by the three Memory Grant (MG) signals $MGI_2$, $MGII_2$, and $MGIII_2$. as indicated. The three signals are stored in registers 6204I, 6204II and 6204III, respectively, in response to a clock pulse produced by the Clock 2. Each of the three registers 6204I, 6204II and 6204 III, send the information stored therein to each of three majority gates MGI, MGII, and MGIII, respectively, as indicated. The majority gates produce an output which is the majority of the three inputs fed thereto. The outputs of the three majority gates MGI, MGII and MGIII are the arbitration units I, II and III, respectively, in the arbitration logic $6004_2$, as indicated.

Figure 17:
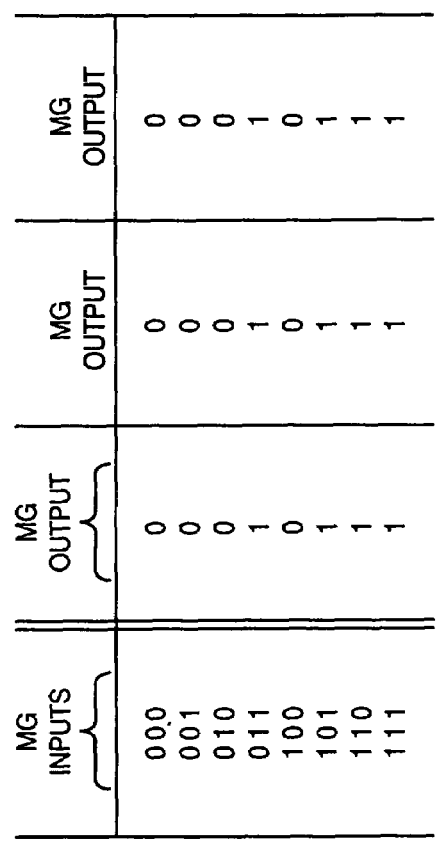
FIG. 17 is a Truth Table for a majority gate used in the memory board of FIGS. 9A, 9B and 9C.
Figure 18:
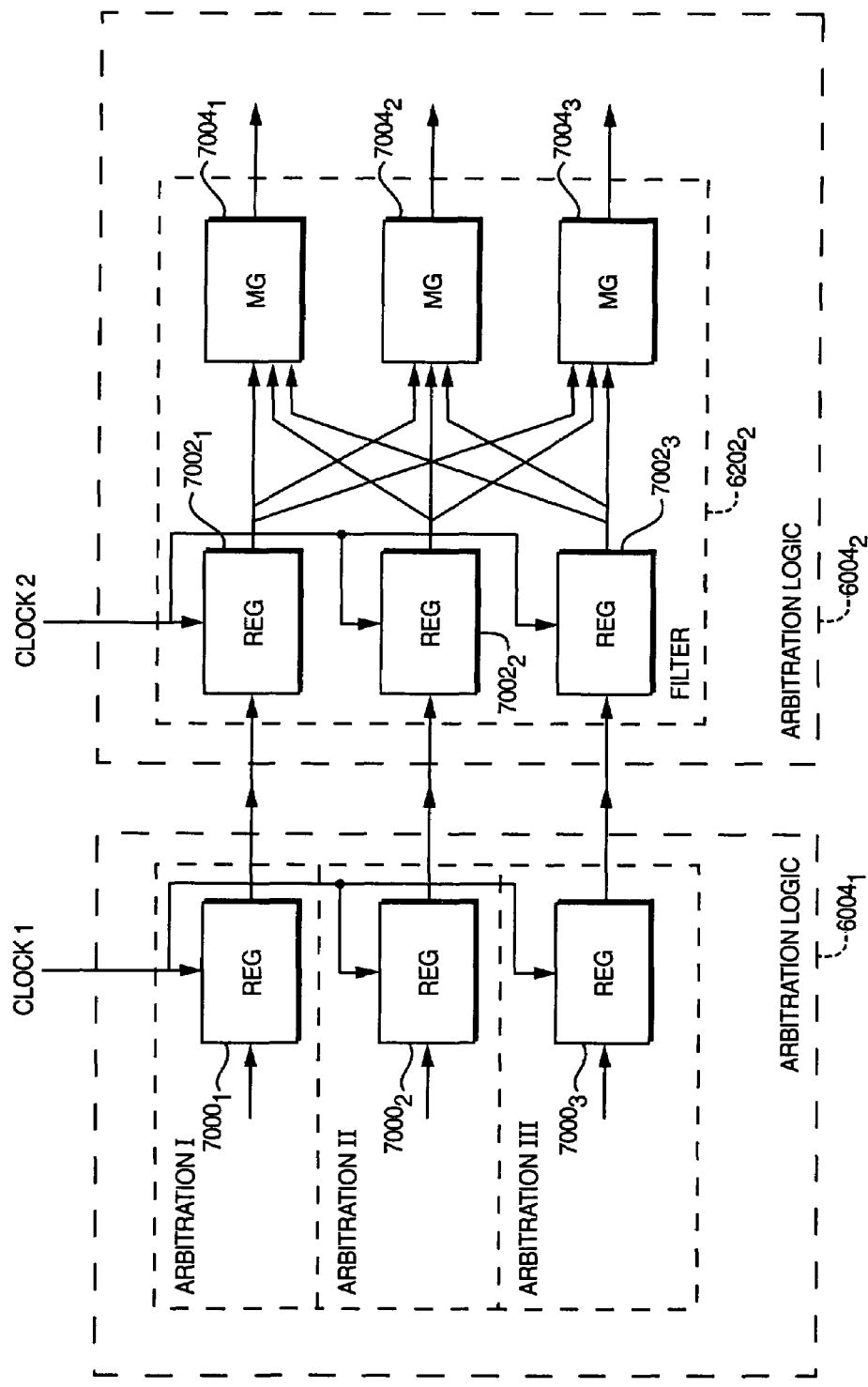
FIG. 18 is a block diagram shown interconnections between one of the arbitration units used in one of the pair of port controllers of FIGS. 13A, 13B, 13C, 13D and 13E and a filter used in the arbitration unit of the other one of such pair of controllers of FIGS. 13A, 13B, 13C, 13D and 13E.

More particularly, referring to FIG. 16, portions of arbitration logics $6004_1$ and $6004_2$ are shown. The data to be fed to the output of arbitration logic 6004, is clocked into register $7000_1$ of arbitration I, register $7000_2$ of arbitration II, and register $7000_3$ of arbitration III simultaneously in response to the same clock pulse produced by Clock 1. Thus, each of the registers $7000_1$, $7000_2$, $7000_3$ should store the same data at the clock pulse produced by Clock 1, as indicated in FIG. 18. The data is then fed to registers $7002_1$, $7002_2$, $7002_3$ of filter $6202_2$ of arbitration logic $6004_2$. The data at the registers $7002_1$, $7002_2$, $7002_3$ are stored therein in response to the same clock produced by Clock 2. Because of the data in registers $7000_1$, $7000_2$, $7000_3$ arrive at registers $7002_1$, $7002_2$, $7002_3$ with different delays as indicated in FIG. 18, while the data in $7000_1$, $7000_2$ $7000_3$ is the same, here the data stored in registers $7002_1$, $7002_2$, $7002_3$ may be different as shown in FIG. 18. The data stored in register $7002_1$ is fed to majority gates (MGs) $7004_1$, $7004_2$ and $7004_3$. The data stored in register $7002_2$ is also fed to majority gates (MGs) $7004_1$, $7004_2$ and $7004_3$. Likewise, the data stored in register $7002_3$ is fed to majority gates (MGs) $7004_1$, $7004_2$ and $7004_3$. Each one of the majority gates MGs produces an output representative of the majority of the logic signals fed thereto as indicated in FIG. 17.

Figure 20A:
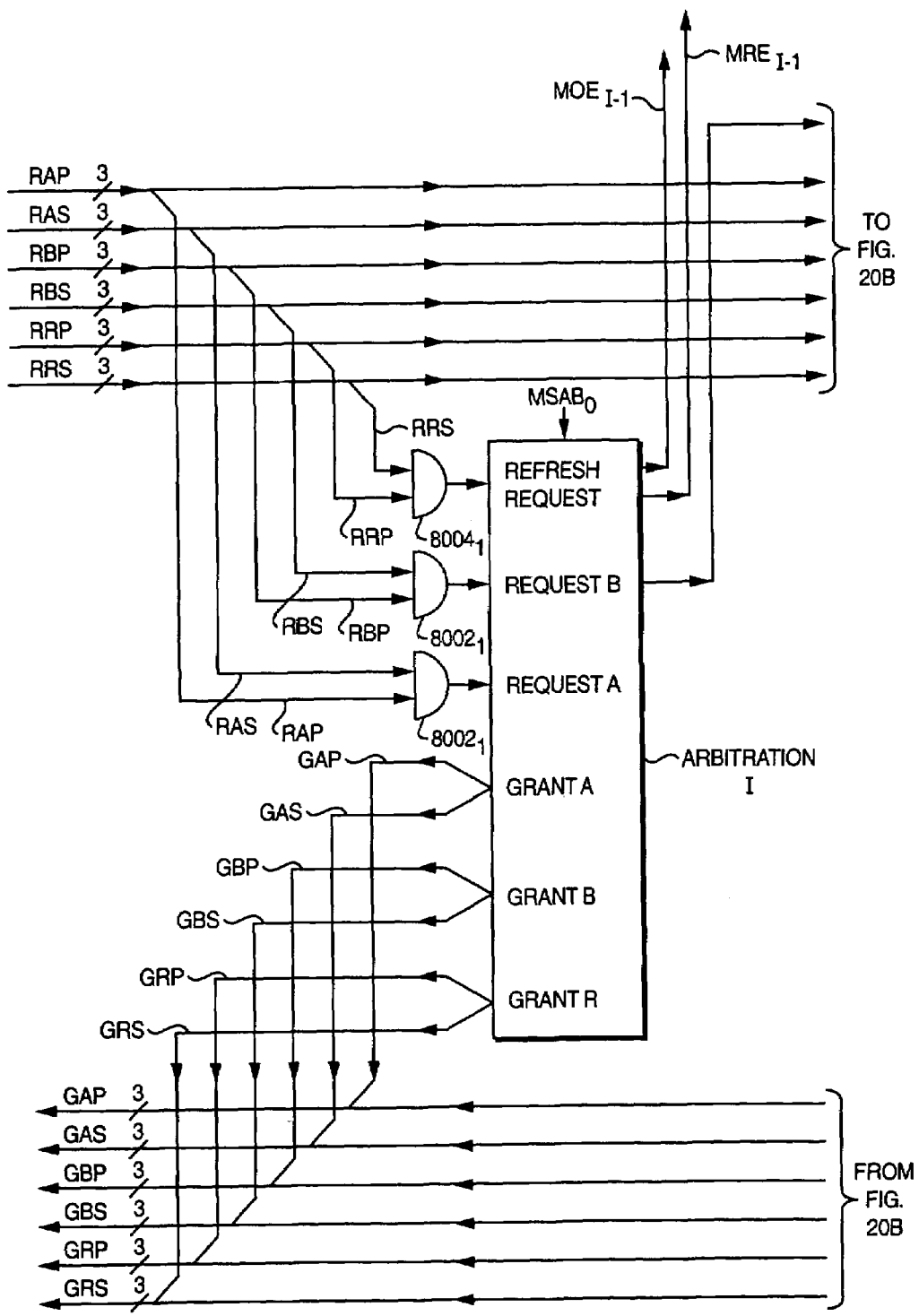
FIGS. 20A, 20B and 20C are a more detailed block diagram of arbitrations used in the arbitration logics of FIGS. 15A, 15B, 15C, 15D and 15E.
Figure 20B:
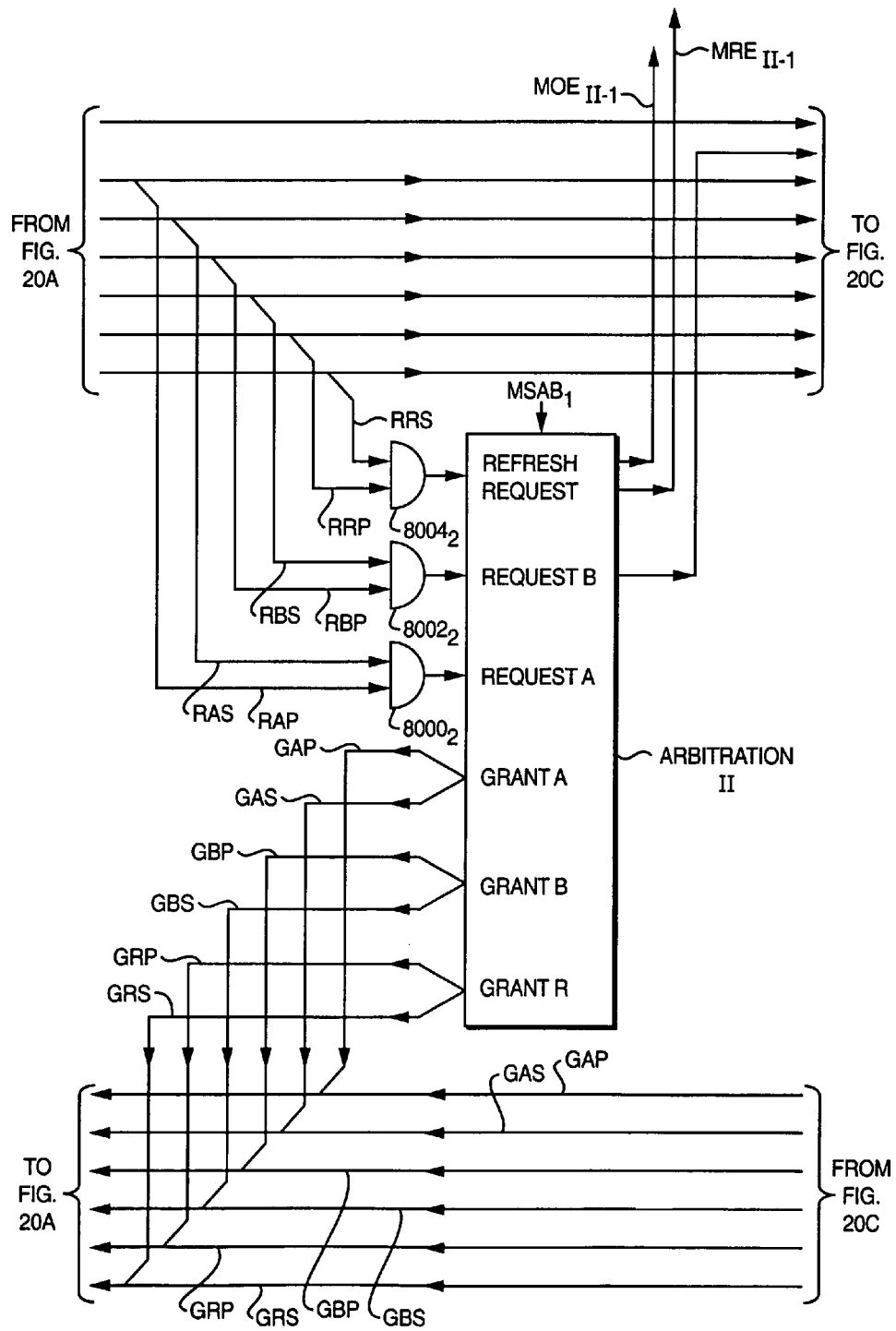
Figure 20C:
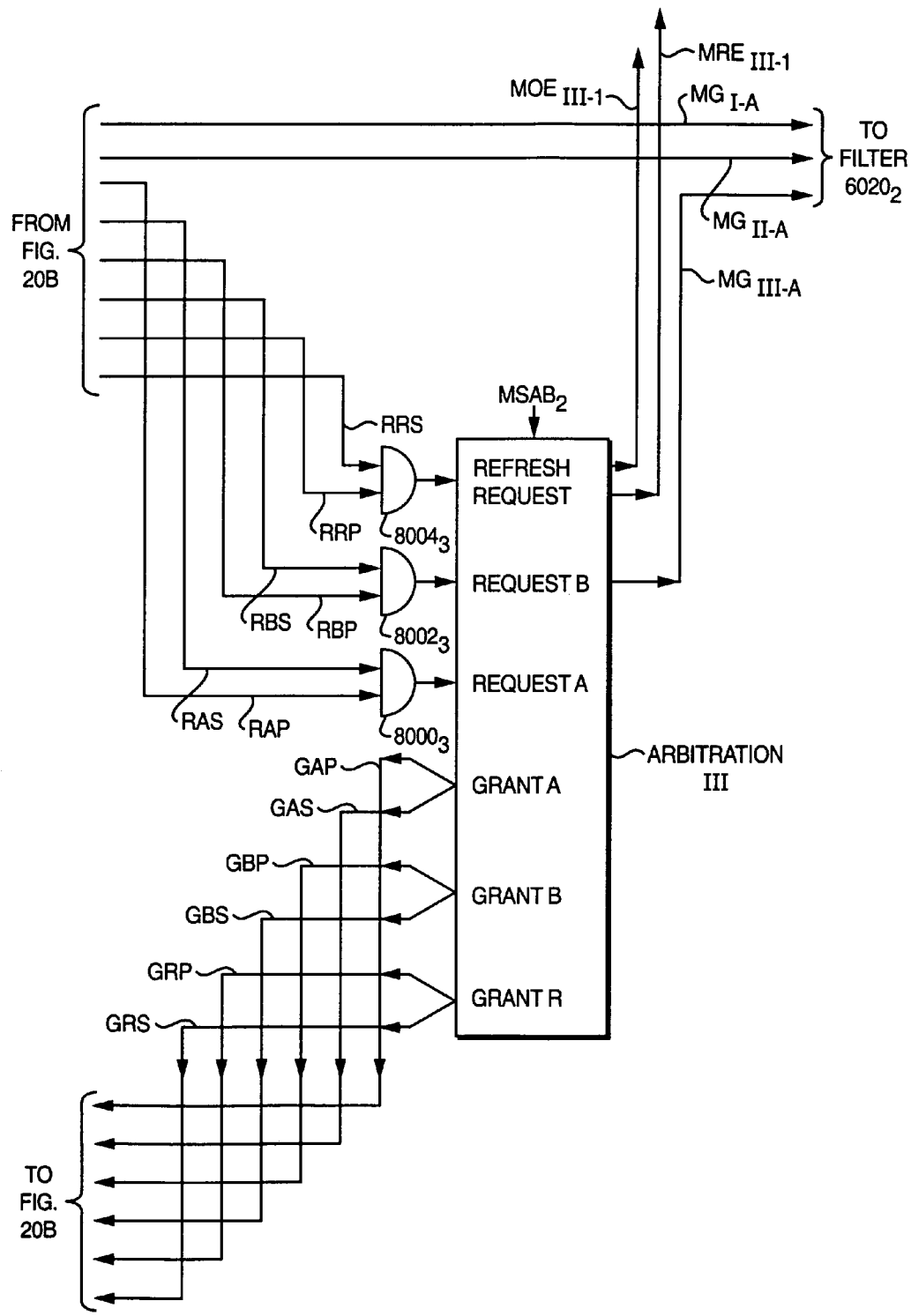

Referring now to FIGS. 20A, 20B and 20C, the three arbitrations I, II, and III of exemplary arbitration logic $6004_1$ are the signals fed thereto and produced thereby are shown in more detail. It is first noted that the primary signal REQUEST_A_P, (RAP), and the secondary request signal REQUEST_A_S (RAS) are each fed in triplicate; one copy to each of the arbitrations I, II, and III, as indicated. The one of the triplicate RAP and RAS fed to arbitration I are fed to an AND gate $8000_1$, a second one of the triplicate RAP and RAS fed to arbitration II are fed to an AND gate $8000_2$, and the third one of the triplicate RAP and RAS fed to arbitration III are fed to an AND gate $8000_3$, as indicated. Likewise, the signals REQUEST_B_P, (RBP), and REQUEST_B_S (RBS) are each fed in triplicate; one copy to each of the arbitrations I, II, and III, as indicated. The one of the triplicate RBP and RBS fed to arbitration I are fed to an AND gate $8002_1$, a second one of the triplicate RBP and RBS fed to arbitration II are fed to an AND gate $8002_2$, and the third one of the triplicate RBP and RBS fed to arbitration III are fed to an AND gate $8002_3$, as indicated. As mentioned briefly above, there are two memory refresh units in the memory refresh section 6002R (FIGS. 13A, 13B, 13C, 13D and 13E). One, a primary unit (not shown), issues a request RRP and the other, a secondary unit (not shown), issues a request RRS. Above, in connection with FIGS. 13A, 13B, 13C, 13D and 13E, these two requests were considered as a composite request (REFRESH_REQUEST) to simplify the discussion presented above. Here, in connection with FIG. 19, the individual signals RRP, RRS are shown in more detail. Thus, the signals RRP, RRS are each fed in triplicate; one copy to each of the arbitrations I, II, and III, as indicated. The one of the triplicate RRP and RRS is fed to arbitration I are fed to an AND gate $8004_1$, a second one of the triplicate RRP and RRS fed to arbitration II are fed to an AND gate $8004_2$, and the third one of the triplicate RRP and RS fed to arbitration III are fed to an AND gate $8004_3$, as indicated.

Thus, in the case of each pair, in order for the request to be issued to the arbitration I, II, or III. the AND gate associated therewith must see the same request from both the primary signal and the secondary signal fed to it.

Each arbitration I, II and II issues pairs of grants, i.e., a primary grant to the primary unit and a secondary grant to the secondary unit. Thus, each of the arbitrations I, II and III issues: the primary and secondary grants (GAP and GAS, respectively) to the Port A primary control section 6100P (FIGS. 14A, 14B, 14C and 14D) and Port A secondary control section 6100S of Port A controller 6002A; the primary and secondary grants (GBP and GBS, respectively) to the Port B primary control section and Port A secondary control section of Port B controller 6002B; and the primary and secondary grants (GRP and GRS, respectively) to the memory refresh primary unit memory refresh secondary unit of the memory refresh section 6002R (FIGS. 13A, 13B, 13C, 13D and 13E).

The arbitrations I, II, and III produce Memory Output Enable signals $MOE_{I-1}$, $MOE_{II-1}$, and $MOE_{III-1}$, respectively, as indicated, for the watchdogs $WD_I$, $WD_{II}$ and $WD_{II}$, respectively, as shown in FIGS. 15A, 15B, 15C, 15D and 15E. The arbitrations I, II, and III produce Memory Refresh Enable signals $MRE_{II-1}$, $MRE_{III-1}$, and $MRE_{II-1}$, respectively, as indicated, for the watchdogs $WD_I$, $WD_{II}$ and $WD_{III-1}$, respectively, as shown in FIGS. 15A, 15B, 15C, 15D and 15E. The arbitrations I, II, and III produce Memory Grant signals $MG_I$, $MG_I$, and $MG_{III}$, respectively, as indicated, for the registers $6204_I$, $6204_{II}$, and $6204_{III}$, respectively, of filter $6202_2$ of logic section $5010_2$, as shown in FIGS. 15A, 15B, 15C, 15D and 15E.

Thus, it should be noted that while each one of the registers $7002_1$, $7002_2$, $7002_3$, of filters $6002_1$, $6002_2$ (FIG. 19), are fed the same data from registers $7000_1$, $7000_2$, and $7000_3$, respectively, because of the time skew shown in FIG. 18, such registers $7002_1$, $7002_2$, $7002_3$, may not store the data which is in registers $7000_1$, $7000_2$, and $7000_3$, respectively. However, the majority gates MG $7004_1$–$7004_3$ will produce the same data according to FIG. 17. Therefore, the three abitrations I, II, and III of arbitration logic $6004_2$ will receive the same data (i.e., the data produced by the majority gates MG $7004_1$–$7004_3$) thereby providing coherency (i.e., synchronization) to the arbitrations I, II, and III even though the arbitrations are operating independently of each other.

Other embodiments are within the spirit and scope of the appended claims.

What is claimed is:

1. A method for determining a parity, p, error of the Cyclic Redundancy Check (CRC) of data protected with such CRC, comprising:
   receiving data having a plurality of N bytes: [D(0), D(1), . . . , D(N−1)] each byte D(M) having a parity bit P(M);
   computing the parity, P, of [P(0), P(1), . . . P(N−1)];
   comparing the computed parity P with the parity p of the CRC, a difference between P and p indicating an error in p.

2. A method for determining a parity error of the Cyclic Redundancy Check (CRC) of DATA, such DATA comprising a series of data words terminating in a CRC portion, such method comprising:
   receiving data having a plurality of N bytes: [D(0), D(1), . . . , DN−1]) each byte D(M) having a parity bit P(M);
   computing the parity of [P(0), P(1), . . . P(N−1)];
   comparing the computed parity with the parity of the CRC, a difference between the computed parity and of the parity of the CRC indicating an error in the parity of the CRC.

* * * * *